(12) United States Patent
Seo et al.

(10) Patent No.: US 10,074,822 B2
(45) Date of Patent: Sep. 11, 2018

(54) LIGHT-EMITTING ELEMENT, LIGHT-EMITTING DEVICE, ELECTRONIC DEVICE, AND LIGHTING DEVICE

(71) Applicant: SEMICONDUCTOR ENERGY LABORATORY CO., LTD., Atsugi-shi, Kanagawa-ken (JP)

(72) Inventors: Satoshi Seo, Kanagawa (JP); Tsunenori Suzuki, Kanagawa (JP); Takeyoshi Watabe, Kanagawa (JP); Kunihiko Suzuki, Kanagawa (JP); Toshiki Hamada, Kanagawa (JP); Rina Nakamura, Kanagawa (JP); Hayato Yamawaki, Kanagawa (JP); Ayumi Sato, Kanagawa (JP); Harue Osaka, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 365 days.

(21) Appl. No.: 14/922,636

(22) Filed: Oct. 26, 2015

(65) Prior Publication Data

US 2016/0118615 A1   Apr. 28, 2016

(30) Foreign Application Priority Data

Oct. 28, 2014   (JP) ................. 2014-219648

(51) Int. Cl.
*H01L 51/50*   (2006.01)
*H01L 51/00*   (2006.01)

(52) U.S. Cl.
CPC ...... *H01L 51/5092* (2013.01); *H01L 51/0025* (2013.01); *H01L 51/006* (2013.01); *H01L 51/0054* (2013.01); *H01L 51/0058* (2013.01); *H01L 51/0061* (2013.01); *H01L 51/0072* (2013.01); *H01L 51/0074* (2013.01); *H01L 51/0085* (2013.01); *H01L 51/5072* (2013.01)

(58) Field of Classification Search
None
See application file for complete search history.

(56) References Cited

U.S. PATENT DOCUMENTS

| 5,935,721 | A  | 8/1999  | Shi et al.     |
|-----------|----|---------|----------------|
| 6,057,048 | A  | 5/2000  | Hu et al.      |
| 6,617,051 | B1 | 9/2003  | Higashi et al. |
| 7,045,950 | B2 | 5/2006  | Higashi et al. |
| 7,449,832 | B2 | 11/2008 | Itai           |

(Continued)

FOREIGN PATENT DOCUMENTS

| JP | 2000-315580 A | 11/2000 |
|----|---------------|---------|
| JP | 3290432       | 6/2002  |

(Continued)

*Primary Examiner* — Gregory D Clark
(74) *Attorney, Agent, or Firm* — Nixon Peabody LLP; Jeffrey L. Costellia

(57) ABSTRACT

To provide a novel light-emitting element or a highly reliable light-emitting element. To provide a light-emitting device, a display device, an electronic device, and a lighting device each of which can be manufactured at a low cost. To provide a light-emitting element including an anode, a cathode, and an EL layer between the anode and the cathode. The EL layer includes a light-emitting layer and an electron injection transport layer between the light-emitting layer and the cathode, and the amount of a halogen detected from a material forming the electron injection transport layer is less than or equal to 30 ppm.

34 Claims, 23 Drawing Sheets

(56) References Cited

U.S. PATENT DOCUMENTS

| | | |
|---|---|---|
| 7,528,545 B2 | 5/2009 | Liao et al. |
| 7,807,839 B2 | 10/2010 | Inoue et al. |
| 8,319,212 B2 | 11/2012 | Ibe et al. |
| 8,421,338 B2 | 4/2013 | Kim et al. |
| 8,889,271 B2 | 11/2014 | Park et al. |
| 8,895,154 B2 | 11/2014 | Iwakuma et al. |
| 8,969,863 B2 | 3/2015 | Suzuki et al. |
| 9,079,920 B2 | 7/2015 | Park et al. |
| 2004/0007971 A1 | 1/2004 | Higashi et al. |
| 2006/0157728 A1 | 7/2006 | Iou |
| 2006/0159959 A1 | 7/2006 | Higashi et al. |
| 2006/0181202 A1 | 8/2006 | Liao et al. |
| 2006/0182993 A1 | 8/2006 | Ogata et al. |
| 2007/0172698 A1 | 7/2007 | Iwakuma et al. |
| 2010/0052522 A1 | 3/2010 | Kim et al. |
| 2011/0266531 A1 | 11/2011 | Kim et al. |
| 2015/0041795 A1 | 2/2015 | Suzuki et al. |
| 2015/0053960 A1 | 2/2015 | Park et al. |
| 2015/0147840 A1 | 5/2015 | Inoue et al. |
| 2015/0171358 A1 | 6/2015 | Suzuki et al. |
| 2015/0179963 A1 | 6/2015 | Bando et al. |
| 2016/0118614 A1 | 4/2016 | Seo et al. |

FOREIGN PATENT DOCUMENTS

| | | |
|---|---|---|
| JP | 2002-373786 A | 12/2002 |
| JP | 2012-174901 A | 9/2012 |
| JP | 2013-133278 A | 7/2013 |
| JP | 2014-090165 | 5/2014 |
| WO | WO-2000/041443 | 7/2000 |

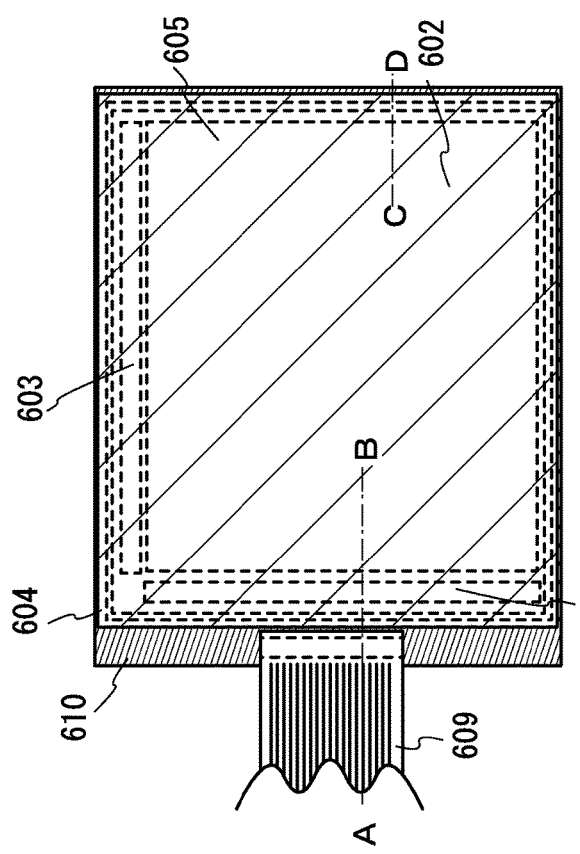
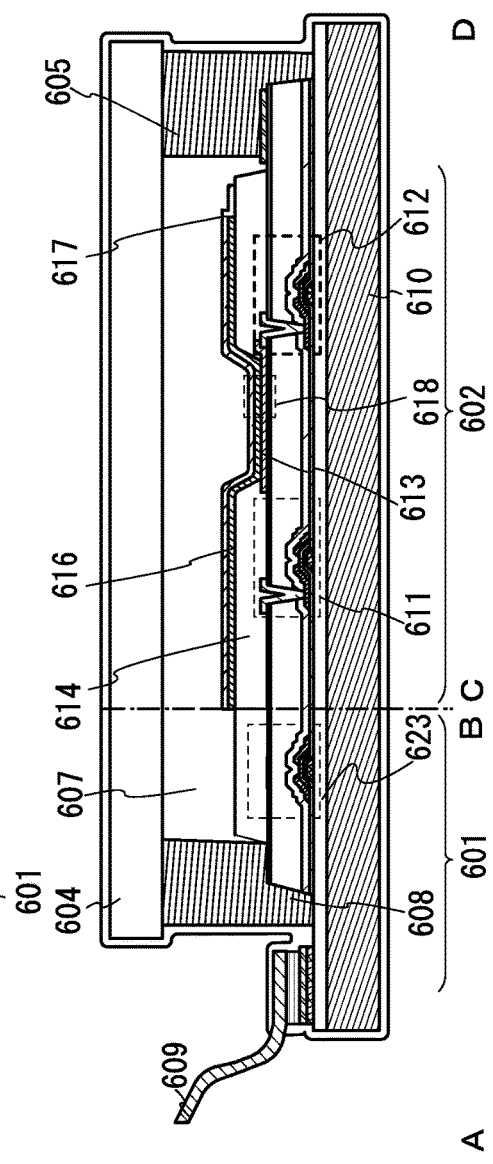
FIG. 2A
FIG. 2B

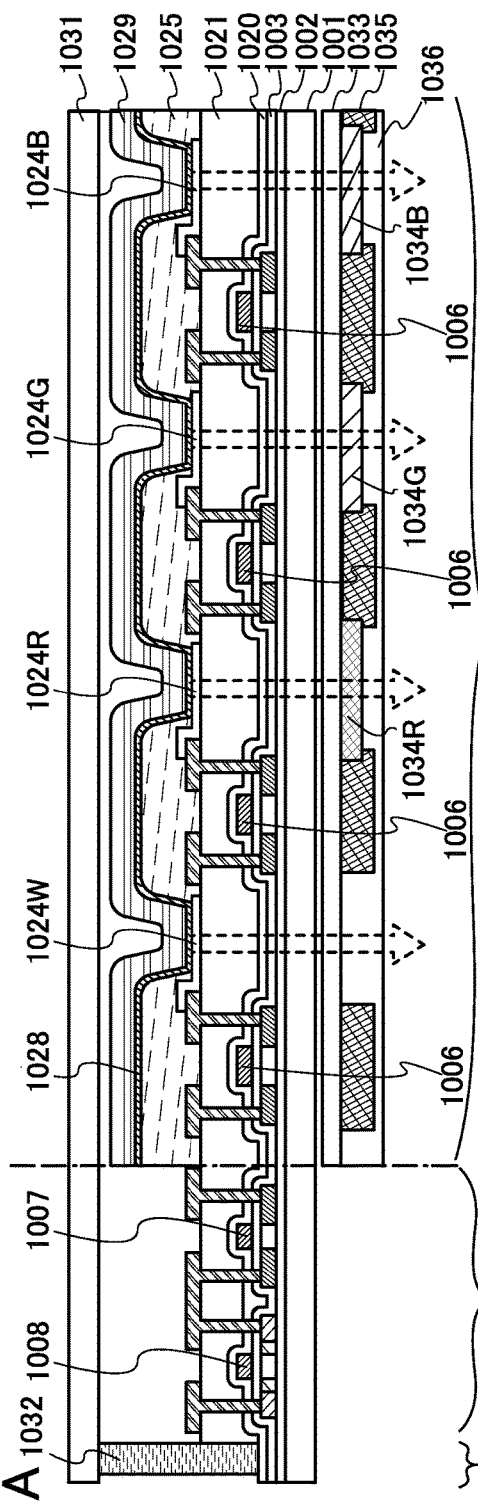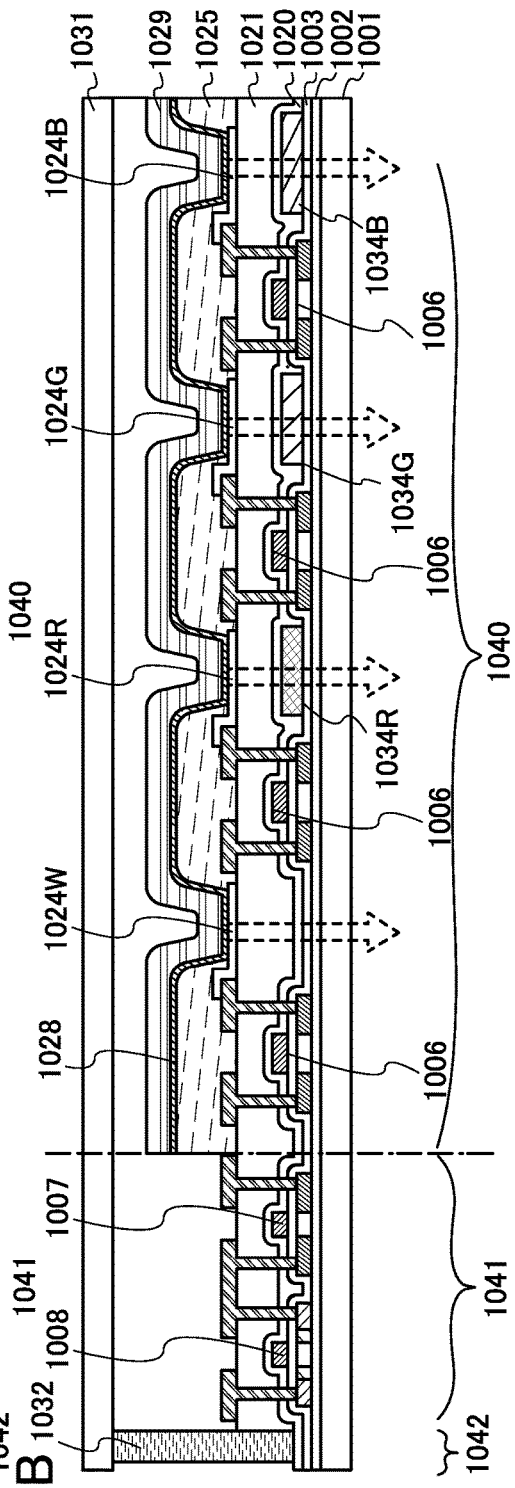

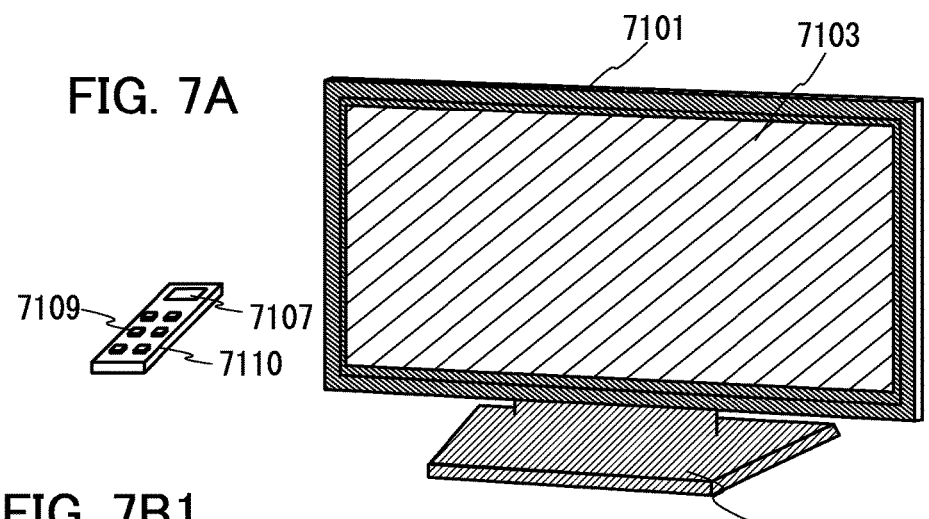
FIG. 7A
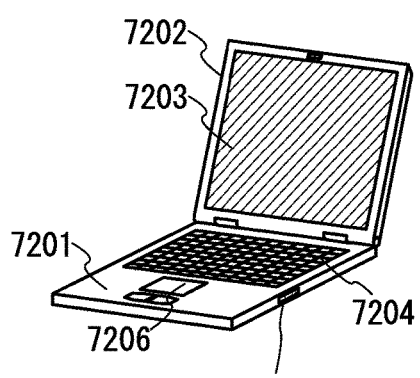
FIG. 7B1
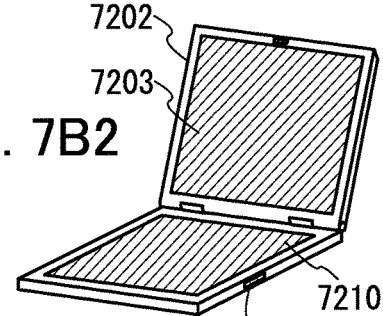
FIG. 7B2
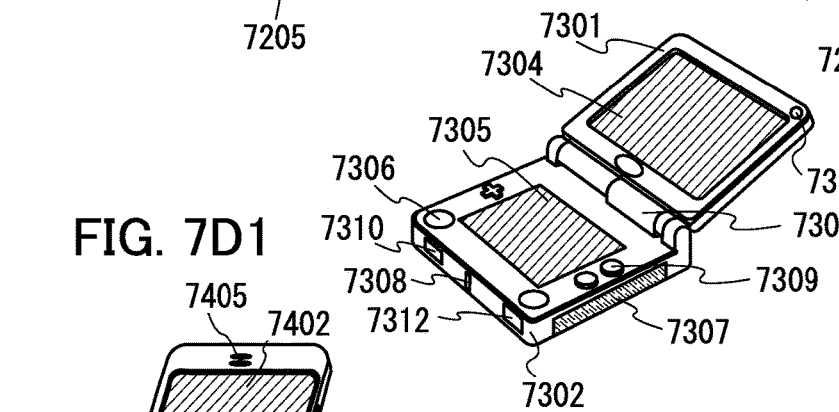
FIG. 7C
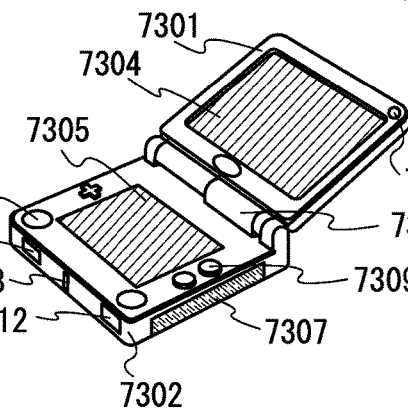
FIG. 7D1
FIG. 7D2

FIG. 14A
Light-emitting Element A
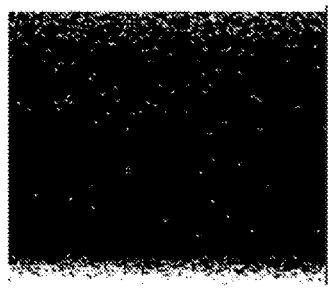
Before Driving Test
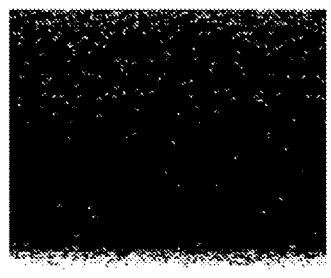
After Driving Test
FIG. 14B
Light-emitting Element B
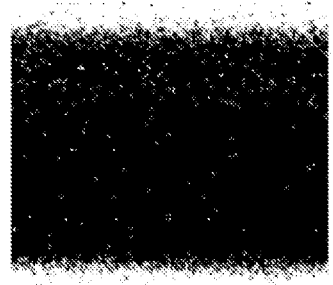
Before Driving Test
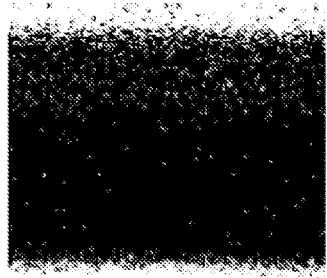
After Driving Test

LIGHT-EMITTING ELEMENT, LIGHT-EMITTING DEVICE, ELECTRONIC DEVICE, AND LIGHTING DEVICE

BACKGROUND OF THE INVENTION

1. Field of the Invention

One embodiment of the present invention relates to a light-emitting device, a display device, a display module, a lighting module, an electronic device, and a lighting device. Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, a method of driving any of them, and a method of manufacturing any of them.

2. Description of the Related Art

As next generation lighting devices or display devices, display devices using light-emitting elements (organic EL elements) in which organic compounds are used as light-emitting substances have been developed or commercialized because of their potential for thinness, lightness, flexibility, high speed response to input signals, low power consumption, and the like.

In an organic EL element, voltage application between electrodes, between which a light-emitting layer is interposed, causes recombination of electrons and holes injected from the electrodes, which brings a light-emitting substance (an organic compound) into an excited state, and the return from the excited state to the ground state is accompanied by light emission. Since the spectrum of light emitted from a light-emitting substance depends on the light-emitting substance, use of different types of organic compounds as light-emitting substances makes it possible to obtain light-emitting elements which exhibit various colors.

The lifetime and reliability are important characteristics of such light-emitting elements.

Patent Document 1 focuses on a halide contained in an organic compound included in an EL layer and discloses a light-emitting element with a long lifetime obtained by limiting the concentration of halides to a certain level.

Patent Document 2 discloses that the lifetime is adversely affected by the amount of halogen compounds in a light-emitting layer and a layer adjacent to the light-emitting layer (specifically, a light-emitting region) in an EL layer and that the lifetime is not largely affected by halides contained in a hole-injection layer apart from the light-emitting region even when the amount of the halides is large to some degree.

REFERENCES

Patent Documents

[Patent Document 1] International Publication WO 00/41443 pamphlet
[Patent Document 2] Japanese Published Patent Application No. 2014-90165

SUMMARY OF THE INVENTION

In order to form a high-purity EL layer with a material other than a target organic compound contained as little as possible, precise adjustments to purification of a material and an atmosphere of a manufacturing process are required, which leads to an increase of costs for manufacture or materials. When costs are taken into consideration, the use of a material with unnecessarily high purity and the unnecessary adjustment of an atmosphere are not preferable.

Conventionally, impurity control in a light-emitting layer for light emission has been considered important. However, the present inventors have found that it is important to control halogen impurity concentration not only in the light-emitting layer but also in an EL layer (e.g., an electron-transport layer or an electron-injection layer) located closer to a cathode than the light-emitting layer. Furthermore, they have found that such control is important particularly in a light-emitting element with a certain structure.

In view of the above, an object of one embodiment of the present invention is to provide a novel light-emitting element. Another object of one embodiment of the present invention is to provide a highly reliable light-emitting element.

Another object of one embodiment of the present invention is to provide a light-emitting device, a display device, an electronic device, and a lighting device each of which can be manufactured at a low cost.

It is only necessary that at least one of the above-described objects be achieved in one embodiment of the present invention. Note that the description of these objects does not disturb the existence of other objects. One embodiment of the present invention does not necessarily have all the above objects. Other objects will be apparent from and can be derived from the description of the specification, the drawings, the claims, and the like.

One embodiment of the present invention is a light-emitting element including an anode, a cathode, and an EL layer between the anode and the cathode. The EL layer includes a light-emitting layer and an electron injection transport layer between the light-emitting layer and the cathode, and the amount of a halogen detected from a material forming the electron injection transport layer is less than or equal to 30 ppm.

One embodiment of the present invention is a light-emitting element including an anode, a cathode, and an EL layer between the anode and the cathode. The EL layer includes a light-emitting layer and an electron injection transport layer between the light-emitting layer and the cathode. The electron injection transport layer contains a first organic compound. A halogen-substituted product of the first organic compound releases a halogen by receiving an electron. The amount of the halogen detected from a material forming the electron injection transport layer is less than or equal to 30 ppm.

One embodiment of the present invention is a light-emitting element including an anode, a cathode, and an EL layer between the anode and the cathode. The EL layer includes a light-emitting layer and an electron injection transport layer between the light-emitting layer and the cathode. The electron injection transport layer contains a first organic compound. Energy for releasing a halogen from a halogen-substituted product of the first organic compound in a radical anion state is less than or equal to 1.00 eV. The amount of the halogen detected from a material forming the electron injection transport layer is less than or equal to 30 ppm.

One embodiment of the present invention is the light-emitting element having the above-described structure in which the first organic compound is a heteroaromatic compound.

One embodiment of the present invention is the light-emitting element having the above-described structure in which the proportion of the halogen in the material forming the electron injection transport layer is less than or equal to 10 ppm.

One embodiment of the present invention is a light-emitting element including an anode, a cathode, and an EL layer between the anode and the cathode. The EL layer includes a light-emitting layer and an electron injection transport layer between the light-emitting layer and the cathode. The electron injection transport layer contains a first organic compound. The light-emitting layer contains a second organic compound. A halogen-substituted product of the first organic compound releases a halogen by receiving an electron. A halogen-substituted product of the second organic compound is not increased even when total driving time of the light-emitting element is increased.

One embodiment of the present invention is a light-emitting element including an anode, a cathode, and an EL layer between the anode and the cathode. The EL layer includes a light-emitting layer and an electron injection transport layer between the light-emitting layer and the cathode. The electron injection transport layer contains a first organic compound. The light-emitting layer contains a second organic compound. A halogen-substituted product of the first organic compound releases a halogen by receiving an electron. At a time when luminance of the light-emitting element is decreased to 80% or less of initial luminance, the amount of a halogen-substituted product of the second organic compound is not increased as compared to that in an initial stage of driving.

One embodiment of the present invention is a light-emitting element including an anode, a cathode, and an EL layer between the anode and the cathode. The EL layer includes a light-emitting layer and an electron injection transport layer between the light-emitting layer and the cathode. The electron injection transport layer contains a first organic compound. The light-emitting layer contains a second organic compound. Energy for releasing a halogen from a halogen-substituted product of the first organic compound in a radical anion state is less than or equal to 1.00 eV. A halogen-substituted product of the second organic compound is not increased even when total driving time of the light-emitting element is increased.

One embodiment of the present invention is a light-emitting element including an anode, a cathode, and an EL layer between the anode and the cathode. The EL layer includes a light-emitting layer and an electron injection transport layer between the light-emitting layer and the cathode. The electron injection transport layer contains a first organic compound. The light-emitting layer contains a second organic compound. Energy for releasing a halogen from a halogen-substituted product of the first organic compound in a radical anion state is less than or equal to 1.00 eV. At a time when luminance of the light-emitting element is decreased to 80% or less of initial luminance, the amount of a halogen-substituted product of the second organic compound is not larger than that in an initial stage of driving.

One embodiment of the present invention is the light-emitting element having the above-described structure in which the halogen is chlorine.

One embodiment of the present invention is the light-emitting element having the above-described structure in which the first organic compound is a heteroaromatic compound.

One embodiment of the present invention is the light-emitting element having the above-described structure in which the heteroaromatic compound includes a quinoxaline skeleton.

One embodiment of the present invention is the light-emitting element having the above-described structure in which the heteroaromatic compound includes a phenanthroline skeleton.

One embodiment of the present invention is the light-emitting element having the above-described structure in which the light-emitting layer has a hole-transport property higher than an electron-transport property.

One embodiment of the present invention is a light-emitting device including the light-emitting element, and a transistor or a substrate.

One embodiment of the present invention is an electronic device including the light-emitting element, and a sensor, an operation button, a speaker, or a microphone.

One embodiment of the present invention is a lighting device including the light-emitting element and a housing.

Note that the light-emitting device in this specification includes an image display device using a light-emitting element. The light-emitting device may be included in a module in which a light-emitting element is provided with a connector such as an anisotropic conductive film or a tape carrier package (TCP), a module in which a printed wiring board is provided at the end of a TCP, and a module in which an integrated circuit (IC) is directly mounted on a light-emitting element by a chip on glass (COG) method. The light-emitting device may be included in lighting equipment.

According to one embodiment of the present invention, a novel light-emitting element or a highly reliable light-emitting element can be provided.

According to one embodiment of the present invention, a light-emitting device, a display device, an electronic appliance, and a lighting device that can be fabricated at a low cost by using any of the above-described light-emitting elements can be provided.

It is only necessary that at least one of the above effects be achieved in one embodiment of the present invention. Note that the description of these effects does not disturb the existence of other effects. One embodiment of the present invention does not necessarily achieve all these effects. Other effects will be apparent from and can be derived from the description of the specification, the drawings, the claims, and the like.

BRIEF DESCRIPTION OF THE DRAWINGS

FIGS. 2A and 2B are conceptual diagrams of an active matrix light-emitting device.

FIGS. 3A and 3B are conceptual diagrams of active matrix light-emitting devices.

FIGS. 7A, 7B1, 7B2, 7C, 7D1, and 7D2 illustrate electronic devices.

FIGS. 14A and 14B show chlorine ion intensity distributions in cross sections of the light-emitting element A and the light-emitting element B.

DETAILED DESCRIPTION OF THE INVENTION

Figure 1A:
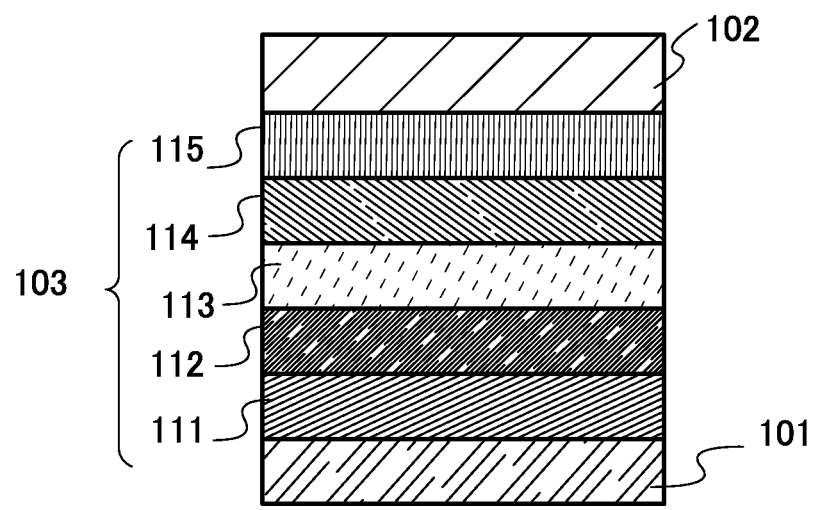
FIGS. 1A and 1B are conceptual diagrams of light-emitting elements.

Hereinafter, embodiments of the present invention will be described with reference to the drawings. Note that the present invention is not limited to the description below, and it is easily understood by those skilled in the art that various changes and modifications can be made without departing from the spirit and scope of the present invention. Therefore, the invention should not be construed as being limited to the description in the following embodiments.

It is known that, in a light-emitting element including a light-emitting layer containing an organic compound (organic EL element), the purity of the organic compound in an EL layer including the light-emitting layer influences the lifetime of the light-emitting element. In particular, a halogen-substituted product obtained by substitution of a halogen such as chlorine, bromine, or iodine is easily mixed in the synthesis process of the organic compound. The halogen-substituted product is difficult to remove and has a great influence on the lifetime. To obtain a long-lifetime light-emitting element, maintaining the halogen concentration in an EL layer at lower than or equal to a certain level is proposed as in Patent Document 1.

According to Patent Document 2, a certain amount (approximately several hundreds of parts per million) of halogens in a layer apart from a light-emitting layer, e.g., a hole-injection layer, does not influence the luminance decay associated with the increase in driving time. That is, according to Patent Document 2, luminance decay associated with the increase in driving time is promoted in the case where a halogen is present in a light-emitting region in the light-emitting layer, and a halogen contained in the hole-injection layer which is not directly related to light emission and a hole-transport layer apart from the light-emitting region does not induce such luminance decay.

However, the present inventors have found that a halogen-substituted product of an organic compound contained in the organic compound forming a layer positioned on the cathode side (hereinafter such a halogen-substituted product is also referred to as a halogen-substituted product on the cathode side) induces the luminance decay associated with the increase in driving time of a light-emitting element (hereinafter such luminance decay is also simply referred to as luminance decay) in some cases even when the halogen-substituted product is located apart from a light-emitting layer. It is also found that a halogen-substituted product on the cathode side has almost no influence on the initial characteristics of the light-emitting element.

As a result of studies and experiments in the light of the foregoing, the present inventors have found that a halogen-substituted product on the cathode side can easily produce a halide ion by electron injection and release a halogen and that the released halogen is moved to the anode side by an electric field. The halogen is moved by an electric field and reaches a light-emitting region, whereby the luminance decay associated with the increase in driving time is probably induced as in the case where a halogen is originally present in the light-emitting region.

Figure 13:
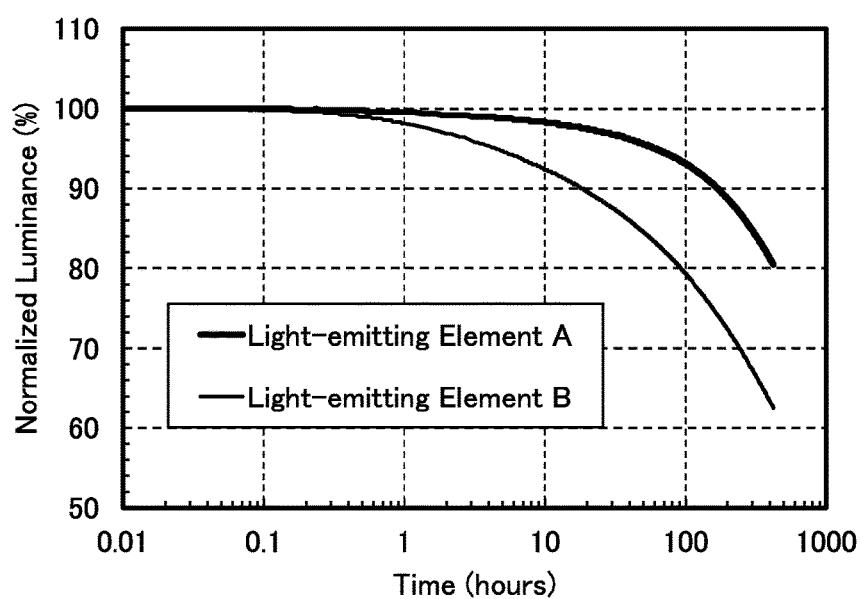
FIG. 13 shows normalized luminance-time change characteristics of a light-emitting element A and a light-emitting element B.

FIG. 13 shows the measurement results of time dependence of normalized luminance of light-emitting elements A and B driven under the conditions where the initial luminance was set to 5000 cd/m$^2$ and the current density was constant. FIGS. 14A and 14B show the results of analyzing the light-emitting elements A and B by time-of-flight secondary ion mass spectrometry (ToF-SIMS). In each of the light-emitting elements A and B subjected to the measurement, an EL layer 103 is provided between a first electrode 101 and a second electrode 102. In the light-emitting element having a structure as shown in FIG. 1A in which the EL layer 103 includes a hole-injection layer 111, a hole-transport layer 112, a light-emitting layer 113, an electron-transport layer 114, and an electron-injection layer 115 from the first electrode 101 side, an electron-transport layer and an electron-injection layer can be collectively referred to as an electron injection transport layer.

The light-emitting element A and the light-emitting element B differ only in the concentration of chlorine in 2,9-bis(naphthalen-2-yl)-4,7-diphenyl-1,10-phenanthroline (abbreviation: NBPhen) used as a material of the electron-injection layer 115. The light-emitting element A and the light-emitting element B include NBPhen at a chlorine concentration of 14 ppm and NBPhen at 220 ppm, respectively, obtained by combustion-ion chromatography.

It is shown from FIG. 13 that, after a driving test performed for 420 hours, a difference as large as approximately 20% is made in the luminance of the light-emitting elements A and B having the same structure and differing only in the chlorine concentration of NBPhen in the electron-injection layer. Note that for the detailed structure of the light-emitting elements A and B, refer to the description of a light-emitting element 1 and a comparative light-emitting element 1 in Example 1.

FIGS. 14A and 14B show the intensity distributions of anions (m/z=35.0, chlorine ion: Cl$^-$) in cross sections of the light-emitting elements analyzed by ToF-SIMS. FIGS. 14A and 14B show the results of the light-emitting element A and the light-emitting element B, respectively, before and after the driving test. The measurement is performed while digging is performed from the cathode side to the anode side after the cathode of the light-emitting element is removed. In FIGS. 14A and 14B, the lower part is the anode side and the upper part is the cathode side. In FIGS. 14A and 14B, bright spots show positions with high chloride ion intensity, and dark spots show positions with low chloride ion intensity. Note that a high-purity material with a halogen concentration less than or equal to 10 ppm is used as an organic compound other than NBPhen.

First, the results of the light-emitting element A and the light-emitting element B before the driving test are compared with each other. More bright spots can be seen in the light-emitting element B than in the light-emitting element A. That is, the chlorine concentration in NBPhen used in the light-emitting elements A and B has an influence on the results.

Next, the results of the light-emitting element A before and after the driving test are compared with each other, and the results of the light-emitting element B before and after the driving test are compared with each other. In the light-emitting element A, bright spots are slightly increased in a region from the upper part to the middle part in FIG. 14A after the driving test. In the light-emitting element B, bright spots are obviously increased in a region from the upper part to the middle part in FIG. 14B after the driving test. It can be estimated that chlorine is dispersed from a chlorine-substituted product of NBPhen to the anode side by driving the light-emitting element.

Note that the contamination of a lower layer with chlorine due to the measurement from the cathode side is probably present to some degree, but this does not deny dispersion of chlorine ions because the results before and after the driving are largely different from each other in the light-emitting elements having the same structure and the same material.

Figure 15:
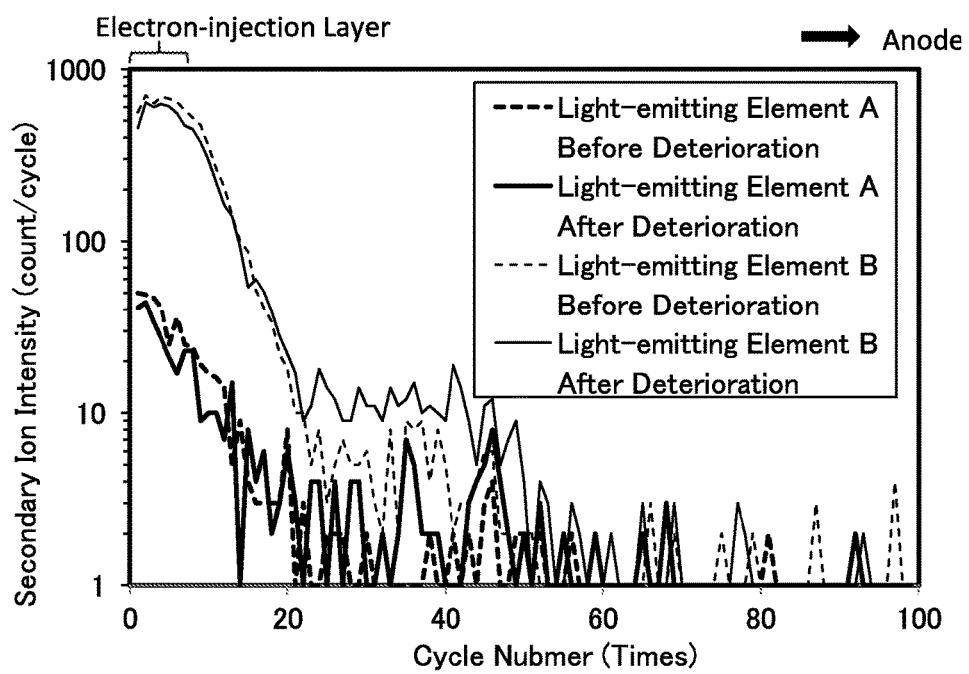
FIG. 15 shows changes in the chlorine ion intensity in the light-emitting element A and the light-emitting element B in a depth direction.

FIG. 15 is a graph showing changes in the secondary ion intensity of chlorine ions in a depth direction before and after deterioration of the light-emitting elements A and B. In FIG. 15, there is no significant difference in the intensity of chlorine ions (m/z=35) in and in the vicinity of the electron-injection layer (a layer containing NBPhen), i.e., at around 0 to 20 cycles, between the light-emitting element after the driving test (after deterioration) and the light-emitting element before the driving test (before deterioration). However, in a layer in and in the vicinity of the electron-transport layer, i.e., at around 20 to 50 cycles, there is a tendency that the chlorine ion intensity after deterioration is higher than that before deterioration. These also suggest the possibility of dispersion of chlorine from the NBPhen layer.

A chlorine-substituted product of NBPhen is too large and therefore not likely to move in an organic film as it is. Thus, it can be estimated that a chlorine ion detected in and in the vicinity of the electron-transport layer of the light-emitting element B after deterioration is probably due to the diffusion of a chlorine atom released from a chlorine-substituted product of NBPhen by driving.

When a chlorine ion detected in the electron-transport layer after deterioration is assumed to be derived from a chlorine-substituted product of NBPhen contained in the electron-injection layer as described above, it might be expected that chlorine ion intensity detected in the electron-injection layer of the light-emitting element after deterioration will decrease more than that detected in the light-emitting element before deterioration because of dispersion of chlorine into the electron-transport layer or the light-emitting layer. However, the expected decrease is not observed in FIG. 15. This is probably because chlorine ions detected in and in the vicinity of the electron-injection layer of the light-emitting element before deterioration are mainly detected as product ions of chlorine-substituted products of NBPhen, whereas chlorine ions detected in the light-emitting element after deterioration are chlorine released from chlorine-substituted products of NBPhen in addition to product ions of chlorine-substituted products of NBPhen. Released chlorine is ionized more easily than chlorine detected as product ions of chlorine-substituted products of NBPhen, and therefore, the chlorine ion intensity of the electron-injection layer in the light-emitting element after deterioration does not decrease significantly. Note that since the detection sensitivity of chlorine ions in layers is considered somewhat different by a matrix effect, absolute values of detection sensitivity in the layers may vary slightly.

As described above, it can be found that halogens of halogen-substituted products contained in the electron-injection layer are released and dispersed by driving. It can be estimated that this is the reason why a halogen-substituted product located apart from the light-emitting layer including the light-emitting region affects the luminance decay of the light-emitting element.

Provided that luminance decay is affected by the halogen-substituted product in the electron-injection layer, luminance decay is obviously affected by the halogen-substituted product contained in the electron-transport layer positioned closer to the light-emitting layer than the electron-injection layer.

Here, how halogen can be released from the halogen-substituted product of the electron-transport material used for the electron injection transport material is analyzed by quantum-chemistry calculation. Note that Gaussian 09 is used as the quantum chemistry computational program. As a basis function, 6-311G(d,p) is used, and as a functional, B3LYP is used. A high performance computer (ICE X, manufactured by SGI Japan, Ltd.) is used for the calculation.

Calculation is performed using 2-[3'-(dibenzothiophen-4-yl)biphenyl-3-yl]dibenzo[f,h]quinoxaline (abbreviation: 2mDBTBPDBq-II) as an example of an electron-transport material. Halogen-substituted products which might be mixed into 2mDBTBPDBq-II in a synthesis process are mainly products each obtained by substitution of one chlorine. Structural formulae of 2mDBTBPDBq-II and the product obtained by substitution of one chlorine are shown below. Note that the halogen-substituted products, which might be mixed into 2mDBTBPDBq-II in the synthesis process, are expected to be mainly products obtained by substitution of one chlorine, on the basis of a mass-to-charge ratio measured with a TOF-MS detector, chlorine concentration obtained by combustion ion chromatography, and the synthesis pathway, and the substitution site of chlorine is not known.

[Chemical Formula 1]

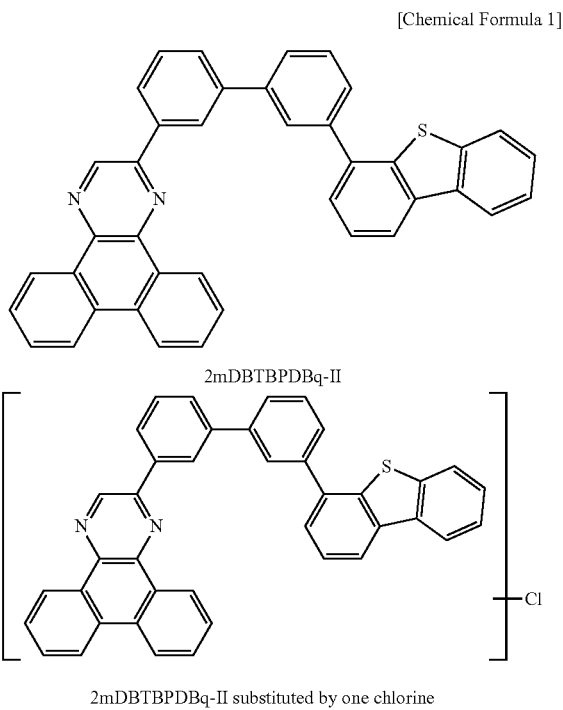

2mDBTBPDBq-II

2mDBTBPDBq-II substituted by one chlorine

For the calculation, a simplified model shown below is used.

[Chemical Formula 2]

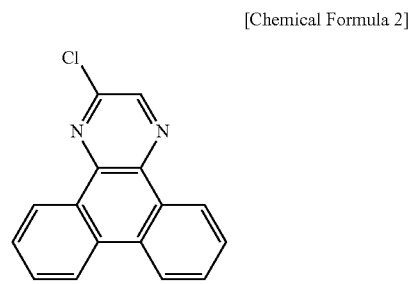 [SMILES: Clc1cnc2c3ccccc3c3ccccc3c2n1]

Figure 16A:
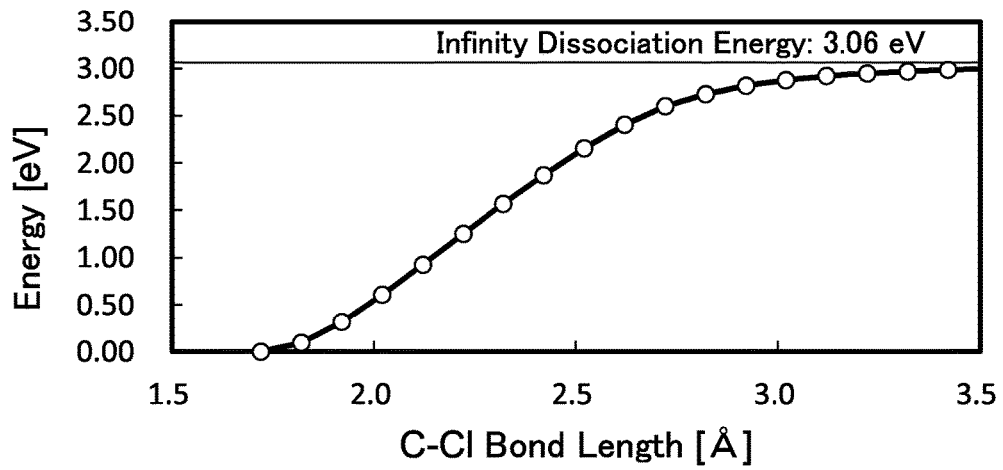
FIGS. 16A to 16C show activation energy of release of a chlorine atom.
Figure 16B:
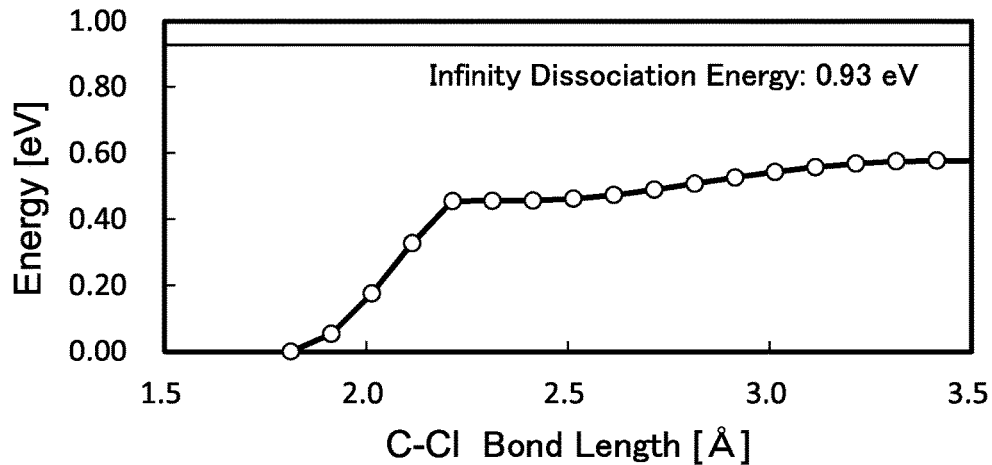
Figure 16C:
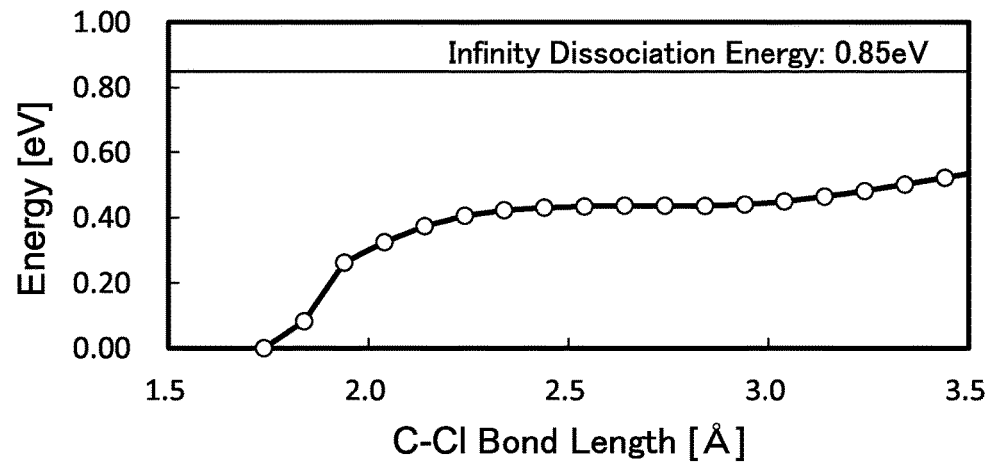

In this embodiment, calculation is performed on the case of three electron states in driving a light-emitting element, A) a radical cation state, B) a radical anion state, and C) a triplet excited state. For the calculation in each state, the length of a carbon-chlorine bond is increased, a change in energy is calculated, and activation energy of release of a chlorine atom is obtained. FIGS. 16A to 16C show the results. Table 1 shown below compiles the results.

TABLE 1

| State of halogen- | | State after being released | |
|---|---|---|---|
| substituted product | C—Cl bond energy | Chlorine | DBq |
| A) Radical cation state | 3.06 eV | Cl■ (radical) | DBq+ (ion) |
| B) Radical anion state | 0.46 eV | Cl− (ion) | DBq■ (radical) |

TABLE 1-continued

| State of halogen- | | State after being released | |
|---|---|---|---|
| substituted product | C—Cl bond energy | Chlorine | DBq |
| C) Triplet excited state | 0.44 eV | Cl■ (radical) | DBq■ (radical) |

In the radical cation state, as shown in FIG. 16A, the longer the bond length of carbon and chlorine is, the larger the energy becomes. The carbon-chlorine bond energy is calculated to be 3.06 eV, in which case a chlorine atom is unlikely to be liberated in the radical cation state. Note that the radical cation state is formed by injection of holes, and often formed in a material in a hole-injection layer, a hole-transport layer, or a light-emitting layer.

In the radical anion state, as shown in FIG. 16B, there is a transition state in which energy is at the maximum when the bond length of carbon and chlorine is 0.2267 nm. This means that the carbon-chlorine bond is cut when the bond length becomes longer than 0.2267 nm, and thus a chlorine atom is released. After being released, the chlorine atom probably exists as a chlorine ion (Cl—) and interacts with an adjacent molecule. The activation energy is as small as 0.46 eV; thus, a chlorine atom is likely to be released in the radical anion state. Note that the radical anion state is formed by injection of electrons, and often formed in an electron-injection layer, an electron-transport layer, or a light-emitting layer.

According to FIG. 16C, a chlorine atom is likely to be liberated also in the triplet excited state. The activation energy is 0.44 eV, which is almost the same as that in the radical anion state. After being liberated, the chlorine atom probably exists as a chlorine radical (Cl.) and interacts with an adjacent molecule. In the case of an EL element, the proportion of triplet excitons in a recombination region and the vicinity of the recombination region in a light-emitting layer is 75%.

The activation energy for a rapid reaction at room temperature is approximately 1.00 eV, more specifically, approximately 0.87 eV. From this aspect, chlorine is likely to be released or liberated in the radical cation state and the triplet excited state.

Next, calculation was similarly performed on chlorine-substituted products of some heteroaromatic compounds, specifically heteroaromatic compounds including a quinoxaline skeleton or a phenanthroline skeleton, which can be used as a material of the electron injection transport layer. Activation energy for releasing chlorine from the material in a radical anion state was obtained. A structural formula of each material is shown below together with the obtained activation energy. Note that in the case where the material is provided between the light-emitting layer and the cathode, the probability of formation of an excited state by recombination is extremely low; therefore, energy for releasing chlorine from the material in a radical anion state is only shown.

[Chemical Formulae 3]

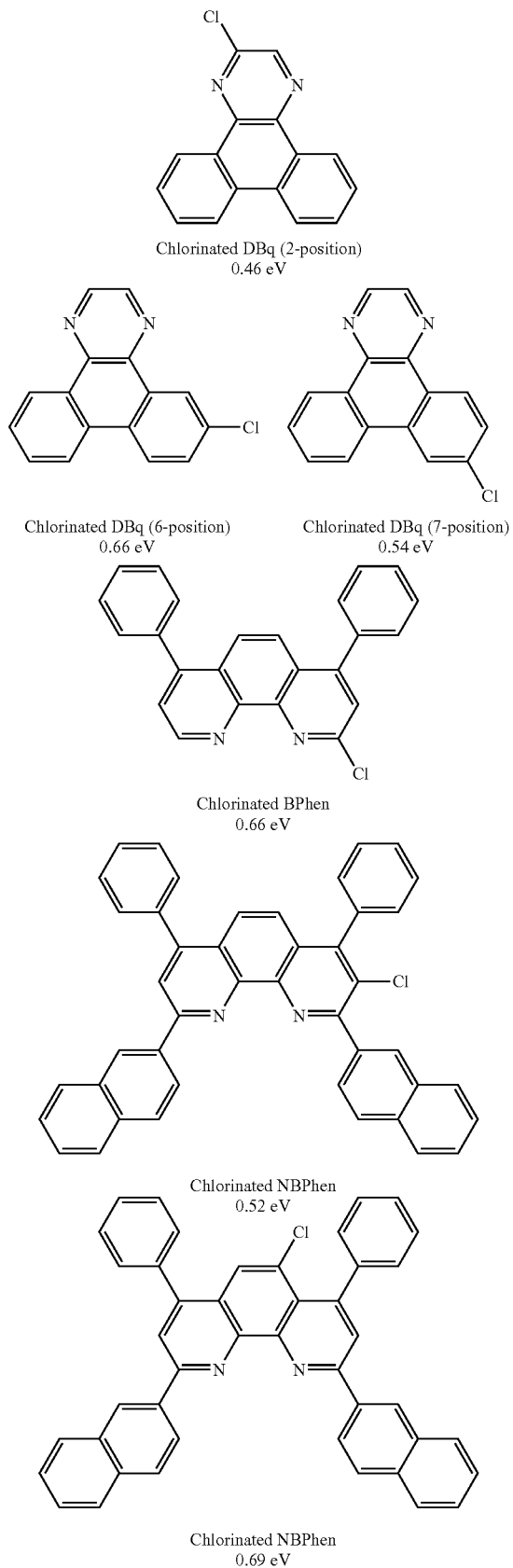

Chlorinated DBq (2-position)
0.46 eV

Chlorinated DBq (6-position)
0.66 eV

Chlorinated DBq (7-position)
0.54 eV

Chlorinated BPhen
0.66 eV

Chlorinated NBPhen
0.52 eV

Chlorinated NBPhen
0.69 eV

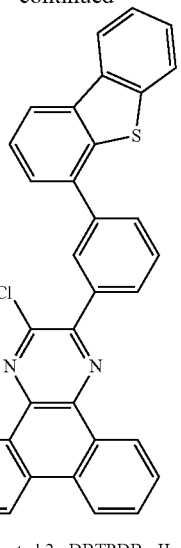

Chlorinated 2mDBTPDBq-II
0.46 eV

In each of the materials, activation energy for releasing chlorine from the material in a radical anion state is below 1.00 eV, suggesting that chlorine is released easily.

As described above, a halogen-substituted product, which serves as an impurity, releases halogen easily in the radical anion state and the triplet excited state which are formed by driving the light-emitting element. The released halogen is moved toward the light-emitting layer by an electric field. The halogen released from the halogen-substituted product exists as a radical or an ion with high reactivity, and is likely to substitute for hydrogen of a material near the halogen and form a halogen-substituted product of the material. When a light-emitting material becomes a halogen-substituted product, the halogen-substituted product decreases the quantum yield in some cases, leading to a reduction in lifetime.

A halogen moved to the light-emitting layer and substituted for a material of the light-emitting layer might be released or liberated again by excitation, electron injection, or the like. At this time, a skeleton from which a halogen is released or liberated is brought into a radical state. Since the skeleton is also highly reactive, the skeleton in a radical state may interact or react with another material. For example, the skeleton in a radical state from which a halogen is released or liberated is bonded to another material to increase molecular weight, and thus, conjugation extends. This lowers a triplet excited level or a singlet excited level, so that a light-emitting material cannot be excited effectively or an exciton of the light-emitting material is inactivated in some cases, for example.

As described above, there is a high probability that the lifetime is shortened by highly reactive chlorine in an ionic state or a radical state that moves and adversely affects the light-emitting layer.

The results of the quantum-chemistry calculation show that a bond between carbon and chlorine of the halogen-substituted product is likely to be cut in the radical anion state or the triplet excitation state and less likely to be cut in the radical cation state. To demonstrate chlorine release in the radical anion state, whether halogen is released from the halogen-substituted product by reduction is experimentally checked.

The confirmatory experiment is performed in the following manner. First, a solution of a chlorine-substituted product (2-chlorodibenzo[f,h]quinoxaline (abbreviation: Cl-DBq)) was formed. Next, voltage is applied to the solution with a cyclic voltammetry (CV) apparatus, and a reduction state is maintained for a certain time. Then, a purity test is performed with an ultra-high performance liquid chromatography (UHPLC) system to confirm occurrence or non-occurrence of chlorine release, measure the amount of chlorine, and examine an increase and decrease in the chlorine-substituted product. Note that the structural formula of Cl-DBq is shown below.

[Chemical Formula 4]

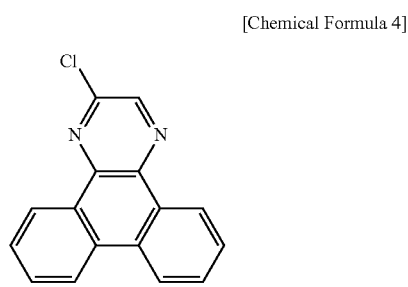 [SMILES: Clc1cnc2c3ccccc3c3ccccc3c2n1]

Figure 17:
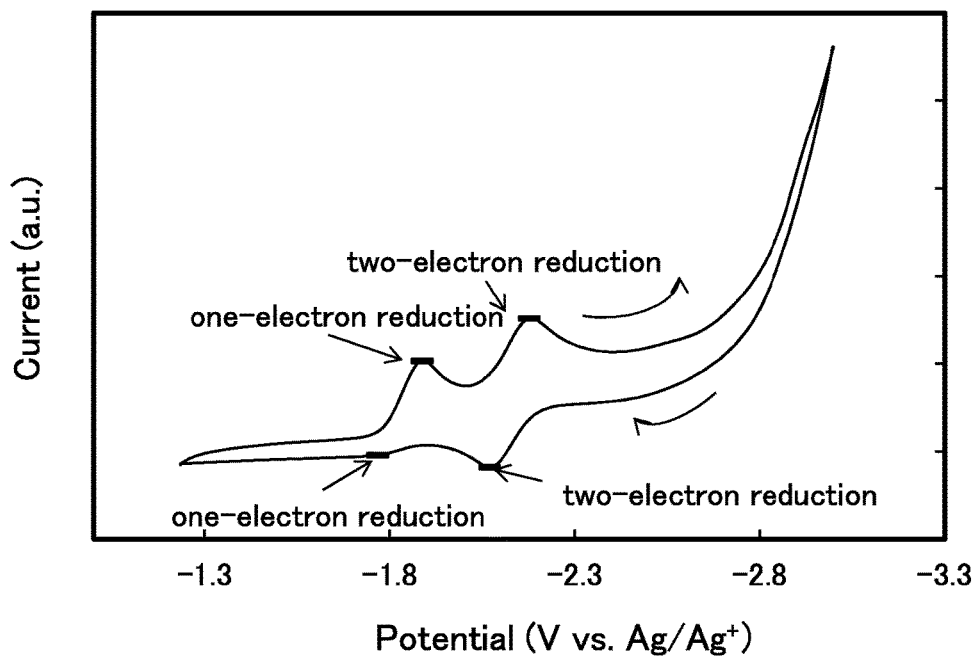
FIG. 17 is a CV chart of Cl-DBq.

The solution of Cl-DBq has a concentration of 0.2 mol/l, dimethylformamide (abbreviation: DMF) is used as a solvent, 10 mmol/l of tetra-n-butylammonium perchlorate is used as an electrolyte, and the mixture is bubbled with argon while being stirred (hereinafter, the solution prepared in this manner is called adjusted solution). The potentials of one-electron reduction and two-electron reduction of this material are measured with a CV apparatus. FIG. 17 is a chart showing these potentials. A potential of one-electron reduction is an intermediate value between a peak of one-electron reduction potential and a peak of one-electron oxidation potential. A potential of two-electron reduction is an intermediate value between a peak of two-electron reduction potential and a peak of two-electron oxidation potential.

Next, a potential higher than the potential of one-electron reduction by approximately 0.1 V and a potential higher than the potential of two-electron reduction by approximately 0.1 V are applied to solutions that are the same as the adjusted solution for approximately 67 hours while the solutions were being stirred.

Table 2 shows the potentials of one-electron reduction and two-electron reduction of the material, and the potentials actually applied and held. Hereinafter, a potential higher than the potential of one-electron reduction by approximately 0.1 V is referred to as a holding potential 1, and a potential higher than the potential of two-electron reduction by approximately 0.1 V is referred to as a holding potential 2 in some cases. Note that a sample was formed for reference in such a manner that the adjusted solution was left for greater than or equal to 67 hours without application of potential.

TABLE 2

|  | One-electron reduction | Two-electron reduction |
|---|---|---|
| Reduction potential | −1.81 | −2.12 |
| Holding potential | −1.94 | −2.23 |
|  | (Holding potential 1) | (Holding potential 2) |

(Unit: V vs. Ag/Ag⁺)

In this CV measurement, Cl-DBq becomes in the radical anion state by one-electron reduction.

Figure 18:
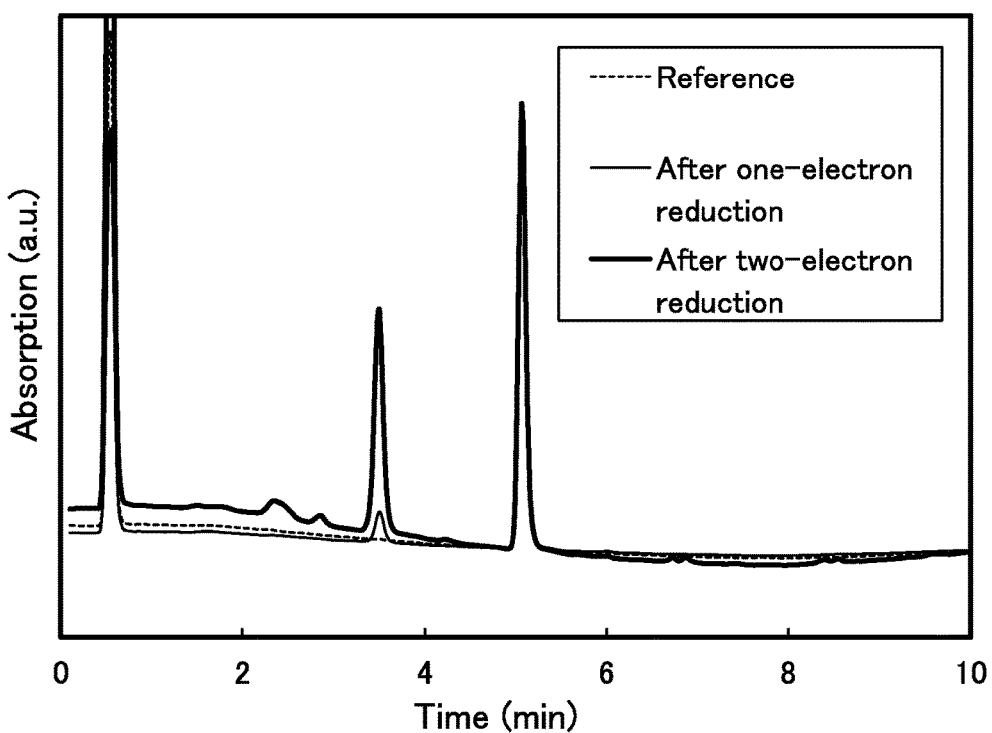
FIG. 18 is a PDA chromatogram of Cl-DBq subjected to a hold test.

After the reaction, the solutions obtained through the hold test were subjected to a purity test by UHPLC. FIG. 18 is a photodiode array (PDA) chromatogram measured by UHPLC.

In FIG. 18, the sample for reference, the sample subjected to one-electron reduction by application of the holding potential 1, and the sample subjected to two-electron reduction by application of the holding potential 2 have peaks at around 5.1 minutes. The peaks at around 5.1 minutes are derived from a substance with m/z=264 that corresponds to Cl-DBq. The sample subjected to one-electron reduction and the sample subjected to two-electron reduction also have peaks at around 3.5 minutes. These peaks are mainly derived from a substance with m/z=231 that corresponds to a compound in which chlorine is released from Cl-DBq and which is terminated with hydrogen, that is, dibenzoquinoxaline (abbreviation: DBq). The sample subjected to two-electron reduction has two peaks at 2.3 minutes and 2.8 minutes. These two peaks are derived from a substance with m/z=302 which is probably a substance (abbreviation: DBq-DMF) in which hydrogen of DBq is substituted by the solvent DMF. The samples subjected to reduction exhibit peaks derived from a substance without chlorine as described above, which means that chlorine is released from the chlorine-substituted product by reduction. The existence of DBq-DMF indicates that DBq radical (DBq.) that is generated when chlorine is released from Cl-DBq reacts with the solvent DMF.

Figure 19:
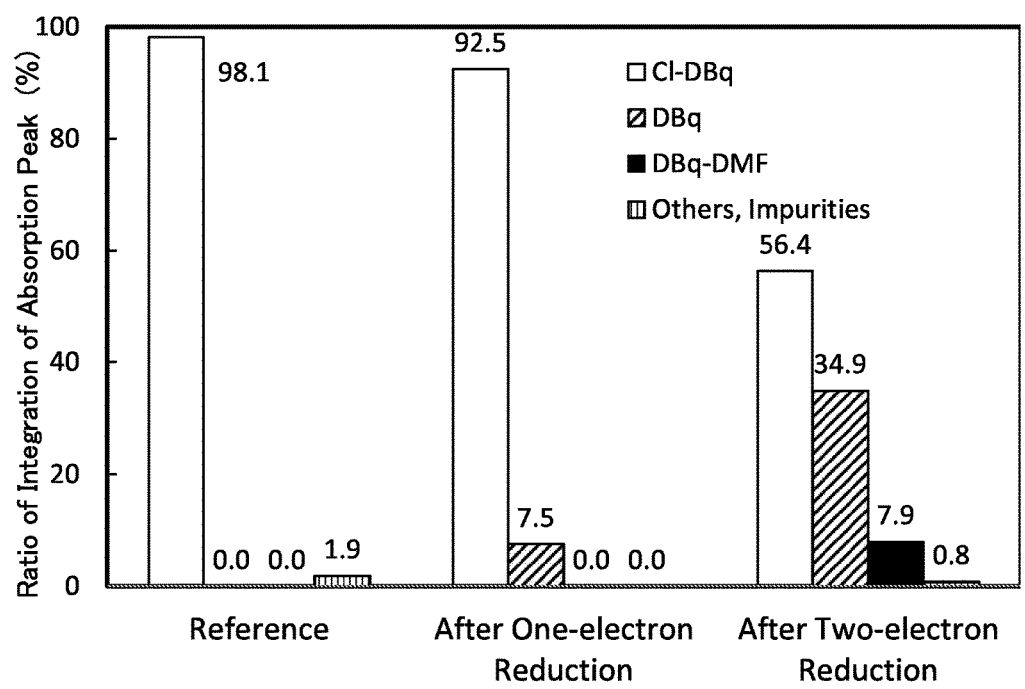
FIG. 19 shows the ratio of integration of peaks in a PDA chromatogram of Cl-DBq subjected to a hold test.

FIG. 19 is a graph showing the ratio of integration of the peaks corresponding to the materials in the chromatogram. According to FIG. 19, a substance that seems to be DBq, which is formed by chlorine release from Cl-DBq, exists at approximately 7.5% in the sample subjected to one-electron reduction, and exists at approximately 34.9% in the sample subjected to two-electron reduction. Moreover, the substance with m/z=302 which is probably the substance in which hydrogen of DBq is substituted by the solvent DMF exists at approximately 7.9% in the sample subjected to two-electron reduction (potential of two-electron reduction is higher than the potential of one-electron reduction). This substance is also generated because of the release of chlorine. In the sample subjected to two-electron reduction, DBq and DBq-DMF exist at 42.8% in total; therefore, the release of chlorine occurs at a greatly high rate.

Thus, a halogen-substituted product of an organic compound used for the electron injection transport layer is brought into a radical anion state or a triplet excited state by driving the light-emitting element to release or liberate chlorine easily. The released or liberated halogen is diffused to the light-emitting layer side. Since the released or liberated halogen is in a radical state or an ionic state and is highly reactive, the halogen is substituted for hydrogen in an organic compound (e.g., a light-emitting material or a host material) in the light-emitting layer in some cases. If the substitution of a halogen occurs in the light-emitting material, quantum efficiency might be decreased. Furthermore, a halogen substituting for another material in the light-emitting layer might be released or liberated again by excitation, electron injection, or the like. In that case, a skeleton from which the halogen is released is brought into a radical state and is highly reactive. The skeleton in a radical state can interact or react with another material. For example, the skeleton in a radical state is bonded to another material to increase molecular weight, and thus, conjugation extends. This lowers a triplet excited level or a singlet excited level, so that a light-emitting material cannot be excited effectively in some cases, for example. In addition, an oxidant of a radical and a reductant of the radical themselves have low energy level and might be a quenching factor.

As described above, in the case where the light-emitting element including an EL layer (electron injection transport layer) closer to the cathode than the light-emitting layer contains an organic compound of which a halogen-substituted product releases a halogen by reception of an electron, when the concentration of the halogen-substituted product of the organic compound in the light-emitting layer in the light-emitting element is not increased by driving the light-emitting element, the light-emitting element has long lifetime.

In the light-emitting element in which energy for releasing a halogen from a halogen-substituted product of an organic compound in a radical anion state by reception of an electron is less than or equal to 1.00 eV, preferably less than or equal to 0.87 eV, the lifetime is likely to be short. In such a light-emitting element, long lifetime can be achieved in the case where the concentration of the halogen-substituted product of a material contained in the light-emitting layer is not increased by driving.

Note that an increase and decrease in the amount of halogen-substituted product can be examined by a UHPLC method and a preferable detection method.

It is preferable that the increase and decrease in concentration of a chlorine-substituted product be checked when the luminance of the light-emitting element under the driving test becomes approximately 80% or lower of the initial luminance.

In a light-emitting element in which energy for releasing a halogen from a halogen-substituted product of an organic compound forming the electron injection transport layer is less than or equal to 1.00 eV, preferably less than or equal to 0.87 eV in a radical anion state, the amount of halogen in the material forming the electron injection transport layer is less than or equal to 30 ppm, preferably less than or equal to 10 ppm, in which case the lifetime of the light-emitting element can be long.

The light-emitting element of this embodiment with the above-described structure can have a long lifetime, which shows less degradation due to an increase in driving time.

Figure 32:
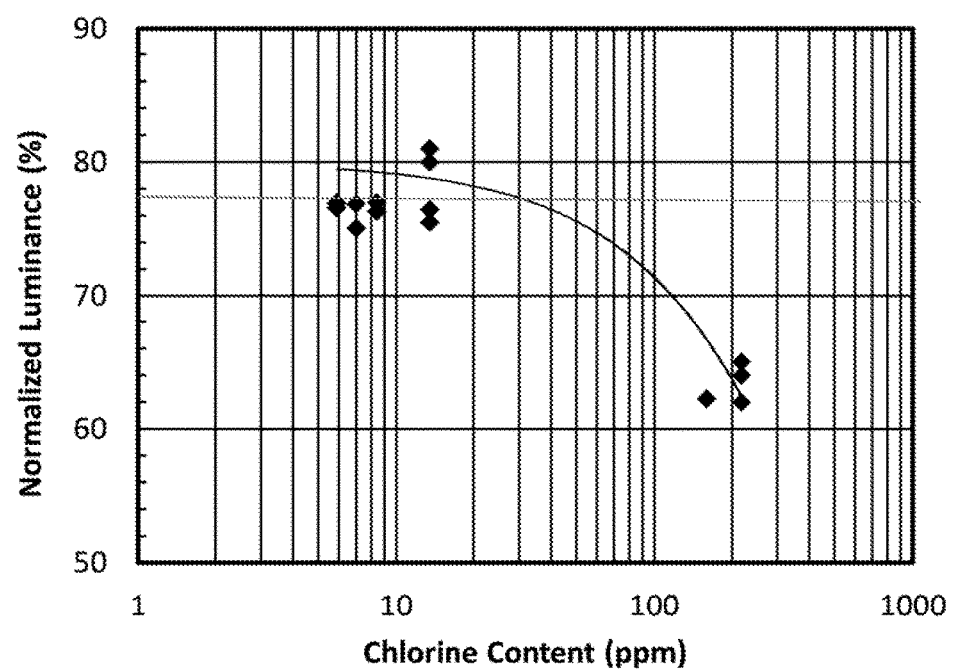
FIG. 32 shows normalized luminance and chlorine content after 420-hour driving.

FIG. 32 shows the results of examining normalized luminance and chlorine content after driving elements including NBPhen which differ in the concentration of halogen-substituted products. In FIG. 32, the results of the elements driven for 420 hours are shown. The structures of the light-emitting elements are described in detail in Example 1. When halides are contained in an electron injection transport layer of the light-emitting element, the reliability of the light-emitting element is low. The influence of halides increases as the concentration of halides becomes higher. As the concentration of contained halides becomes lower, the influence of the halides on reliability is saturated at a certain concentration. In FIG. 32, an intersection of a curve and the average lifetime of light-emitting elements in a group with low chlorine concentration and high reliability (a group with a chlorine concentration less than or equal to 20 ppm) is located at approximately 30 ppm. That is, it can be estimated that the influence is saturated at approximately 30 ppm or lower. This is probably because deterioration due to a factor other than halide impurity reduces reliability when the concentration of the impurity is less than or equal to a certain level. Examples of such deterioration include deterioration of a material in the element and change in transport property by change in film quality.

<<Light-Emitting Element>>

An example of a light-emitting element of one embodiment of the present invention is described in detail below with reference to FIG. 1A.

The light-emitting element of this embodiment includes a pair of electrodes (the first electrode 101 and the second electrode 102), and the EL layer 103 provided between the first electrode 101 and the second electrode 102. Note that the first electrode 101 functions as an anode and the second electrode 102 functions as a cathode.

The EL layer 103 has a stacked-layer structure which can be formed by combining a hole-injection layer, a hole-transport layer, a light-emitting layer, an electron-transport layer, an electron-injection layer, a carrier-blocking layer, an intermediate layer, and the like as appropriate. In this embodiment, the EL layer 103 has a structure in which the hole-injection layer 111, the hole-transport layer 112, the light-emitting layer 113, the electron-transport layer 114, and the electron-injection layer 115 are stacked in this order over the first electrode 101. Specific examples of the materials forming the electrodes and the layers are given below.

Since the first electrode functions as the anode, the first electrode is preferably formed using any of metals, alloys, electrically conductive compounds with a high work function (specifically, a work function of 4.0 eV or more), mixtures thereof, and the like. Specific examples include indium oxide-tin oxide (ITO: indium tin oxide), indium oxide-tin oxide containing silicon or silicon oxide, indium oxide-zinc oxide, and indium oxide containing tungsten oxide and zinc oxide (IWZO). Films of these electrically conductive metal oxides are usually formed by a sputtering method but may be formed by application of a sol-gel method or the like. For example, indium oxide-zinc oxide is deposited by a sputtering method using a target obtained by adding 1 wt % to 20 wt % of zinc oxide to indium oxide. A film of indium oxide containing tungsten oxide and zinc oxide (IWZO) can be formed by a sputtering method using a target in which tungsten oxide and zinc oxide are added to indium oxide at 0.5 wt % to 5 wt % and 0.1 wt % to 1 wt %, respectively. Besides, gold (Au), platinum (Pt), nickel (Ni), tungsten (W), chromium (Cr), molybdenum (Mo), iron (Fe), cobalt (Co), copper (Cu), palladium (Pd), nitrides of metal materials (e.g., titanium nitride), and the like can be given. Graphene can also be used. Note that when a composite material described later is used for a layer that is in contact with the first electrode 101 in the EL layer 103, an electrode material can be selected regardless of its work function.

The hole-injection layer 111 is a layer containing a substance having a high hole-injection property. Molybdenum oxide, vanadium oxide, ruthenium oxide, tungsten oxide, manganese oxide, or the like can be used. Alternatively, the hole-injection layer 111 can be formed using a phthalocyanine-based compound such as phthalocyanine (abbreviation: H2Pc) or copper phthalocyanine (abbreviation: CuPc); an aromatic amine compound such as 4,4'-bis[N-(4-diphenylaminophenyl)-N-phenylamino]biphenyl (abbreviation: DPAB) or N,N'-bis{4-[bis(3-methylphenyl)amino]phenyl}-N,N'-diphenyl-(1,1'-biphenyl)-4,4'-diamine (abbreviation: DNTPD); a high molecule compound such as poly(3,4-ethylenedioxythiophene)/poly(styrenesulfonic acid) (PEDOT/PSS); or the like.

Alternatively, a composite material in which a substance having a hole-transport property contains a substance having an acceptor property can be used for the hole-injection layer 111. Note that the use of such a substance having a hole-transport property which contains a substance having an acceptor property enables selection of a material used to form an electrode regardless of its work function. In other words, besides a material having a high work function, a material having a low work function can be used for the first electrode 101. As the acceptor substance, 7,7,8,8-tetracyano-2,3,5,6-tetrafluoroquinodimethane (abbreviation: $F_4$-TCNQ), chloranil, and the like can be given. In addition, transition metal oxides can be given. Moreover, oxides of metals belonging to Groups 4 to 8 of the periodic table can be used. Specifically, vanadium oxide, niobium oxide, tantalum oxide, chromium oxide, molybdenum oxide, tungsten oxide, manganese oxide, and rhenium oxide are preferable because of their high electron-accepting properties. Among these, molybdenum oxide is especially preferable because it is stable in the air, has a low hygroscopic property, and is easily handled.

As the organic compound having a hole-transport property used for the composite material, any of a variety of organic compounds such as aromatic amine compounds, carbazole derivatives, aromatic hydrocarbons, and high molecular compounds (e.g., oligomers, dendrimers, or polymers) can be used. Note that the organic compound having a hole-transport property preferably has a hole mobility of 10-6 cm2/Vs or higher. Specific examples of the organic compound that can be used as a substance having a hole-transport property in the composite material are given below.

Examples of the aromatic amine compounds that can be used for the composite material are N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), and 1,3,5-tris[N-(4-diphenylaminophenyl)-N-phenylamino]benzene (abbreviation: DPA3B). Specific examples of the carbazole derivatives are 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene. Examples of the aromatic hydrocarbon are 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Other examples are pentacene and coronene. Note that the aromatic hydrocarbons may have a vinyl skeleton. Examples of the aromatic hydrocarbon having a vinyl group include 4,4'-bis(2,2-diphenylvinyl)biphenyl (abbreviation: DPVBi) and 9,10-bis[4-(2,2-diphenylvinyl)phenyl]anthracene (abbreviation: DPVPA).

Other examples are high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl) methacrylamide] (abbreviation: PTPDMA), and poly[N,N'-bis(4-butylphenyl)-N,N'-bis(phenyl)benzidine] (abbreviation: poly-TPD).

By providing the hole-injection layer 111, a high hole-injection property can be achieved to allow a light-emitting element to be driven at a low voltage.

The hole-transport layer 112 is a layer containing a substance having a hole-transport property. Examples of the substance having a hole-transport property are aromatic amine compounds such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), and 4-phenyl-4'-(9-phenylfluoren-9-yl)triphenylamine (abbreviation: BPAFLP). The substances listed here have high hole-transport properties and are mainly ones that have a hole mobility of $10^{-6}$ cm$^2$/Vs or higher. An organic compound given as an example of the substance having a hole-transport property used for the composite material can also be used for the hole-transport layer 112. Moreover, a high molecular compound such as poly(N-vinylcarbazole) (abbreviation: PVK) and poly(4-vinyltriphenylamine) (abbreviation: PVTPA) can also be used. Note that the layer that contains a substance having a hole-transport property is not limited to a single layer, and may be a stack of two or more layers including any of the above substances.

The light-emitting layer 113 may be a layer that emits fluorescence, a layer that emits phosphorescence, or a layer emitting thermally activated delayed fluorescence (TADF). Furthermore, the light-emitting layer 113 may be a single layer or include a plurality of layers containing different light-emitting substances. In the case where the light-emitting layer including a plurality of layers is formed, a layer containing a phosphorescent substance and a layer containing a fluorescent substance may be stacked. In that case, an exciplex described later is preferably utilized for the layer containing the phosphorescent substance.

As the fluorescent substance, any of the following substances can be used, for example. Fluorescent substances other than those given below can also be used. Examples of the fluorescent substance are 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]-pyrene-1,6-diamine (abbreviation: 1,6mMemFLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N',N'-triphenyl-1,4-phenylenediamine] (abbreviation:

DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), and 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM). Condensed aromatic diamine compounds typified by pyrenediamine compounds such as 1,6FLPAPrn and 1,6mMemFLPAPrn are particularly preferable because of their high hole-trapping properties, high emission efficiency, and high reliability.

Examples of a material which can be used as a phosphorescent substance in the light-emitting layer 113 are as follows. The examples include organometallic iridium complexes having 4H-triazole skeletons, such as tris{2-[5-(2-methylphenyl)-4-(2,6-dimethylphenyl)-4H-1,2,4-triazol-3-yl-κN2]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), and tris[4-(3-biphenyl)-5-isopropyl-3-phenyl-4H-1,2,4-triazolato]iridium(III) (abbreviation: [Ir(iPrptz-3b)$_3$]); organometallic iridium complexes having 1H-triazole skeletons, such as tris[3-methyl-1-(2-methylphenyl)-5-phenyl-1H-1,2,4-triazolato]iridium(III) (abbreviation: [Ir(Mptz1-mp)$_3$]) and tris(1-methyl-5-phenyl-3-propyl-1H-1,2,4-triazolato)iridium(III) (abbreviation: [Ir(Prptz1-Me)$_3$]); organometallic iridium complexes having imidazole skeletons, such as fac-tris[1-(2,6-diisopropylphenyl)-2-phenyl-1H-imidazole]iridium(III) (abbreviation: [Ir(iPrpmi)$_3$]) and tris[3-(2,6-dimethylphenyl)-7-methylimidazo[1,2-f]phenanthridinato]iridium(III) (abbreviation: [Ir(dmpimpt-Me)$_3$]); and organometallic iridium complexes in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: [Ir(CF$_3$ppy)$_2$(pic)]), and bis[2-(4',6'-difluorophenyl)pyridinato-N,C$^{2'}$]iridium(III) acetylacetonate (abbreviation: FIr(acac)). These are compounds emitting blue phosphorescence and have an emission peak at 440 nm to 520 nm.

Other examples include organometallic iridium complexes having pyrimidine skeletons, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[6-(2-norbornyl)-4-phenylpyrimidinato]iridium(III) (abbreviation: [Ir(nbppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), and (acetylacetonato)bis(4,6-diphenylpyrimidinato)iridium(III) (abbreviation: [Ir(dppm)$_2$(acac)]); organometallic iridium complexes having pyrazine skeletons, such as (acetylacetonato)bis(3,5-dimethyl-2-phenylpyrazinato)iridium(III) (abbreviation: [Ir(mppr-Me)$_2$(acac)]) and (acetylacetonato)bis(5-isopropyl-3-methyl-2-phenylpyrazinato)iridium(III) (abbreviation: [Ir(mppr-iPr)$_2$(acac)]); organometallic iridium complexes having pyridine skeletons, such as tris(2-phenylpyridinato-N,C$^{2'}$)iridium(III) (abbreviation: [Ir(ppy)$_3$]), bis(2-phenylpyridinato-N,C$^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,C$^{2'}$)iridium(III) (abbreviation: [Ir(pq)$_3$]), and bis(2-phenylquinolinato-N,C$^{2'}$)iridium(III) acetylacetonate (abbreviation: [Ir(pq)$_2$(acac)]); and rare earth metal complexes such as tris(acetylacetonato)(monophenanthroline)terbium(III) (abbreviation: [Tb(acac)$_3$(Phen)]). These are mainly compounds emitting green phosphorescence and have an emission peak at 500 nm to 600 nm. Note that organometallic iridium complexes having pyrimidine skeletons have distinctively high reliability and emission efficiency and thus are especially preferable.

Other examples include organometallic iridium complexes having pyrimidine skeletons, such as (diisobutyrylmethanato)bis[4,6-bis(3-methylphenyl)pyrimidinato]iridium(III) (abbreviation: [Ir(5mdppm)$_2$(dibm)]), bis[4,6-bis(3-methylphenyl)pyrimidinato](dipivaloylmethanato)iridium(III) (abbreviation: [Ir(5mdppm)$_2$(dpm)]), and bis[4,6-di(naphthalen-1-yl)pyrimidinato](dipivaloylmethanato)iridium(III) (abbreviation: [Ir(d1npm)$_2$(dpm)]); organometallic iridium complexes having pyrazine skeletons, such as (acetylacetonato)bis(2,3,5-triphenylpyrazinato)iridium(III) (abbreviation: [Ir(tppr)$_2$(acac)]), bis(2,3,5-triphenylpyrazinato) (dipivaloylmethanato)iridium(III) (abbreviation: [Ir(tppr)$_2$(dpm)]), and (acetylacetonato)bis[2,3-bis(4-fluorophenyl)quinoxalinato]iridium(III) (abbreviation: [Ir(Fdpq)$_2$(acac)]); organometallic iridium complexes having pyridine skeletons, such as tris(1-phenylisoquinolinato-N,C$^{2'}$)iridium(III) (abbreviation: [Ir(piq)$_3$]) and bis(1-phenylisoquinolinato-N,C$^{2'}$)iridium(III) acetylacetonate (abbreviation: [Ir(piq)$_2$(acac)]); platinum complexes such as 2,3,7,8,12,13,17,18-octaethyl-21H,23H-porphyrin platinum (II) (abbreviation: PtOEP); and rare earth metal complexes such as tris(1,3-diphenyl-1,3-propanedionato) (monophenanthroline)europium(III) (abbreviation: [Eu(DBM)$_3$(Phen)]) and tris[1-(2-thenoyl)-3,3,3-trifluoroacetonato]

(monophenanthroline)europium(III) (abbreviation: [Eu(TTA)₃(Phen)]). These are compounds emitting red phosphorescence and have an emission peak at 600 nm to 700 nm. Further, organometallic iridium complexes having pyrazine skeletons can provide red light emission with favorable chromaticity.

As well as the above phosphorescent compounds, a variety of phosphorescent substances may be selected and used.

Examples of the TADF material include a fullerene, a derivative thereof, an acridine derivative such as proflavine, eosin, or the like, and a metal-containing porphyrin such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (SnF₂(Proto IX)), a mesoporphyrin-tin fluoride complex (SnF₂(Meso IX)), a hematoporphyrin-tin fluoride complex (SnF₂(Hemato IX)), a coproporphyrin tetramethyl ester-tin fluoride complex (SnF₂(Copro III-4Me)), an octaethylporphyrin-tin fluoride complex (SnF₂(OEP)), an etioporphyrin-tin fluoride complex (SnF₂(Etio I)), and an octaethylporphyrin-platinum chloride complex (PtCl₂(OEP)), which are shown in the following structural formulae.

[Chemical Formulae 5]

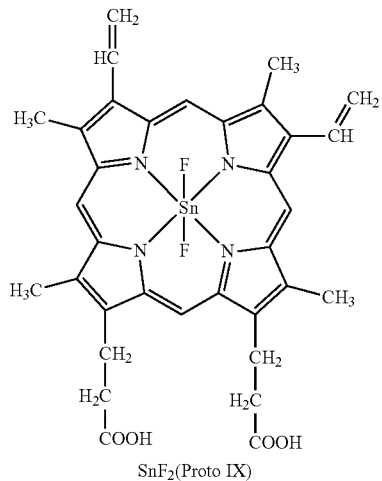

SnF₂(Proto IX)

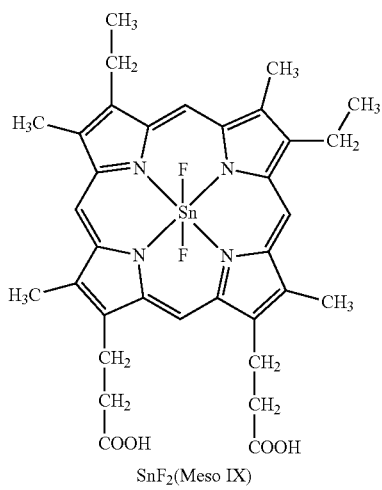

SnF₂(Meso IX)

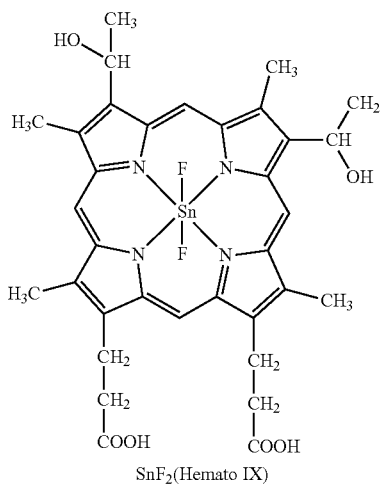

SnF₂(Hemato IX)

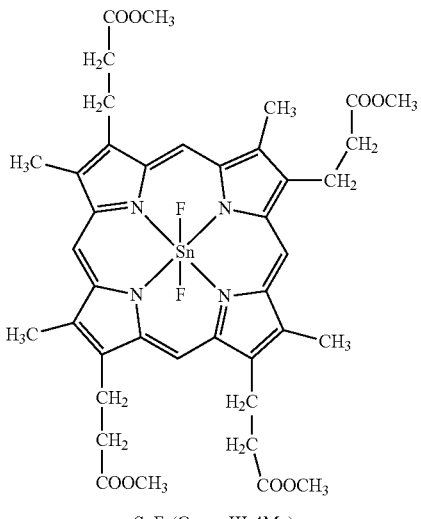

SnF₂(Copro III-4Me)

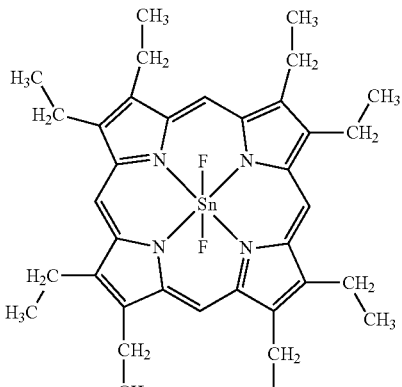

SnF₂(OEP)

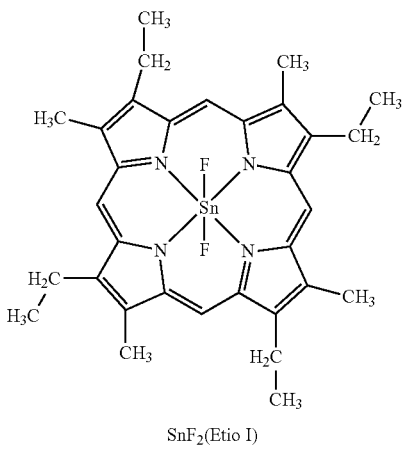

SnF₂(Etio I)

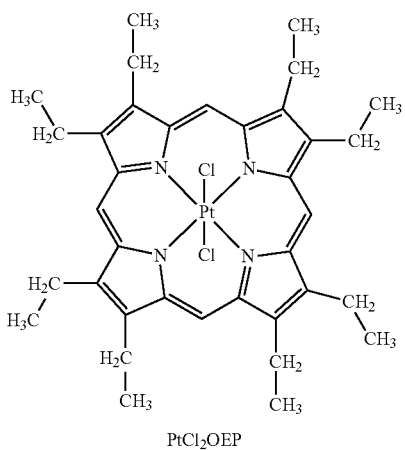

PtCl₂OEP

Alternatively, a heterocyclic compound having a π-electron rich heteroaromatic ring and a π-electron deficient heteroaromatic ring, such as 2-(biphenyl-4-yl)-4,6-bis(12-phenylindolo[2,3-a]carbazol-11-yl)-1,3,5-triazine (abbreviation: PIC-TRZ) shown in the following structural formula, can be used. The heterocyclic compound is preferably used because of the π-electron rich heteroaromatic ring and the π-electron deficient heteroaromatic ring, for which the electron-transport property and the hole-transport property are high. Note that a substance in which the π-electron rich heteroaromatic ring is directly bonded to the π-electron deficient heteroaromatic ring is particularly preferably used because the donor property of the π-electron rich heteroaromatic ring and the acceptor property of the π-electron deficient heteroaromatic ring are both high and the energy difference between the $S_1$ level and the $T_1$ level becomes small.

[Chemical Formula 6]

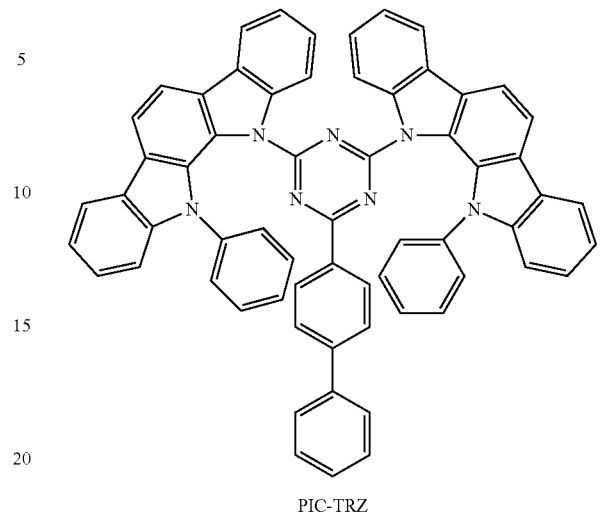

PIC-TRZ

In the case where a fluorescent light-emitting substance is used as a host material in the light-emitting layer, a material having an anthracene skeleton is preferred such as 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthryl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), and 9-phenyl-10-{4-(9-phenyl-9H-fluoren-9-yl)biphenyl-4'-yl}anthracene (abbreviation: FLPPA). The use of a substance having an anthracene skeleton as the fluorescent host material enables a light-emitting layer that has high emission efficiency and durability to be provided. In particular, CzPA, cgDBCzPA, 2mBnfPPA, and PCzPA are preferable because of their excellent characteristics.

In the case where a material other than the above-mentioned materials is used as a host material, various carrier-transport materials, such as an organic compound having an electron-transport property or an organic compound having a hole-transport property, can be used.

Examples of the organic compound having an electron-transport property are a metal complex such as bis(10-hydroxybenzo[h]quinolinato)beryllium(II) (abbreviation: BeBq₂), bis(2-methyl-8-quinolinolato) (4-phenylphenolato) aluminum(III) (abbreviation: BAlq), bis(8-quinolinolato) zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); a heterocyclic compound having a polyazole skeleton such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl) phenyl]-9H-carbazole (abbreviation: CO11), 2,2',2''-(1,3,5-benzenetriyl)tris(1-phenyl-1H-benzimidazole) (abbreviation: TPBI), or 2-[3-(dibenzothiophen-4-yl)phenyl]-1-phenyl-1H-benzimidazole (abbreviation: mDBT-BIm-II); a heterocyclic compound having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), or 4,6-bis[3-(4-dibenzothienyl)phenyl]pyrimidine (abbreviation: 4,6mDBTP2Pm-II); and a heterocyclic compound having a pyridine skeleton, such as 2-[3'-(dibenzothiophen-4-yl)biphenyl-3-yl]dibenzo[f,h]quinoline (abbreviation: 2mDBTPDBQu-II), 3,5-bis[3-(9H-carbazol-9-yl)phenyl]pyridine (abbreviation: 35DCzPPy), or 1,3,5-tri[3-(3-pyridyl)phenyl]benzene (abbreviation: TmPyPB). Among the above materials, a heterocyclic compound having a diazine skeleton and a heterocyclic compound having a pyridine skeleton have high reliability and are thus preferable. Specifically, a heterocyclic compound having a diazine (pyrimidine or pyrazine) skeleton has a high electron-transport property to contribute to a reduction in drive voltage. The organic compound having an electron-transport property is an organic compound with higher electron mobility than hole mobility, preferably a material with electron mobility of $10^{-6}$ cm$^2$/Vs or more.

Examples of the organic compound having a hole-transport property are a compound having an aromatic amine skeleton, such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), or N-phenyl-N-[4-(9-phenyl-9H-carbazol-3-yl)phenyl]spiro-9,9'-bifluoren-2-amine (abbreviation: PCBASF); a compound having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP); a compound having a thiophene skeleton such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV); and a compound having a furan skeleton, such as 4,4',4"-(benzene-1,3,5-triyl)tri(dibenzofuran) (abbreviation: DBF3P-II) or 4-{3-[3-(9-phenyl-9H-fluoren-9-yl)phenyl]pheny}dibenzofuran (abbreviation: mmDBFFLBi-II). The organic compound having a hole-transport property is an organic compound with higher hole mobility than electron mobility, preferably a material with hole mobility of $10^{-6}$ cm$^2$/Vs or more. Among the above materials, a compound having an aromatic amine skeleton and a compound having a carbazole skeleton are preferable because these compounds are highly reliable and have high hole-transport properties to contribute to a reduction in drive voltage. Hole-transport materials can be selected from a variety of substances as well as from the organic compounds having a hole-transport property given above.

Note that the host material may be a mixture of a plurality of kinds of substances, and in the case of using a mixed host material, it is preferable to mix a material having an electron-transport property with a material having a hole-transport property. By mixing the material having an electron-transport property with the material having a hole-transport property, the transport property of the light-emitting layer 113 can be easily adjusted and a recombination region can be easily controlled. The ratio of the content of the material having a hole-transport property to the content of the material having an electron-transport property may be 1:9 to 9:1.

These mixed materials may form an exciplex. When a combination of these materials is selected so as to form an exciplex that exhibits light emission whose wavelength overlaps the wavelength of a lowest-energy-side absorption band of the fluorescent substance, the phosphorescent substance, or the TADF material, energy is transferred smoothly and light emission can be obtained efficiently. Such a structure is preferable in that drive voltage can be reduced.

Halogen-substituted products of organic compounds adversely affect the lifetime of the light-emitting element when the organic compounds in the light-emitting layer contain a large amount of halogen-substituted products. Thus, the amount of chlorine-substituted products of the organic compounds contained in the light-emitting layer is preferably less than or equal to 30 ppm, more preferably less than or equal to 10 ppm.

The light-emitting layer 113 having the above-described structure can be formed by co-evaporation by a vacuum evaporation method, or an inkjet method, a spin coating method, a dip coating method, or the like using a solution of the materials.

The electron transport layer 114 is a layer containing an organic compound having an electron-transport property. For the organic compound having an electron-transport property, the organic compounds having an electron-transport property or having an anthracene skeleton, which are described above as materials for the host material, can be used.

The electron-injection layer 115 may be provided in contact with the second electrode 102, between the electron-transport layer 114 and the second electrode 102. For the electron-injection layer 115, an alkali metal, an alkaline earth metal, or a compound thereof such as lithium fluoride (LiF), cesium fluoride (CsF), or calcium fluoride (CaF$_2$) can be used in combination with a substance having an electron-transport property. For example, a layer that is formed using a substance having an electron-transport property and contains an alkali metal, an alkaline earth metal, or a compound thereof can be used. Examples of the substance having an electron-transport property include NBPhen, BPhen, and 2,2'-(pyridine-2,6-diyl)bis(4,6-diphenylpyrimidine) (abbreviation: 2,6(P2Pm)2Py). An electride may also be used for the electron-injection layer 115. Examples of the electride include a substance in which electrons are added at high concentration to calcium oxide-aluminum oxide. Note that a layer that is formed using a substance having an electron-transport property and contains an alkali metal or an alkaline earth metal is preferably used as the electron-injection layer 115, in which case electron injection from the second electrode 102 is efficiently performed.

A halogen liberated from a halogen-substituted product of the organic compound contained in the electron transport layer and the electron injection layer is moved toward the light-emitting layer by an electric field or the like. The amount of halogen-substituted products of the organic compound forming the electron transport layer and the electron injection layer is preferably less than or equal to 30 ppm. The increase in the amount of halogen-substituted products in the light-emitting layer due to a released or moved halogen promotes luminance decay. That is, a light-emitting element in which the amount of halogen-substituted products in the light-emitting layer is not increased is a long-lifetime light-emitting element in which luminance decay is suppressed.

The above-described structure is preferable because a long-lifetime light-emitting element can be obtained in the case where the organic compound is a material in which energy for releasing a halogen by reception of an electron, particularly a material in which energy for releasing a halogen from a halogen-substituted product of the organic compound in a radical anion state is less than or equal to 1.00 eV. Note that the above-described structure is much preferable because the effect is increased in the case where the organic compound is a material in which energy for releasing a halogen from a halogen-substituted product of the organic compound is less than or equal to 0.87 eV.

For the second electrode 102, any of metals, alloys, electrically conductive compounds, and mixtures thereof which have a low work function (specifically, a work function of 3.8 eV or less) or the like can be used. Specific examples of such a cathode material are elements belonging to Groups 1 and 2 of the periodic table, such as alkali metals (e.g., lithium (Li) and cesium (Cs)), magnesium (Mg), calcium (Ca), and strontium (Sr), alloys thereof (e.g., MgAg and AlLi), rare earth metals such as europium (Eu) and ytterbium (Yb), and alloys thereof. However, when the electron-injection layer is provided between the second electrode 102 and the electron-transport layer, for the second electrode 102, any of a variety of conductive materials such as Al, Ag, ITO, or indium oxide-tin oxide containing silicon or silicon oxide can be used regardless of the work function. These conductive materials can be deposited by a sputtering method, an ink jet method, a spin coating method, or the like.

Any of a variety of methods can be used to form the EL layer 103 regardless whether it is a dry process or a wet process. For example, a vacuum evaporation method, an ink jet method, or a spin coating method may be employed. A different formation method may be employed for each electrode or each layer.

The electrode may be formed by a wet method using a sol-gel method, or by a wet method using paste of a metal material. Alternatively, the electrode may be formed by a dry method such as a sputtering method or a vacuum evaporation method.

Light emission from the light-emitting element is extracted out through one or both of the first electrode 101 and the second electrode 102. Therefore, one or both of the first electrode 101 and the second electrode 102 are light-transmitting electrodes.

Next, one mode a light-emitting element with a structure in which a plurality of light-emitting units are stacked (hereinafter also referred to as a stacked-type element) is described with reference to FIG. 1B. In this light-emitting element, a plurality of light-emitting units are provided between a pair of electrodes, a first electrode and a second electrode. One light-emitting unit has a structure similar to that of the EL layer 103, which is illustrated in FIG. 1A. In other words, the light-emitting element illustrated in FIG. 1A includes a single light-emitting unit; the light-emitting element illustrated in FIG. 1B includes a plurality of light-emitting units.

Figure 1B:
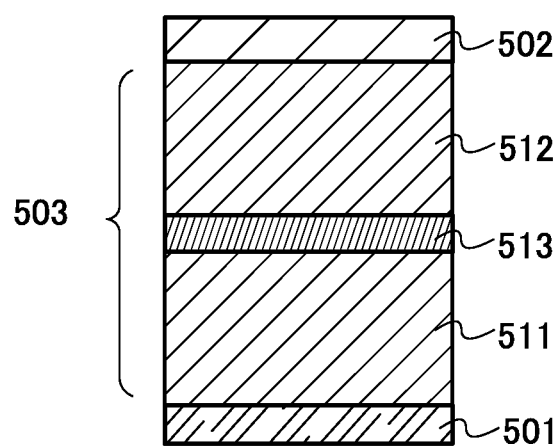

In FIG. 1B, an EL layer 503 including a stack of a first light-emitting unit 511, a charge-generation layer 513, and a second light-emitting unit 512 is provided between a first electrode 501 and a second electrode 502. The first electrode 501 and the second electrode 502 correspond, respectively, to the first electrode 101 and the second electrode 102 illustrated in FIG. 1A, and can be formed using the materials given in the description for FIG. 1A. Furthermore, the first light-emitting unit 511 and the second light-emitting unit 512 may have the same structure or different structures.

The charge-generation layer 513 preferably contains a composite material of an organic compound and a metal oxide. As this composite material of an organic compound and a metal oxide, the composite material that can be used for the hole-injection layer 111 illustrated in FIG. 1A can be used. Since the composite material of an organic compound and a metal oxide is superior in carrier-injection property and carrier-transport property, low-voltage driving or low-current driving can be realized. Note that when a surface of a light-emitting unit on the anode side is in contact with the charge-generation layer, the charge-generation layer can also serve as a hole-injection layer of the light-emitting unit; thus, a hole-injection layer does not need to be formed in the light-emitting unit.

Note that the charge-generation layer 513 may be formed by stacking a layer containing the above composite material and a layer containing another material. For example, a layer containing the above composite material and a layer containing a compound with a high electron-transport property and a compound selected from the substances with an electron donating property may be stacked. Alternatively, a layer containing a composite material of an organic compound and a metal oxide and a transparent conductive film may be stacked.

An electron-injection buffer layer may be provided between the charge-generation layer 513 and the light-emitting unit on the anode side of the charge-generation layer. The electron-injection buffer layer is a stack of a very thin alkali metal film and an electron-relay layer containing a substance with an electron-transport property. The very thin alkali metal film corresponds to the electron-injection layer 115 and has a function of lowering an electron injection barrier. The electron-relay layer has a function of preventing an interaction between the alkali metal film and the charge-generation layer 513 and smoothly transferring electrons.

The substance with an electron-transport property which is contained in the electron-relay layer is selected such that the LUMO of the substance is between the LUMO of an substance having an acceptor property in the charge-generation layer 513 and the LUMO of a substance contained in a layer in contact with the electron-injection buffer layer in the light-emitting unit on the anode side. As a specific value of the energy level, the LUMO of the substance having an electron-transport property which is contained in the electron-relay layer is preferably greater than or equal to −5.0 eV, more preferably greater than or equal to −5.0 eV and less than or equal to −3.0 eV. Note that as the substance having an electron-transport property which is contained in the electron-relay layer, a metal complex having a metal-oxygen bond and an aromatic ligand or a phthalocyanine-based material is preferably used. In the case where the electron-injection buffer layer is provided, the very thin alkali metal film of the electron-injection buffer layer serves as the electron-injection layer in the light-emitting unit on the anode side; thus, the electron-injection layer does not need to be formed over the light-emitting unit.

The charge-generation layer 513 provided between the first light-emitting unit 511 and the second light-emitting unit 512 may have any structure as long as electrons can be injected to a light-emitting unit on one side and holes can be injected to a light-emitting unit on the other side when a voltage is applied between the first electrode 501 and the second electrode 502. For example, in FIG. 1B, any layer can be used as the charge-generation layer 513 as long as the layer injects electrons into the first light-emitting unit 511 and holes into the second light-emitting unit 512 when a voltage is applied such that the potential of the first electrode is higher than that of the second electrode.

The light-emitting element having two light-emitting units is described with reference to FIG. 1B; however, the present invention can be similarly applied to a light-emitting element in which three or more light-emitting units are stacked. With a plurality of light-emitting units partitioned by the charge-generation layer between a pair of electrodes, it is possible to provide an element which can emit light with high luminance with the current density kept low and has a long lifetime. A light-emitting device that can be driven at a low voltage and has low power consumption can be realized.

Furthermore, when emission colors of the light-emitting units are made different, light emission having a desired color tone can be obtained from the light-emitting element as a whole. For example, it is easy to enable a light-emitting element having two light-emitting units to emit white light as the whole element when the emission colors of the first light-emitting unit are red and green and the emission color of the second light-emitting unit is blue.

<<Micro Optical Resonator (Microcavity) Structure>>

A light-emitting element with a microcavity structure is formed with the use of a reflective electrode and a semi-transmissive and semi-reflective electrode as the pair of electrodes. The reflective electrode and the semi-transmissive and semi-reflective electrode correspond to the first electrode and the second electrode described above. The light-emitting element with a microcavity structure includes at least an EL layer between the reflective electrode and the semi-transmissive and semi-reflective electrode. The EL layer includes at least a light-emitting layer serving as a light-emitting region.

Light emitted from the light-emitting layer included in the EL layer is reflected and resonated by the reflective electrode and the semi-transmissive and semi-reflective electrode. Note that the reflective electrode is formed using a conductive material having reflectivity and has a visible light reflectivity of 40% to 100%, preferably 70% to 100% and a resistivity of $1 \times 10^{-2}$ Ωcm or lower. In addition, the semi-transmissive and semi-reflective electrode is formed using a conductive material having reflectivity and a light-transmitting property and has a visible light reflectivity of 20% to 80%, preferably 40% to 70%, and a resistivity of $1 \times 10^{-2}$ Ωcm or lower.

In the light-emitting element, by changing thicknesses of the transparent conductive film, the composite material, the carrier-transport material, and the like, the optical path length between the reflective electrode and the semi-transmissive and semi-reflective electrode can be changed. Thus, light with a wavelength that is resonated between the reflective electrode and the semi-transmissive and semi-reflective electrode can be intensified while light with a wavelength that is not resonated therebetween can be attenuated.

Note that light that is emitted from the light-emitting layer and reflected back by the reflective electrode (first reflected light) considerably interferes with light that directly enters the semi-transmissive and semi-reflective electrode from the light-emitting layer (first incident light). For this reason, the optical path length between the reflective electrode and the light-emitting layer is preferably adjusted to $(2n-1)\lambda/4$ (n is a natural number of 1 or larger and $\lambda$ is a wavelength of color to be amplified). In that case, the phases of the first reflected light and the first incident light can be aligned with each other and the light emitted from the light-emitting layer can be further amplified.

Note that in the above structure, the EL layer may be formed of light-emitting layers or may be a single light-emitting layer. The tandem light-emitting element described above may be combined with the EL layers; for example, a light-emitting element may have a structure in which a plurality of EL layers is provided, a charge-generation layer is provided between the EL layers, and each EL layer is formed of light-emitting layers or a single light-emitting layer.

<<Light-Emitting Device>>

A light-emitting device of one embodiment of the present invention is described with reference to FIGS. 2A and 2B. Note that FIG. 2A is a top view illustrating the light-emitting device and FIG. 2B is a cross-sectional view taken along the lines A-B and C-D in FIG. 2A. This light-emitting device includes a driver circuit portion (source line driver circuit) 601, a pixel portion 602, and a driver circuit portion (gate line driver circuit) 603, which control light emission of the light-emitting element and are denoted by dotted lines. A reference numeral 604 denotes a sealing substrate; 605, a sealant; and 607, a space surrounded by the sealant 605.

Note that a lead wiring 608 is a wiring for transmitting signals to be input to the source line driver circuit 601 and the gate line driver circuit 603 and for receiving a video signal, a clock signal, a start signal, a reset signal, and the like from an FPC (flexible printed circuit) 609 serving as an external input terminal. Although only the FPC is illustrated here, a printed wiring board (PWB) may be attached to the FPC. The light-emitting device in the present specification includes, in its category, not only the light-emitting device itself but also the light-emitting device provided with the FPC or the PWB.

Next, a cross-sectional structure is described with reference to FIG. 2B. The driver circuit portion and the pixel portion are formed over an element substrate 610. The source line driver circuit 601, which is a driver circuit portion, and one of the pixels in the pixel portion 602 are illustrated here.

In the source line driver circuit 601, a CMOS circuit is formed in which an n-channel FET 623 and a p-channel FET 624 are combined. In addition, the driver circuit may be formed with any of a variety of circuits such as a CMOS circuit, a PMOS circuit, and an NMOS circuit. Although a driver-integrated type in which a driver circuit is formed over a substrate is described in this embodiment, one embodiment of the present invention is not limited to this type, and the driver circuit can be formed outside the substrate.

The pixel portion 602 includes a plurality of pixels including a switching FET 611, a current controlling FET 612, and a first electrode 613 electrically connected to a drain of the current controlling FET 612. One embodiment of the present invention is not limited to the structure. The pixel portion 602 may include three or more FETs and a capacitor in combination.

The kind and crystallinity of a semiconductor used for the FETs is not particularly limited; an amorphous semiconductor or a crystalline semiconductor may be used. Examples of the semiconductor used for the FETs include Group 13 semiconductors (e.g., gallium), Group 14 semiconductors (e.g., silicon), compound semiconductors (including oxide semiconductors), and organic semiconductors. Oxide semiconductors are particularly preferable. Examples of the oxide semiconductor include an In—Ga oxide and an In-M-Zn oxide (M is Al, Ga, Y, Zr, La, Ce, or Nd). Note that an oxide semiconductor that has an energy gap of 2 eV or more, preferably 2.5 eV or more, further preferably 3 eV or more is preferably used, in which case the off-state current of the transistors can be reduced.

An insulator 614 is formed to cover end portions of the first electrode 613. In this embodiment, the insulator 614 is formed using a positive photosensitive acrylic resin film.

In order to improve the coverage, the insulator 614 preferably has a curved surface with curvature at an upper end portion or a lower end portion thereof. For example, in the case where a positive photosensitive acrylic resin is used for a material of the insulator 614, only the upper end portion of the insulator 614 preferably has a surface with a curvature radius (0.2 µm to 3 µm). As the insulator 614, either a negative photosensitive resin or a positive photosensitive resin can be used.

An EL layer 616 and a second electrode 617 are formed over the first electrode 613. The first electrode 613, the EL layer 616, and the second electrode 617 correspond, respectively, to the first electrode 101, the EL layer 103, and the second electrode 102 in FIG. 1A or to the first electrode 501, the EL layer 503, and the second electrode 502 in FIG. 1B.

The sealing substrate 604 is attached to the element substrate 610 with the sealant 605, so that the light-emitting element 618 is provided in the space 607 surrounded by the element substrate 610, the sealing substrate 604, and the sealant 605. The space 607 may be filled with filler, and may be filled with an inert gas (such as nitrogen or argon), or the sealant 605. It is preferable that the sealing substrate be provided with a recessed portion and a drying agent be provided in the recessed portion, in which case deterioration due to influence of moisture can be suppressed.

An epoxy-based resin or glass frit is preferably used for the sealant 605. It is preferable that such a material not transmit moisture or oxygen as much as possible. As the element substrate 610 and the sealing substrate 604, a glass substrate, a quartz substrate, or a plastic substrate formed of fiber reinforced plastic (FRP), poly(vinyl fluoride) (PVF), polyester, acrylic, or the like can be used.

Note that in this specification and the like, a transistor or a light-emitting element can be formed using any of a variety of substrates, for example. The type of a substrate is not limited to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. As an example of a glass substrate, a barium borosilicate glass substrate, an aluminoborosilicate glass substrate, a soda lime glass substrate, or the like can be given. Examples of the flexible substrate, the attachment film, the base material film, and the like are substrates of plastics typified by polyethylene terephthalate (PET), polyethylene naphthalate (PEN), and polyether sulfone (PES). Another example is a synthetic resin such as acrylic. Alternatively, polytetrafluoroethylene (PTFE), polypropylene, polyester, polyvinyl fluoride, polyvinyl chloride, or the like can be used. Alternatively, polyamide, polyimide, aramid, epoxy, an inorganic vapor deposition film, paper, or the like can be used. Specifically, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

Alternatively, a flexible substrate may be used as the substrate, and the transistor or the light-emitting element may be provided directly on the flexible substrate. Still alternatively, a separation layer may be provided between the substrate and the transistor or the substrate and the light-emitting element. The separation layer can be used when part or the whole of a semiconductor device formed over the separation layer is separated from the substrate and transferred onto another substrate. In such a case, the transistor can be transferred to a substrate having low heat resistance or a flexible substrate. For the separation layer, a stack including inorganic films, which are a tungsten film and a silicon oxide film, or an organic resin film of polyimide or the like formed over a substrate can be used, for example.

In other words, a transistor or a light-emitting element may be formed using one substrate, and then transferred to another substrate. Examples of a substrate to which a transistor or a light-emitting element is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, and a rubber substrate. When such a substrate is used, a transistor with excellent characteristics or a transistor with low power consumption can be formed, a device with high durability or high heat resistance can be provided, or reduction in weight or thickness can be achieved.

FIGS. 3A and 3B each illustrate an example of a light-emitting device in which full color display is achieved by forming a light-emitting element exhibiting white light emission and providing a coloring layer (a color filter) and the like. In FIG. 3A, a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 1024G, and 1024B of light-emitting elements, a partition wall 1025, an EL layer 1028, a second electrode 1029 of the light-emitting elements, a sealing substrate 1031, a sealant 1032, and the like are illustrated.

In FIG. 3A, coloring layers (a red coloring layer 1034R, a green coloring layer 1034G, and a blue coloring layer 1034B) are provided on a transparent base material 1033. A black layer (a black matrix) 1035 may be additionally provided. The transparent base material 1033 provided with the coloring layers and the black layer is positioned and fixed to the substrate 1001. Note that the coloring layers and the black layer are covered with an overcoat layer 1036. In FIG. 3A, light emitted from part of the light-emitting layer does not pass through the coloring layers, while light emitted from the other part of the light-emitting layer passes through the coloring layers. Since light that does not pass through the coloring layers is white and light that passes through any one of the coloring layers is red, blue, or green, an image can be displayed using pixels of the four colors.

FIG. 3B illustrates an example in which the coloring layers (the red coloring layer 1034R, the green coloring layer 1034G, and the blue coloring layer 1034B) are provided between the gate insulating film 1003 and the first interlayer insulating film 1020. As shown in FIG. 3B, the coloring layers may be provided between the substrate 1001 and the sealing substrate 1031.

Figure 4:
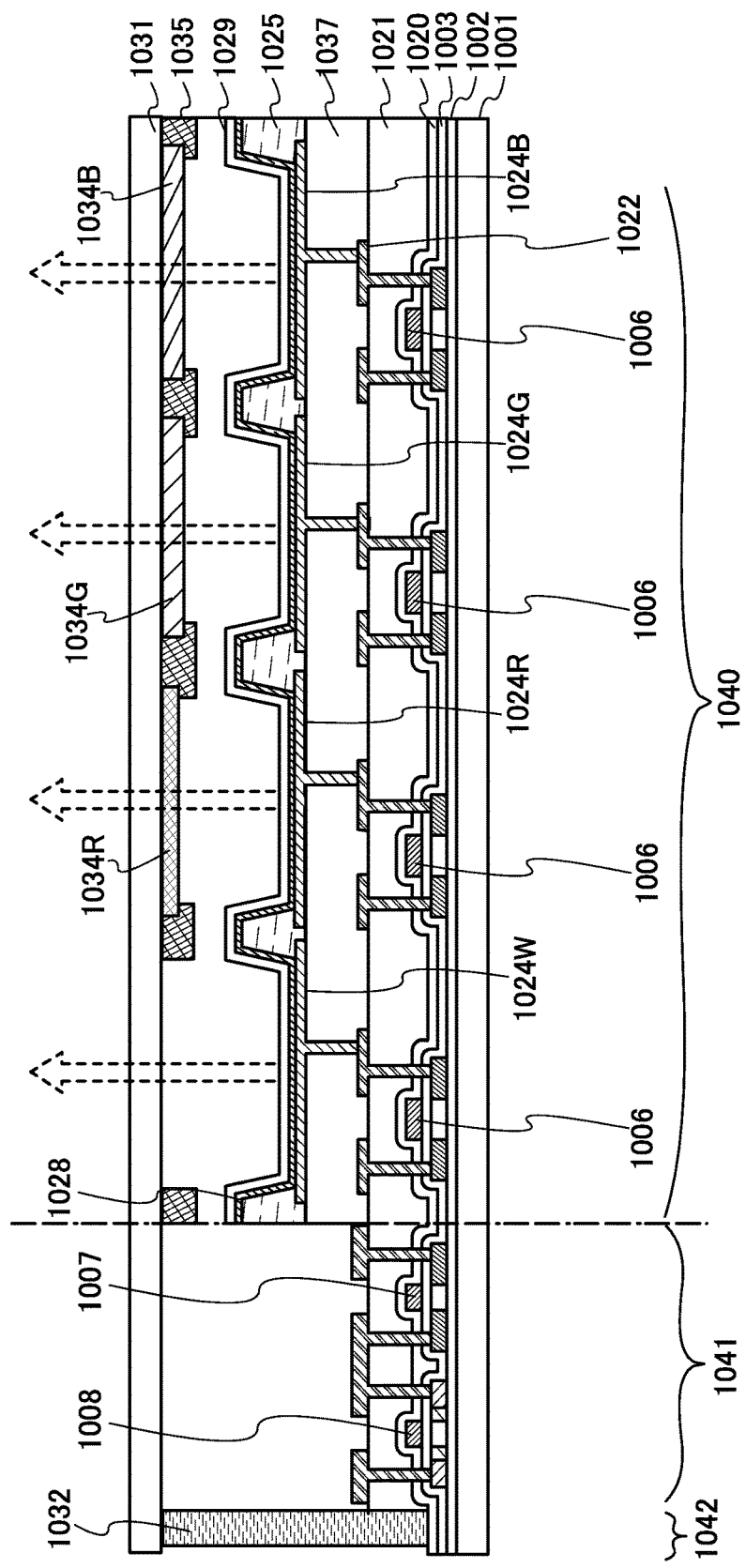
FIG. 4 is a conceptual diagram of an active matrix light-emitting device.

The above-described light-emitting device has a structure in which light is extracted from the substrate 1001 side where the FETs are formed (a bottom emission structure), but may have a structure in which light is extracted from the sealing substrate 1031 side (a top emission structure). FIG. 4 is a cross-sectional view of a light-emitting device having a top emission structure. In this case, a substrate that does not transmit light can be used as the substrate 1001. The process up to the step of forming of a connection electrode which connects the FET and the anode of the light-emitting element is performed in a manner similar to that of the light-emitting device having a bottom emission structure. Then, a third interlayer insulating film 1037 is formed to cover an electrode 1022. This insulating film may have a planarization function. The third interlayer insulating film 1037 can be formed using a material similar to that of the second interlayer insulating film, and can alternatively be formed using any other materials.

The first electrodes 1024W, 1024R, 1024G, and 1024B of the light-emitting elements each serve as an anode here, but may serve as a cathode. In the case of a light-emitting device having a top emission structure as illustrated in FIG. 4, the first electrodes are preferably reflective electrodes. The EL layer 1028 is formed to have a structure similar to the structure of the EL layer 103 illustrated in FIG. 1A or the EL layer 503 in FIG. 1B, with which white light emission can be obtained.

In the case of a top emission structure as illustrated in FIG. 4, sealing can be performed with the sealing substrate 1031 on which the coloring layers (the red coloring layer 1034R, the green coloring layer 1034G, and the blue coloring layer 1034B) are provided. The sealing substrate 1031 may be provided with the black layer (the black matrix) 1035 that is positioned between pixels. The coloring layers (the red coloring layer 1034R, the green coloring layer 1034G, and the blue coloring layer 1034B) and the black layer 1035 may be covered with an overcoat layer. Note that a light-transmitting substrate is used as the sealing substrate 1031.

Although an example in which full color display is performed using four colors of red, green, blue, and white is shown here, there is no particular limitation and full color display using three colors of red, green, and blue or four colors of red, green, blue, and yellow may be performed.

Figure 5A:
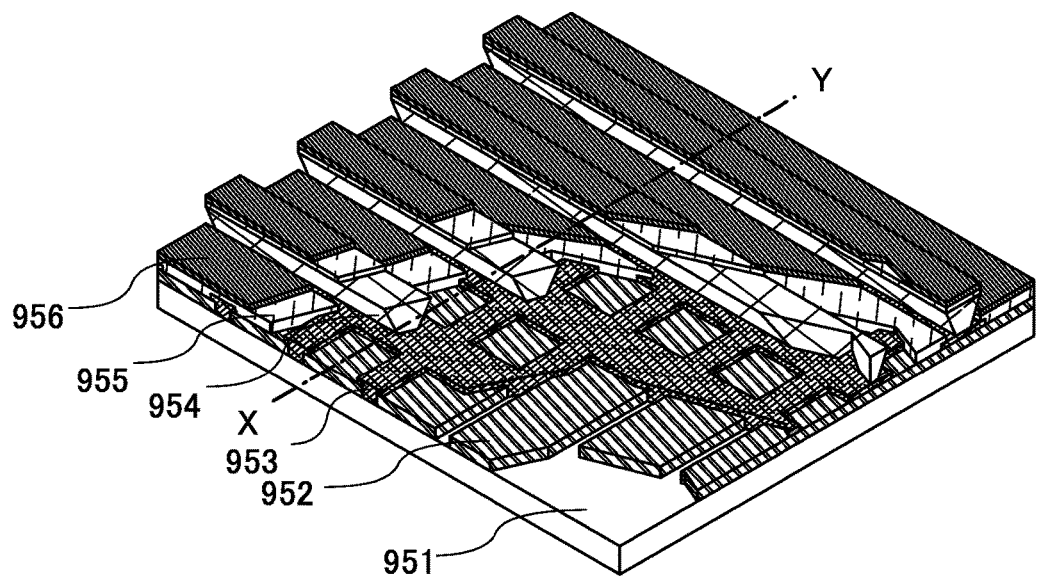
FIGS. 5A and 5B are conceptual diagrams of a passive matrix light-emitting device.
Figure 5B:
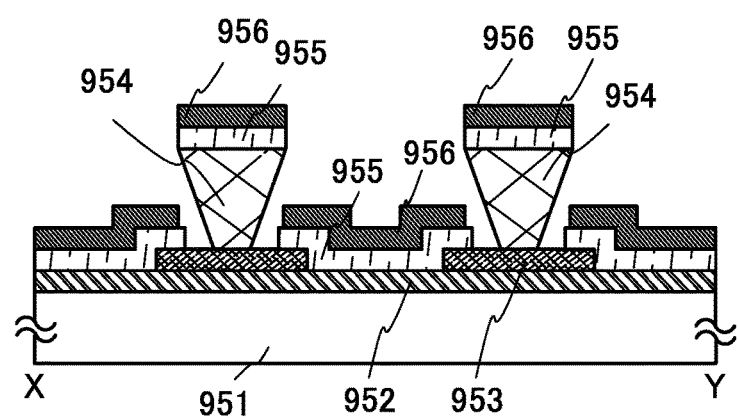

FIGS. 5A and 5B illustrate a passive matrix light-emitting device which is one embodiment of the present invention. FIG. 5A is a perspective view of the light-emitting device, and FIG. 5B is a cross-sectional view taken along the line X-Y in FIG. 5A. In FIGS. 5A and 5B, an EL layer 955 is provided between an electrode 952 and an electrode 956 over a substrate 951. An end portion of the electrode 952 is covered with an insulating layer 953. In addition, a partition layer 954 is provided over the insulating layer 953. The sidewalls of the partition layer 954 slope so that the distance between one sidewall and the other sidewall gradually decreases toward the surface of the substrate. In other words, a cross section taken along the direction of the short side of the partition layer 954 is trapezoidal, and the base (a side which is in the same direction as a plane direction of the insulating layer 953 and in contact with the insulating layer 953) is shorter than the upper side (a side which is in the same direction as the plane direction of the insulating layer 953 and not in contact with the insulating layer 953). By providing the partition layer 954 in such a manner, a defect of the light-emitting element due to static electricity or the like can be prevented.

Since many minute light-emitting elements arranged in a matrix can each be controlled with the FETs formed in the pixel portion, the above-described light-emitting device can be suitably used as a display device for displaying images.

<<Lighting Device>>

Figure 6A:
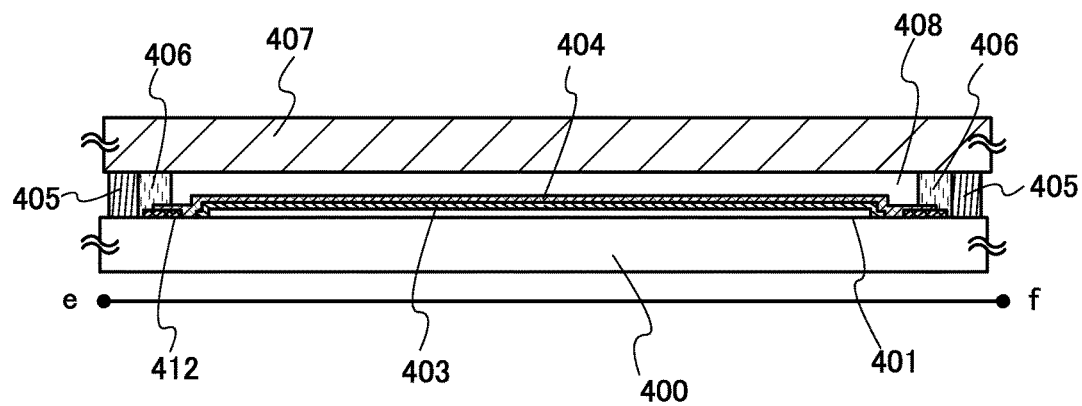
FIGS. 6A and 6B illustrate a lighting device.
Figure 6B:
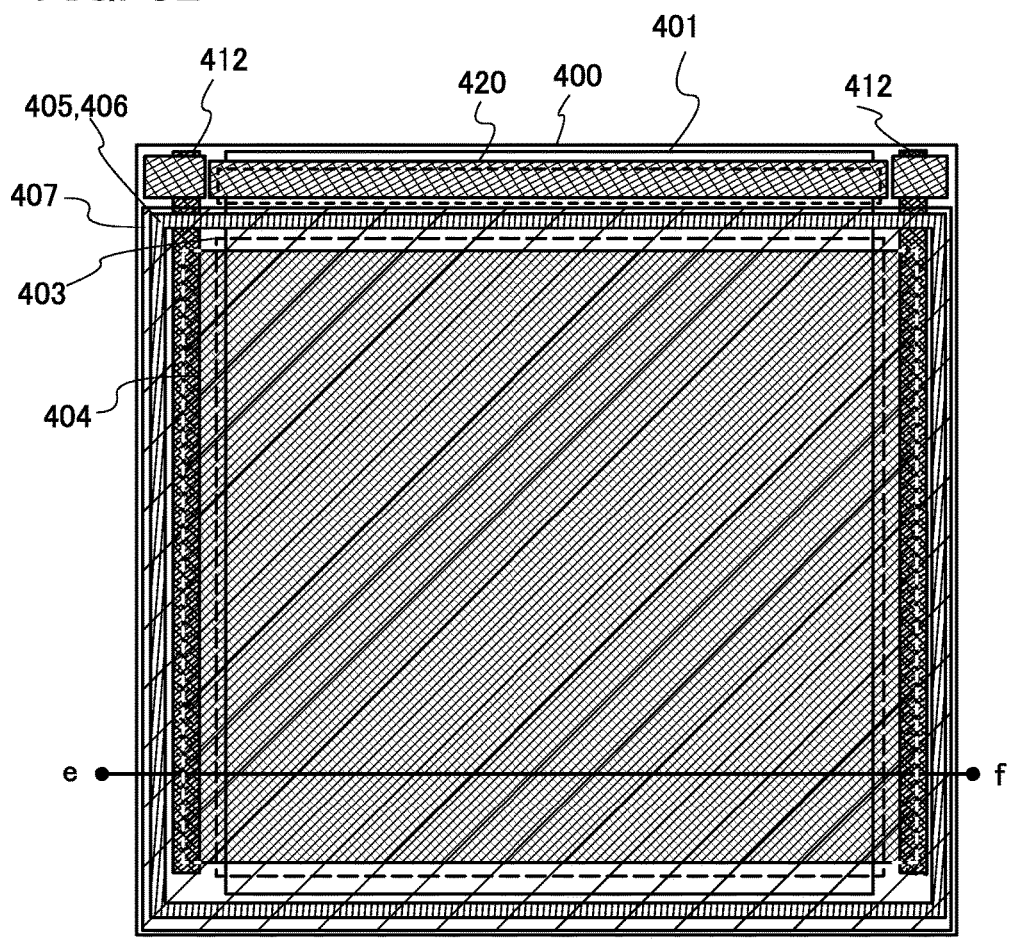

A lighting device which is one embodiment of the present invention is described with reference to FIGS. 6A and 6B. FIG. 6B is a top view of the lighting device, and FIG. 6A is a cross-sectional view of FIG. 6B taken along line e-f.

In the lighting device, a first electrode 401 is formed over a substrate 400 which is a support and has a light-transmitting property. The first electrode 401 corresponds to the first electrode 101 in FIGS. 1A and 1B. When light is extracted through the first electrode 401 side, the first electrode 401 is formed using a material having a light-transmitting property.

A pad 412 for applying a voltage to a second electrode 404 is provided over the substrate 400.

An EL layer 403 is formed over the first electrode 401. The EL layer 403 corresponds to, for example, the EL layer 103 in FIG. 1A or the EL layer 503 in FIG. 1B. Refer to the descriptions for the structure.

The second electrode 404 is formed to cover the EL layer 403. The second electrode 404 corresponds to the second electrode 102 in FIG. 1A. The second electrode 404 contains a material having high reflectivity when light is extracted through the first electrode 401 side. The second electrode 404 is connected to the pad 412, whereby a voltage is applied.

A light-emitting element is formed with the first electrode 401, the EL layer 403, and the second electrode 404. The light-emitting element is fixed to a sealing substrate 407 with sealing materials 405 and 406 and sealing is performed, whereby the lighting device is completed. It is possible to use only either the sealing material 405 or the sealing material 406. In addition, the inner sealing material 406 (not shown in FIG. 6B) can be mixed with a desiccant, whereby moisture is adsorbed and the reliability is increased.

When parts of the pad 412 and the first electrode 401 are extended to the outside of the sealants 405 and 406, the extended parts can serve as external input terminals. An IC chip 420 mounted with a converter or the like may be provided over the external input terminals.

<<Electronic Device>>

Examples of an electronic device which is one embodiment of the present invention are described. Examples of the electronic device are television devices (also referred to as TV or television receivers), monitors for computers and the like, cameras such as digital cameras and digital video cameras, digital photo frames, mobile phones (also referred to as cell phones or mobile phone devices), portable game machines, portable information terminals, audio playback devices, and large game machines such as pachinko machines. Specific examples of these electronic devices are given below.

FIG. 7A illustrates an example of a television device. In the television device, a display portion 7103 is incorporated in a housing 7101. In addition, here, the housing 7101 is supported by a stand 7105. Images can be displayed on the display portion 7103 where the light-emitting elements are arranged in a matrix.

The television device can be operated with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device is provided with a receiver, a modem, and the like. With the receiver, general television broadcasts can be received. Moreover, when the display device is connected to a communication network with or without wires via the modem, one-way (from a sender to a receiver) or two-way (between a sender and a receiver or between receivers) data communication can be performed.

FIG. 7B1 illustrates a computer that includes a main body 7201, a housing 7202, a display portion 7203, a keyboard 7204, an external connection port 7205, a pointing device 7206, and the like. Note that this computer is manufactured by using light-emitting elements arranged in a matrix in the display portion 7203. The computer illustrated in FIG. 7B 1 may have a structure illustrated in FIG. 7B2. A computer illustrated in FIG. 7B2 is provided with a second display portion 7210 instead of the keyboard 7204 and the pointing device 7206. The second display portion 7210 is a touch screen, and input can be performed by operation of display for input on the second display portion 7210 with a finger or a dedicated pen. The second display portion 7210 can also display images other than the display for input. The display portion 7203 may also be a touchscreen. Connecting the two screens with a hinge can prevent troubles; for example, the screens can be prevented from being cracked or broken while the computer is being stored or carried.

FIG. 7C illustrates a portable game machine, which includes two housings, a housing 7301 and a housing 7302, which are connected with a joint portion 7303 so that the portable game machine can be opened or folded. The housing 7301 incorporates a display portion 7304 including light-emitting elements arranged in a matrix, and the housing 7302 incorporates a display portion 7305. In addition, the portable game machine illustrated in FIG. 7C includes a speaker portion 7306, a storage medium insertion portion 7307, an LED lamp 7308, an input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 7312), and the like. The structure of the portable game machine is not limited to the above structure, and the light-emitting device may be used for both the display portion 7304 and the display portion 7305. The portable game machine illustrated in FIG. 7C has a function of reading out a program or data stored in a storage medium to display it on the display portion, and a function of sharing information with another portable game machine by wireless communication. The portable game machine illustrated in FIG. 7C can have a variety of functions without limitation to the above.

FIGS. 7D1 and 7D2 illustrate an example of a portable information terminal. The portable information terminal is provided with a display portion 7402 incorporated in a housing 7401, operation buttons 7403, an external connection port 7404, a speaker 7405, a microphone 7406, and the like. Note that the portable information terminal has the display portion 7402 including light-emitting elements arranged in a matrix.

Information can be input to the portable information terminal illustrated in FIGS. 7D1 and 7D2 by touching the display portion 7402 with a finger or the like. In this case, operations such as making a call and creating an e-mail can be performed by touching the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing an e-mail, a text input mode mainly for inputting text is selected for the display portion 7402 so that text displayed on a screen can be inputted. In this case, it is preferable to display a keyboard or number buttons on almost the entire screen of the display portion 7402.

When a detection device which includes a sensor for detecting inclination, such as a gyroscope or an acceleration sensor, is provided inside the mobile phone, the direction of the mobile phone (whether the mobile phone is placed horizontally or vertically for a landscape mode or a portrait mode) is determined so that display on the screen of the display portion 7402 can be automatically switched.

The screen modes are switched by touch on the display portion 7402 or operation with the operation button 7403 of the housing 7401. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken by touch on the display portion 7402 with the palm or the finger, whereby personal authentication can be performed. In addition, by providing a backlight or a sensing light source that emits near-infrared light in the display portion, an image of a finger vein, a palm vein, or the like can be taken.

Note that in the above electronic devices, any of the structures described in this specification can be combined as appropriate.

The display portion preferably includes a light-emitting element of one embodiment of the present invention. Such a light-emitting element can have a long lifetime. Therefore, the electronic device of one embodiment of the present invention can be highly reliable.

Figure 8:
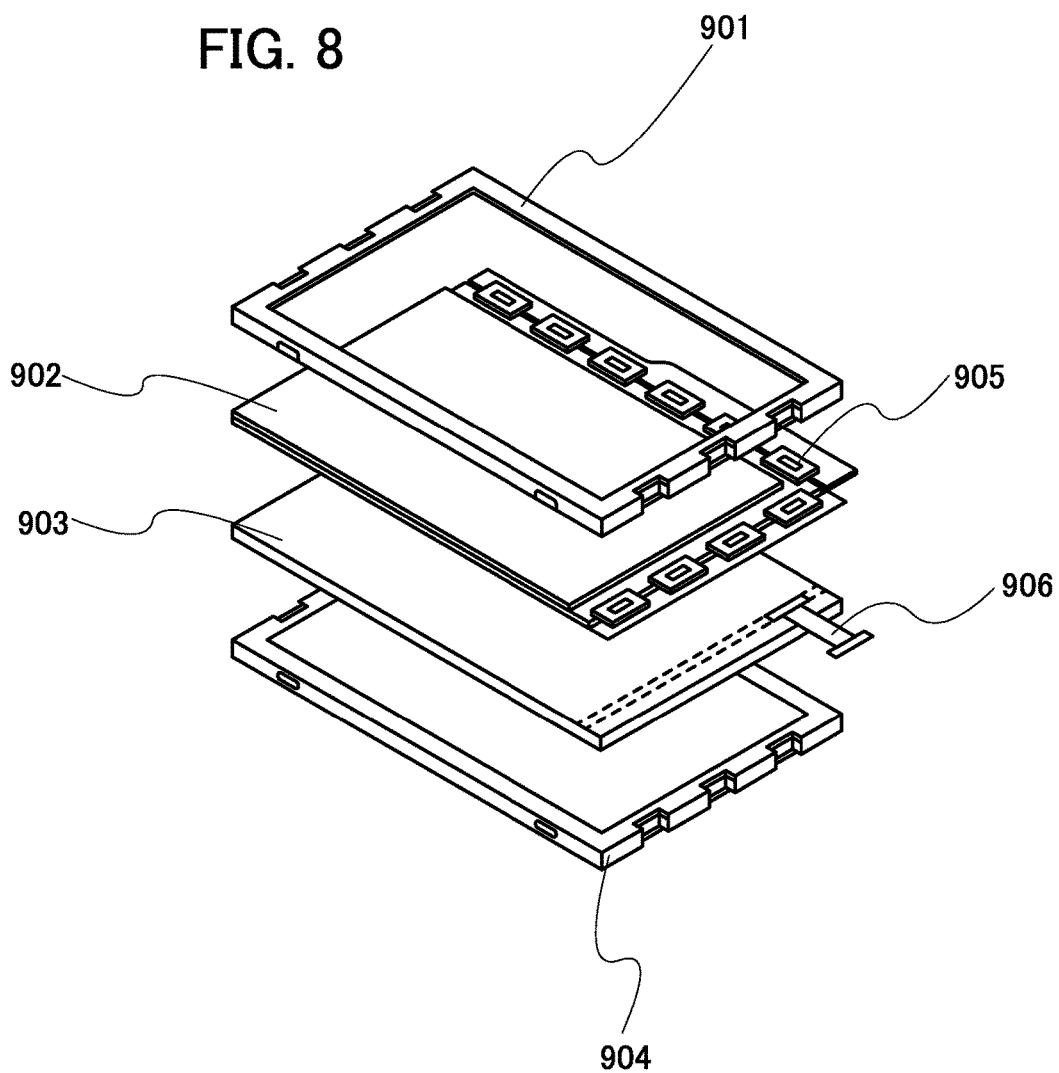
FIG. 8 illustrates a light source device.

FIG. 8 illustrates an example of a liquid crystal display device using the light-emitting element for a backlight. The liquid crystal display device illustrated in FIG. 8 includes a housing 901, a liquid crystal layer 902, a backlight unit 903, and a housing 904. The liquid crystal layer 902 is connected to a driver IC 905. The light-emitting element is used for the backlight unit 903, to which current is supplied through a terminal 906.

As the light-emitting element, the light-emitting element of one embodiment of the present invention is preferably used. By including the light-emitting element, the backlight of the liquid crystal display device can be highly reliable.

Figure 9:
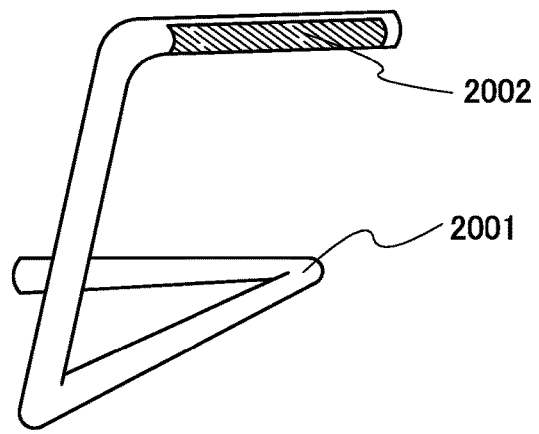
FIG. 9 illustrates a lighting device.

FIG. 9 illustrates an example of a desk lamp which is one embodiment of the present invention. The desk lamp illustrated in FIG. 9 includes a housing 2001 and a light source 2002, and a lighting device including a light-emitting element is used as the light source 2002.

Figure 10:
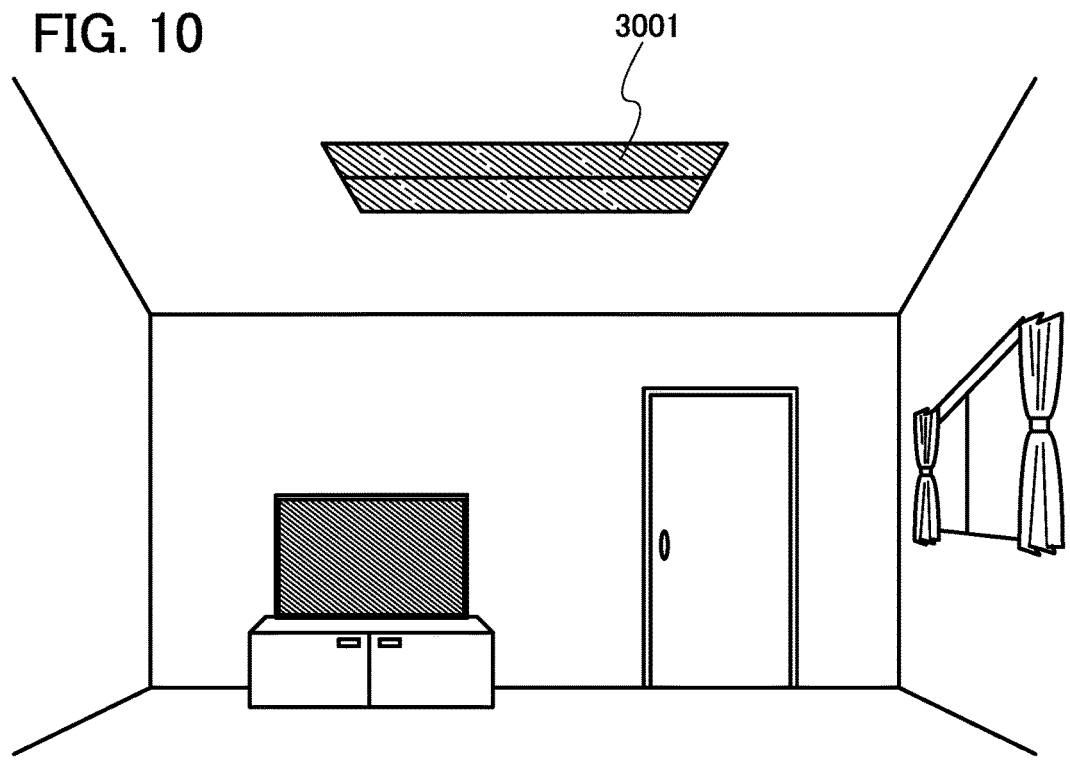
FIG. 10 illustrates a lighting device.

FIG. 10 illustrates an example of an indoor lighting device 3001. The light-emitting element of one embodiment of the present invention is preferably used in the lighting device 3001.

Figure 11:
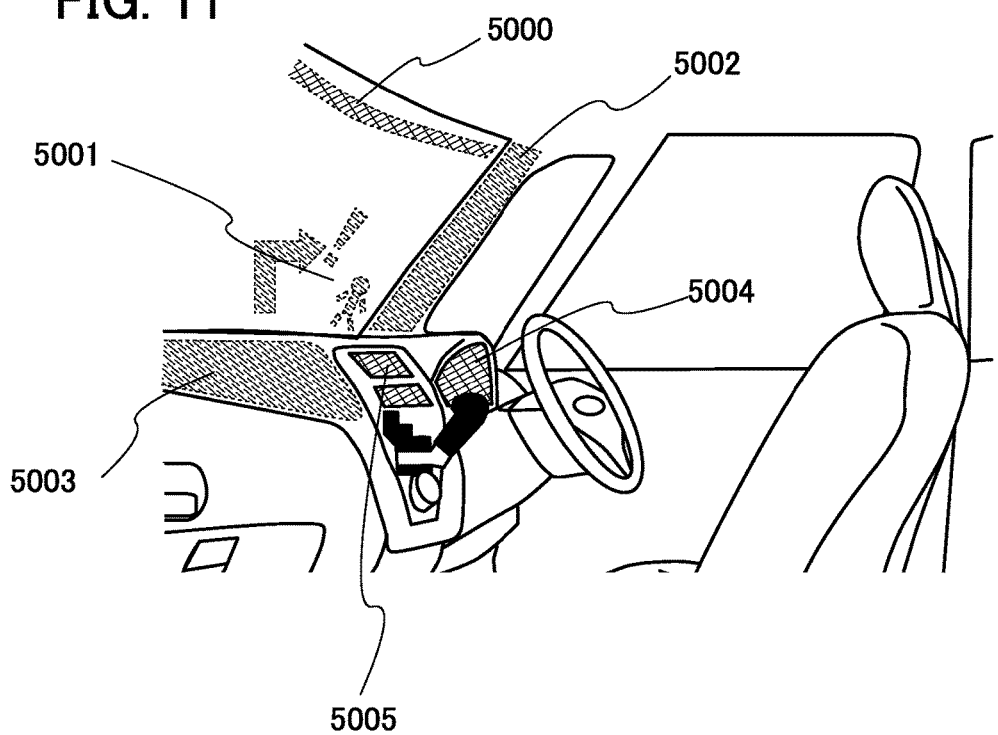
FIG. 11 illustrates in-vehicle display devices and lighting devices.

An automobile which is one embodiment of the present invention is illustrated in FIG. 11. In the automobile, light-emitting elements are used for a windshield and a dashboard. Display regions 5000 to 5005 are provided by using the light-emitting elements. As the light-emitting element, the light-emitting element of one embodiment of the present invention is preferably used, in which case the light-emitting element can have high reliability. This also suppresses power consumption of the display regions 5000 to 5005, showing suitability for use in an automobile.

The display regions 5000 and 5001 are display devices which are provided in the automobile windshield and which include the light-emitting elements. When a first electrode and a second electrode are formed of electrodes having light-transmitting properties in these light-emitting elements, what is called a see-through display device, through which the opposite side can be seen, can be obtained. Such a see-through display device can be provided even in the automobile windshield, without hindering the vision. Note that in the case where a transistor for driving or the like is provided, a transistor having a light-transmitting property, such as an organic transistor using an organic semiconductor material or a transistor using an oxide semiconductor, is preferably used.

The display region 5002 is a display device which is provided in a pillar portion and which includes the light-emitting element. The display region 5002 can compensate for the view hindered by the pillar portion by showing an image taken by an imaging unit provided in the car body. Similarly, a display region 5003 provided in the dashboard can compensate for the view hindered by the car body by showing an image taken by an imaging unit provided in the outside of the car body, which leads to elimination of blind areas and enhancement of safety. Showing an image so as to compensate for the area which a driver cannot see makes it possible for the driver to confirm safety easily and comfortably.

The display region 5004 and the display region 5005 can provide a variety of kinds of information such as navigation data, a speedometer, a tachometer, a mileage, a fuel meter, a gearshift indicator, and air-condition setting. The contents or layout of the display can be changed by a user as appropriate. Note that such information can also be shown by the display regions 5000 to 5003. The display regions 5000 to 5005 can also be used as lighting devices.

Figure 12A:
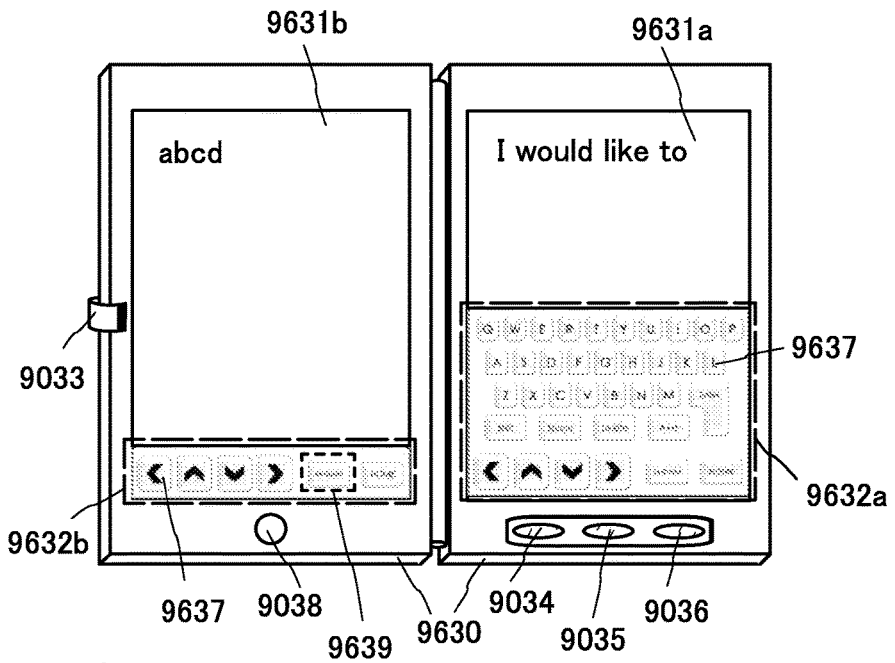
FIGS. 12A to 12C illustrate an electronic device.
Figure 12B:
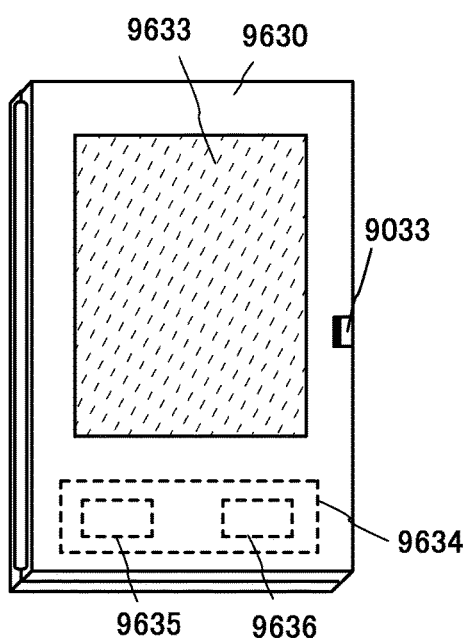

FIGS. 12A and 12B illustrate an example of a foldable tablet terminal. In FIG. 12A, the tablet terminal is opened and includes a housing 9630, a display portion 9631a, a display portion 9631b, a display-mode switching button 9034, a power button 9035, a power-saving-mode switching button 9036, a clip 9033, and an operation button 9038. Note that in the tablet terminal, one or both of the display portion 9631a and the display portion 9631b is/are formed using a light-emitting device which includes the light-emitting element of one embodiment of the present invention.

Part of the display portion 9631a can be a touchscreen region 9632a and data can be input when a displayed operation key 9637 is touched. Although a structure in which a half region in the display portion 9631a has only a display function and the other half region also has a touchscreen function is illustrated as an example, the structure of the display portion 9631a is not limited thereto. The whole area of the display portion 9631a may have a touchscreen function. For example, the whole area of the display portion 9631a can display keyboard buttons and serve as a touchscreen while the display portion 9631b can be used as a display screen.

Like the display portion 9631a, part of the display portion 9631b can be a touchscreen region 9632b. When a switching button 9639 for showing/hiding a keyboard on the touchscreen is touched with a finger, a stylus, or the like, the keyboard can be displayed on the display portion 9631b.

Touch input can be performed concurrently on the touchscreen regions 9632a and 9632b.

The display-mode switching button 9034 allows switching between a portrait mode and a landscape mode, and between monochrome display and color display, for example. With the power-saving-mode switching button 9036, the luminance of display can be optimized in accordance with the amount of external light at the time when the tablet terminal is in use, which is detected with an optical sensor incorporated in the tablet terminal. The tablet terminal may include another detection device such as a sensor for detecting orientation (e.g., a gyroscope or an acceleration sensor) in addition to the optical sensor.

Although the display portion 9631a and the display portion 9631b have the same display area in FIG. 12A, one embodiment of the present invention is not limited to this example. The display portion 9631a and the display portion 9631b may have different areas or different display quality. For example, one of them may be a display panel that can display higher-definition images than the other.

In FIG. 12B, the tablet terminal is folded and includes the housing 9630, a solar cell 9633, a charge and discharge control circuit 9634, a battery 9635, and a DC-to-DC converter 9636. Note that FIG. 12B illustrates an example in which the charge and discharge control circuit 9634 includes the battery 9635 and the DC-to-DC converter 9636.

Since the tablet terminal is foldable, the housing 9630 can be closed when the tablet terminal is not used. Thus, the display portions 9631a and 9631b can be protected, whereby a tablet terminal with high endurance and high reliability for long-term use can be provided.

The tablet terminal illustrated in FIGS. 12A and 12B can also have a function of displaying various kinds of data (e.g., a still image, a moving image, and a text image), a function of displaying a calendar, a date, the time, or the like on the display portion, a touch-input function of operating or editing data displayed on the display portion by touch input, a function of controlling processing by various kinds of software (programs), and the like.

The solar cell 9633, which is attached on the surface of the tablet terminal, supplies electric power to a touchscreen, a display portion, an image signal processor, and the like. Note that the solar cell 9633 is preferably provided on one or two surfaces of the housing 9630, in which case the battery 9635 can be charged efficiently.

Figure 12C:
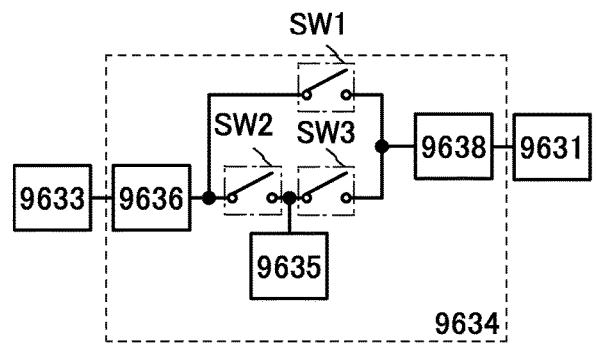

The structure and operation of the charge and discharge control circuit 9634 illustrated in FIG. 12B are described with reference to a block diagram of FIG. 12C. FIG. 12C illustrates the solar cell 9633, the battery 9635, the DC-to-DC converter 9636, a converter 9638, switches SW1 to SW3, and the display portion 9631. The battery 9635, the DC-to-DC converter 9636, the converter 9638, and the switches SW1 to SW3 correspond to the charge and discharge control circuit 9634 in FIG. 12B.

First, an example of operation in the case where power is generated by the solar cell 9633 using external light is described. The voltage of power generated by the solar cell is raised or lowered by the DC-to-DC converter 9636 so that the power has voltage for charging the battery 9635. Then, when power supplied from the battery 9635 charged by the solar cell 9633 is used for the operation of the display portion 9631, the switch SW1 is turned on and the voltage of the power is raised or lowered by the converter 9638 so as to be voltage needed for the display portion 9631. In addition, when display on the display portion 9631 is not performed, the switch SW1 is turned off and a switch SW2 is turned on so that charge of the battery 9635 may be performed.

Although the solar cell 9633 is described as an example of a power generation means, the power generation means is not particularly limited, and the battery 9635 may be charged by another power generation means such as a piezoelectric element or a thermoelectric conversion element (Peltier element). The battery 9635 may be charged by a non-contact power transmission module that is capable of charging by transmitting and receiving power by wireless (without contact), or another charge means used in combination, and the power generation means is not necessarily provided.

One embodiment of the present invention is not limited to the tablet terminal having the shape illustrated in FIGS. 12A to 12C as long as the display portion 9631 is included.

Example 1

In this example, a light-emitting element of one embodiment of the present invention (light-emitting element 1) and a light-emitting element for comparison (comparative light-emitting element 1) are described.

Note that 2,9-bis(naphthalen-2-yl)-4,7-diphenyl-1,10-phenanthroline (abbreviation: NBPhen) (sample 1) contained in the light-emitting element 1 and NBPhen (sample 2) contained in the comparative light-emitting element 1 have different halogen concentrations. In each element, NBPhen is used in an electron-transport layer.

First, the halogen concentration in NBPhen in each of the sample 1 and sample 2 was obtained by combustion ion chromatography. The analysis was carried out using an automatic sample combustion apparatus AQF-2100H by Mitsubishi Chemical Analytech Co., Ltd. and an ion chromatography system Dionex ICS-2100 by Thermo Fisher Scientific Inc.

10 mg to 50 mg of each sample was weighed and put in a ceramic boat as a combustion sample. The heater temperature in the combustion apparatus was 1000° C. on the entrance side and 900° C. on the exit side. Gases of Ar, $O_2$, and humidified Ar were kept flowing at flow rates of 200 ml/min, 400 ml/min, and 100 ml/min, respectively. An absorption solution (pure water to which 30 ppm of a phosphoric acid was added as an internal reference in the ion chromatography) was subjected to bubbling with those gases so as to absorb gases generated at the time of combustion.

Sample combustion was carried out in such a manner that a boat controller was used while the boat was moved under certain conditions so that the sample was reacted with oxygen at high temperature. The conditions for boat movement are as follows. Assuming that the sample setting position was 0 mm, the boat was moved to a position of 130 mm at 20 mm/sec and stopped for 90 sec. Then, the boat was moved to a position of 160 mm at 0.12 mm/sec and stopped for 90 sec. Lastly, the boat was moved to the end of a combustion tube, i.e., a position of 265 mm at 20 mm/sec, stopped for 90 sec, and then collected. The amount of chlorine was measured by introducing 100 μl of the absorption solution which had absorbed gases generated by the above combustion into the ion chromatography system.

Ion chromatography analysis was carried out at 35° C. using columns of Dionex IonPac AG20 (4 mm×50 mm) and Dionex IonPac AS20 (4 mm×250 mm). KOH was used as an eluent and its flow rate was set to 1.0 ml/min. Gradient measurement was performed such that the concentration of KOH was gradually increased.

A conductivity detector was used as the detector. A calibration curve was created using an anion mixed reference solution purchased from Kanto Chemical Co., Inc.

According to the analysis results, the amount of chlorine in the sample 1 was 14 ppm and that in the sample 2 was 220 ppm. Note that since these samples are samples subjected to sublimation purification, it is estimated that chlorine is present mainly as a chlorine-substituted product of NBPhen.

Next, methods for fabricating the light-emitting element 1 and the comparative light-emitting element 1 are described. Structure formulae of organic compounds used for the light-emitting element 1 and the comparative light-emitting element 1 are shown below.

[Chemical Formulae 7]

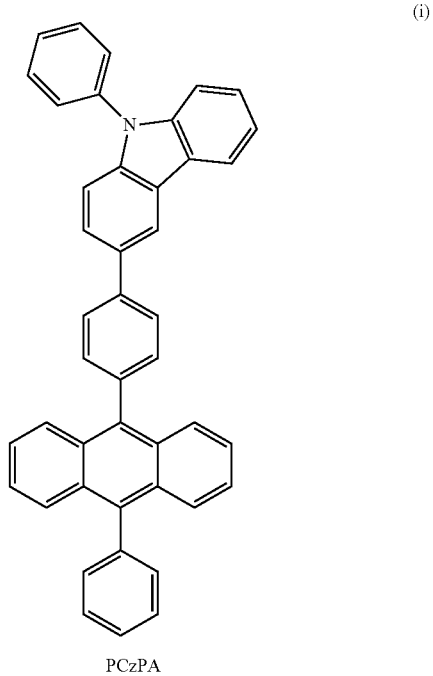

(i)

PCzPA

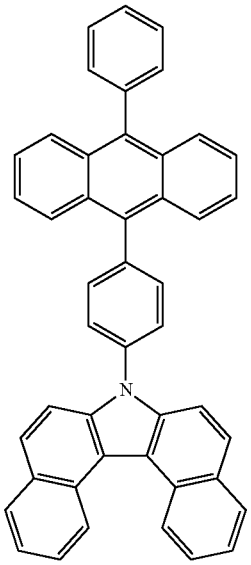

cgDBCzPA

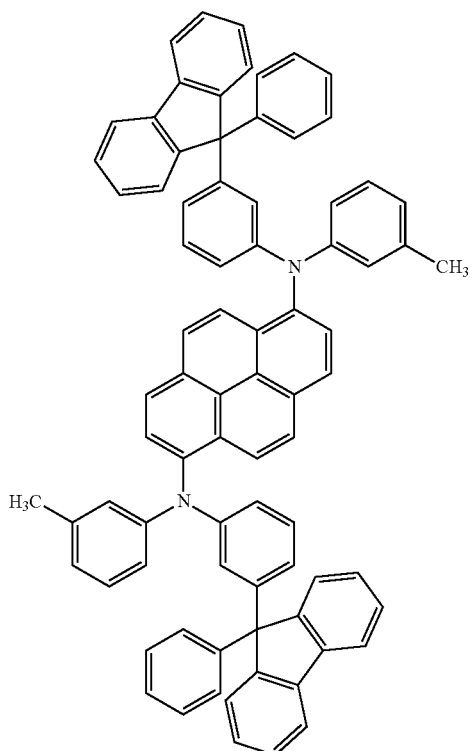

1,6mMemFLPAPrn

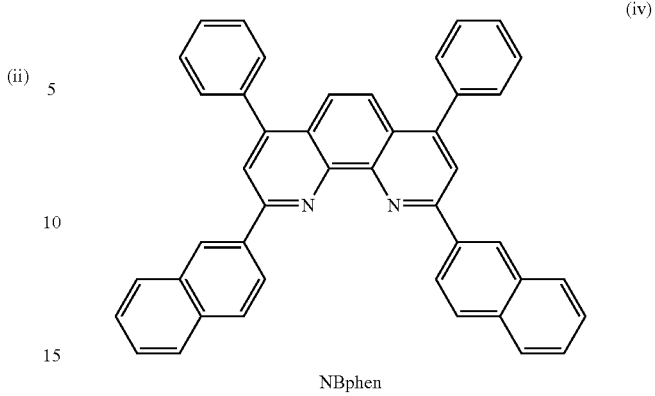

NBphen (Method for Fabricating Light-Emitting Element 1 and Comparative Light-Emitting Element 1)

First, a film of indium tin oxide containing silicon oxide (ITSO) was formed over a glass substrate by a sputtering method to form the first electrode 101. The thickness was 110 nm and the electrode area was 2 mm×2 mm. Here, the first electrode 101 functions as an anode of the light-emitting element.

Next, in pretreatment for forming the light-emitting element over the substrate, a surface of the substrate was washed with water and baked at 200° C. for 1 hour, and then UV ozone treatment was performed for 370 seconds.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for approximately 30 minutes.

Then, the substrate over which the first electrode 101 was formed was fixed to a substrate holder provided in the vacuum evaporation apparatus so that the surface on which the first electrode 101 was formed faced downward. The pressure in the vacuum evaporation apparatus was reduced to about $10^{-4}$ Pa. After that, over the first electrode 101, 9-phenyl-3-[4-(10-phenyl-9-anthryl)phenyl]-9H-carabzole (abbreviation: PCzPA) represented by the above structural formula (i) and molybdenum(VI) oxide were deposited by co-evaporation by an evaporation method using resistance heating, so that the hole-injection layer 111 was formed. The thickness of the hole-injection layer 111 was set to 50 nm, and the weight ratio of PCzPA to molybdenum oxide was adjusted to 4:2 (=PCzPA: molybdenum oxide).

Next, a film of PCzPA was formed to a thickness of 10 nm over the hole-injection layer 111 to form the hole-transport layer 112.

On the hole-transport layer 112, 7-[4-(10-phenyl-9-anthryl)phenyl]-7H-dibenzo[c,g]carbazole (abbreviation: cgDBCzPA) represented by Structural Formula (ii) and N,N'-bis(3-methylphenyl)-N,N'-bis[3-(9-phenyl-9H-fluoren-9-yl)phenyl]-pyrene-1,6-diamine (abbreviation: 1,6mMemFLPAPrn) represented by Structural Formula (iii) were deposited by co-evaporation to a thickness of 25 nm such that the weight ratio of cgDBCzPA to 1,6mMemFLPAPrn was 1:0.04 (=cgDBCzPA: 1,6mMemFLPAPrn); thus, the light-emitting layer 113 was formed.

Then, over the light-emitting layer 113, cgDBCzPA was formed to a thickness of 10 nm to form the electron-transport layer 114.

After the electron-transport layer 114 was formed, 2,9-bis(naphthalen-2-yl)-4,7-diphenyl-1,10-phenanthroline (abbreviation: NBPhen) represented by Structural Formula (iv) was formed to a thickness of 15 nm, and then, lithium fluoride (LiF) was deposited to a thickness of 1 nm, whereby the electron-injection layer 115 was formed. Note that NBPhen of the light-emitting element 1 and NBPhen of the comparative light-emitting element 1 were the sample 1 and the sample 2 with chlorine concentration of 14 ppm and 220 ppm, respectively, which were measured by combustion ion chromatography. Note that high-purity materials with a chlorine concentration less than or equal to 10 ppm are used as organic compounds other than NBPhen Lastly, aluminum was deposited to a thickness of 200 nm to form the second electrode 102 serving as a cathode. Thus, the light-emitting element 1 and the comparative light-emitting element 1 were fabricated.

The element structures of the light-emitting element 1 and the comparative light-emitting element 1 are listed in Table 3.

TABLE 3

| Hole-injection layer | Hole-transport layer | Light-emitting layer | Electron-transport layer | | Electron-injection layer |
|---|---|---|---|---|---|
| PCzPA:MoOx (4:2) | PCzPA | cgDBCzPA:1,6mMemFLPAPrn (1:0.04) | cgDBCzPA | NBPhen *1 | LiF |
| 50 nm | 10 nm | 25 nm | 10 nm | 15 nm | 1 nm |

*1: Chlorine ion concentration in sample
Light-emitting element 1: 14 ppm
Comparative light-emitting element 1: 220 ppm The light-emitting element 1 and the comparative light-emitting element 1 were each sealed using a glass substrate in a glove box containing a nitrogen atmosphere so as not to be exposed to the air (specifically, a sealing material was applied to surround the element, and at the time of sealing, first, UV treatment was performed and then heat treatment was performed at 80° C. for 1 hour). Then, initial characteristics of these light-emitting elements were measured. It is to be noted that the measurements were performed at room temperature (in an atmosphere kept at 25° C.).

Figure 20:
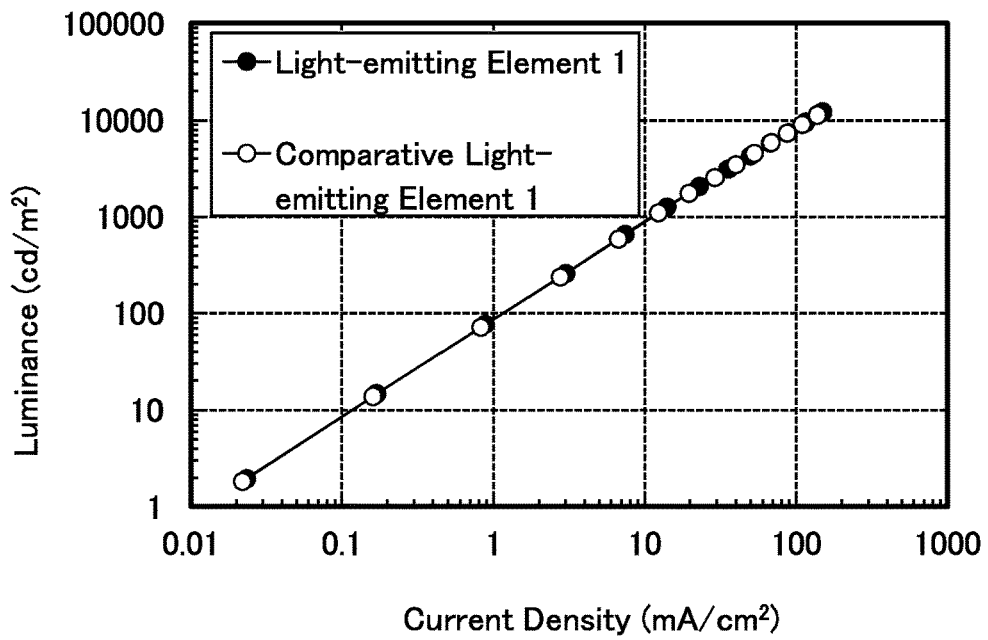
FIG. 20 shows luminance-current density characteristics of a light-emitting element 1 and a comparative light-emitting element 1.
Figure 21:
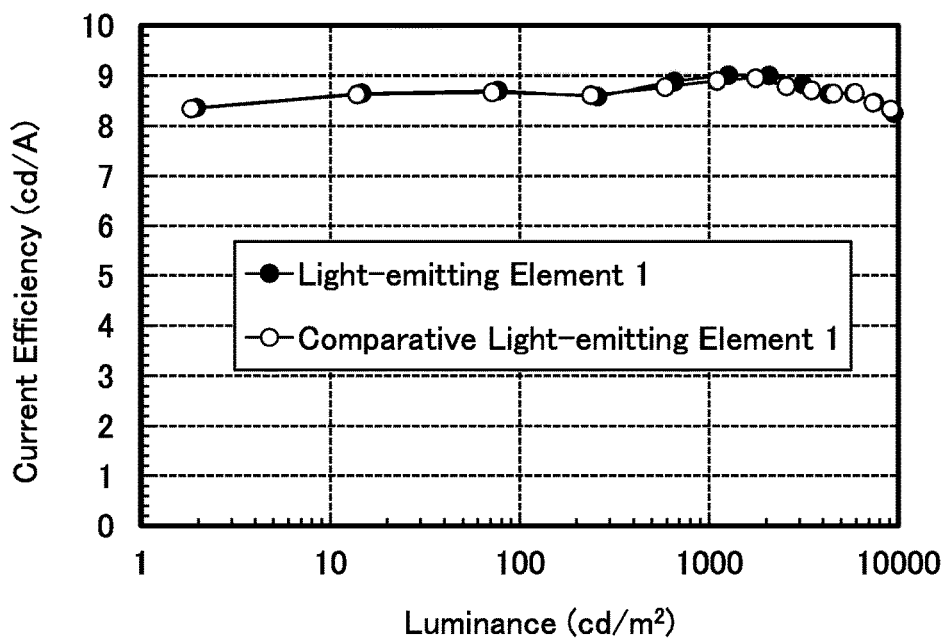
FIG. 21 shows current efficiency-luminance characteristics of the light-emitting element 1 and the comparative light-emitting element 1.
Figure 22:
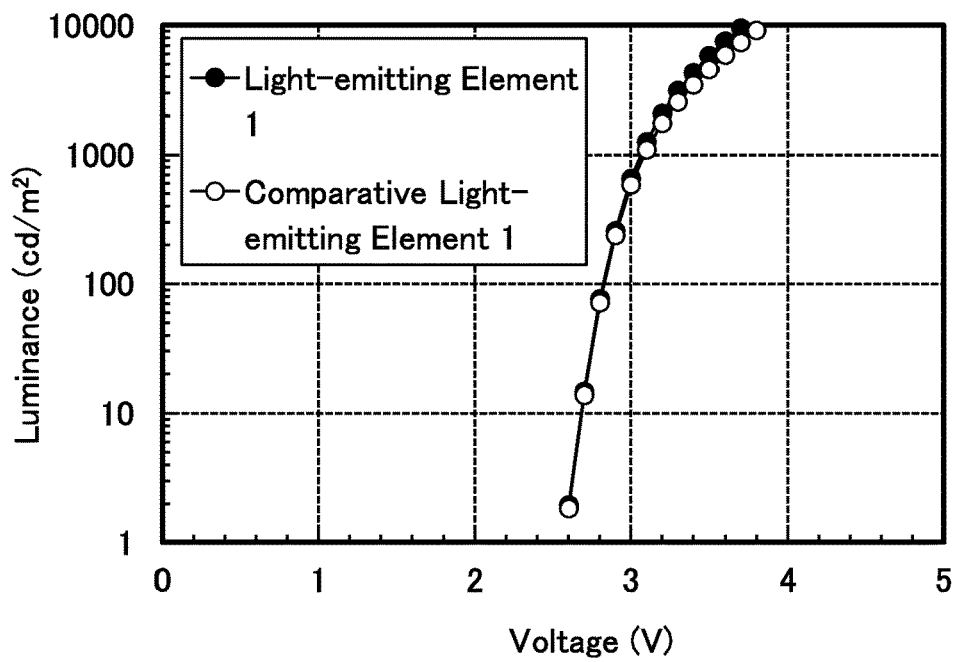
FIG. 22 shows luminance-voltage characteristics of the light-emitting element 1 and the comparative light-emitting element 1.
Figure 23:
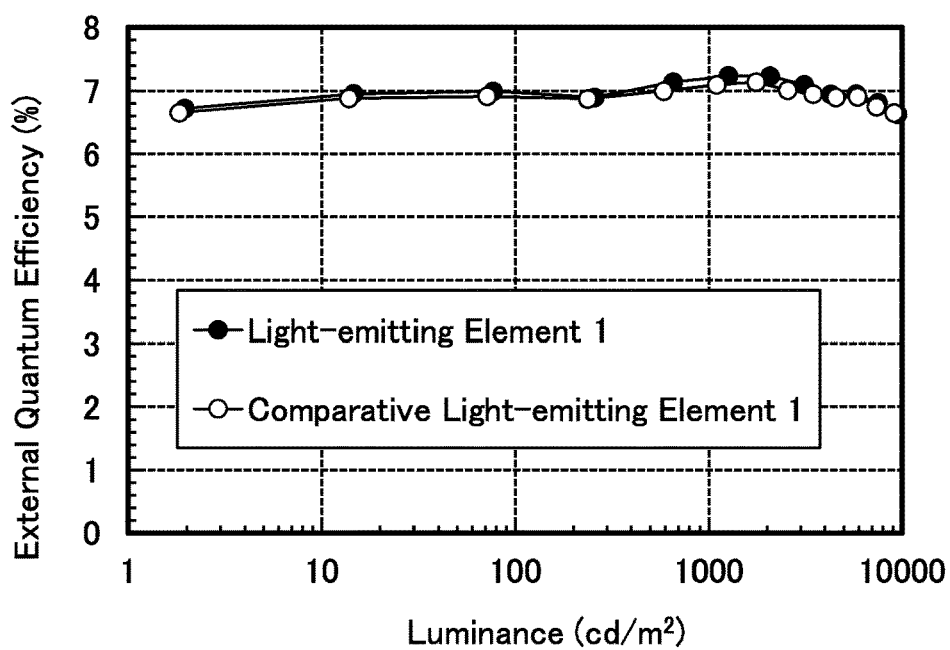
FIG. 23 shows external quantum efficiency-luminance characteristics of the light-emitting element 1 and the comparative light-emitting element 1.
Figure 24:
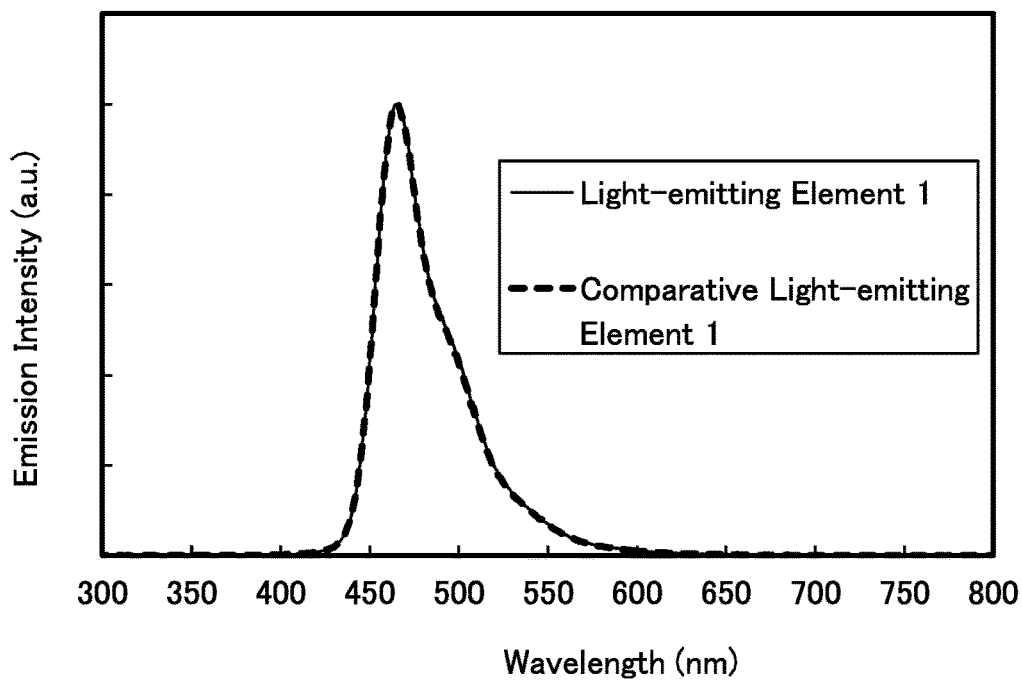
FIG. 24 shows emission spectra of the light-emitting element 1 and the comparative light-emitting element 1.

FIG. 20 shows luminance vs. current density characteristics of the light-emitting element 1 and the comparative light-emitting element 1. FIG. 21 shows current efficiency vs. luminance characteristics thereof. FIG. 22 shows luminance vs. voltage characteristics thereof. FIG. 23 shows external quantum efficiency vs. luminance characteristics thereof. FIG. 24 shows emission spectra thereof.

These results reveal that both the light-emitting element 1 and the comparative light-emitting element 1 have favorable initial characteristics, which means that concentration of chlorine contained in the electron-injection layer hardly affects the initial characteristics.

Figure 25:
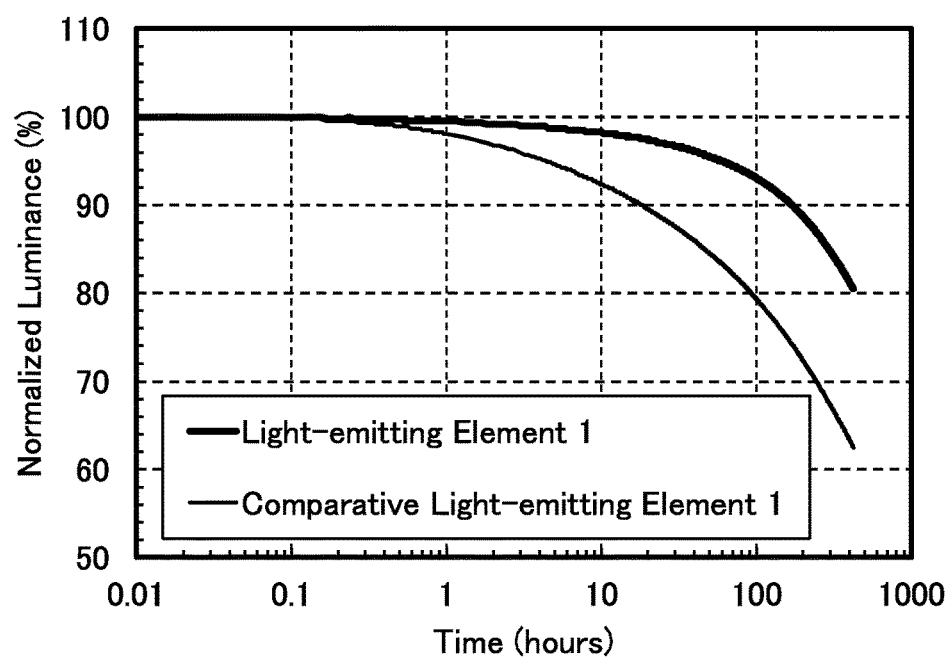
FIG. 25 shows temporal change in normalized luminance of the light-emitting element 1 and the comparative light-emitting element 1.

FIG. 25 shows temporal change in normalized luminance of each of the light-emitting element 1 and the comparative light-emitting element 1 which were driven under the conditions where the initial luminance was set to 5000 cd/m$^2$ and the current density was constant. FIG. 25 indicates that the light-emitting element 1 maintains 80% or more of the initial luminance after approximately 400 hours; in contrast, the comparative light-emitting element 1 has only approximately 63% of the initial luminance after 400 hours.

These results show that the difference in the concentration of chlorine-substituted products in a material forming the electron-injection layer largely affects the reliability of the light-emitting elements even when halogen-substituted products are contained in light-emitting layers of the elements at the same concentration.

In the case where a halogen-substituted product contained in the electron-injection layer is brought into a radical anion state by electron injection and easily releases a halogen, the released halogen reaches the light-emitting layer by an electric field and adversely affects the luminance. Thus, a light-emitting element containing, as a material forming an electron-injection layer, an organic compound which releases a halogen by injection of an electron to a halogen-substituted product of the organic compound can achieve long lifetime with suppressed luminance decay in the case where the amount of halogen-substituted products of a material forming a light-emitting layer is not increased by driving.

A light-emitting element containing, as a material forming an electron-injection layer, an organic compound which releases a halogen by injection of an electron to a halogen-substituted product of the organic compound can achieve long lifetime in the case where the amount of halogens contained in the material forming the electron-injection layer is less than or equal to 30 ppm.

In particular, in the light-emitting element containing the halogen-substituted product of the organic compound forming the electron-injection layer which releases the halogen in a radical anion state with energy less than or equal to 1.00 eV, particularly less than or equal to 0.84 eV, a halogen is easily released by driving the light-emitting element. Therefore, by setting the amount of halogens in the material forming the electron-injection layer to be less than or equal to 30 ppm, the adverse effect of the halogens on luminance can be effectively reduced. Similarly, in the light-emitting element containing the halogen-substituted product of the organic compound forming the electron-injection layer which releases the halogen in a radical anion state with energy less than or equal to 1.00 eV, particularly less than or equal to 0.84 eV, long lifetime can be achieved and the luminance is not adversely affected in the case where the amount of halogen-substituted products of the material forming the light-emitting layer is not increased by the increase in driving time. Note that the increase and decrease in a halogen-substituted product can be determined when normalized luminance reaches approximately 80% of the initial luminance.

A plurality of elements were formed having structures similar to those of the light-emitting element 1 and the comparative light-emitting element 1 and differing only in the concentration of chlorine-substituted products of NBPhen forming the electron-injection layer. FIG. 32 shows the results of examining normalized luminance and chlorine content of the elements subjected to a driving test for 420 hours. When halides are contained in an electron injection transport layer of the light-emitting element, the reliability of the light-emitting element is low. The influence of halides increases as the concentration of halides becomes higher. On the other hand, as the concentration of contained halides becomes lower, the influence of the halides on reliability is saturated at a certain concentration. In FIG. 32, an intersection of a curve and the average lifetime of light-emitting elements in a group with low chlorine concentration and high reliability (a group with a chlorine concentration less than or equal to 20 ppm) is located at approximately 30 ppm. That is, it can be estimated that the influence is saturated at approximately 30 ppm or lower. This is probably because deterioration due to a factor other than halide impurity reduces reliability when the concentration of the impurity is less than or equal to a certain level.

Example 2

In this example, a light-emitting element of one embodiment of the present invention (a light-emitting element 2) and a light-emitting element for comparison (a comparative light-emitting element 2) are described.

Note that 2-[3'-(dibenzothiophen-4-yl)biphenyl-3-yl]dibenzo[f,h]quinoxaline (abbreviation: 2mDBTBPDBq-II) (sample 3) contained in the light-emitting element 2 and 2mDBTBPDBq-II (sample 4) contained in the comparative light-emitting element 2 have different halogen concentrations. In each element, 2mDBTBPDBq-II is used in an electron-transport layer.

First, the halogen concentration in 2mDBTBPDBq-II in each of the sample 3 and sample 4 was obtained by combustion ion chromatography. The analysis was carried out using an automatic sample combustion apparatus AQF-2100H by Mitsubishi Chemical Analytech Co., Ltd. and an ion chromatography system Dionex ICS-2100 by Thermo Fisher Scientific Inc.

10 mg to 50 mg of each sample was weighed and put in a ceramic boat as a combustion sample. The heater temperature in the combustion apparatus was 1000° C. on the entrance side and 900° C. on the exit side. Gases of Ar, $O_2$, and humidified Ar were kept flowing at flow rates of 200 ml/min, 400 ml/min, and 100 ml/min, respectively. An absorption solution (pure water to which 30 ppm of a phosphoric acid was added as an internal reference in the ion chromatography) was subjected to bubbling with those gases so as to absorb gases generated at the time of combustion.

Sample combustion was carried out in such a manner that a boat controller was used and the boat was moved under certain conditions so that the sample was reacted with oxygen at high temperature. The conditions for boat movement are as follows. Assuming that the sample setting position was 0 mm, the boat was moved to a position of 130 mm at 20 mm/sec and stopped for 90 sec. Then, the boat was moved to a position of 160 mm at 0.12 mm/sec and stopped for 90 sec. Lastly, the boat was moved to the end of a combustion tube, i.e., a position of 265 mm at 20 mm/sec, stopped for 90 sec, and then collected. The amount of chlorine was measured by introducing 100 μl of the absorption solution which had absorbed gases generated by the above combustion into the ion chromatography system.

Ion chromatography analysis was carried out at 35° C. using columns of Dionex IonPac AG20 (4 mm×50 mm) and Dionex IonPac AS20 (4 mm×250 mm). KOH was used as an eluent and its flow rate was set to 1.0 ml/min. Gradient measurement was performed such that the concentration of KOH was gradually increased.

A conductivity detector was used as the detector. A calibration curve was created using an anion mixed reference solution purchased from Kanto Chemical Co., Inc.

According to the analysis results, the amount of chlorine in the sample 3 was 1.5 ppm and that in the sample 4 was 240 ppm.

Next, methods for fabricating the light-emitting element 2 and the comparative light-emitting element 2 are described. Structure formulae of organic compounds used for the light-emitting element 2 and the comparative light-emitting element 2 are shown below.

[Chemical Formulae 8]

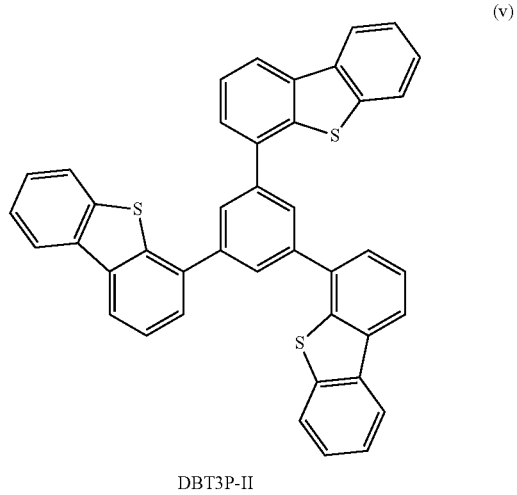

DBT3P-II

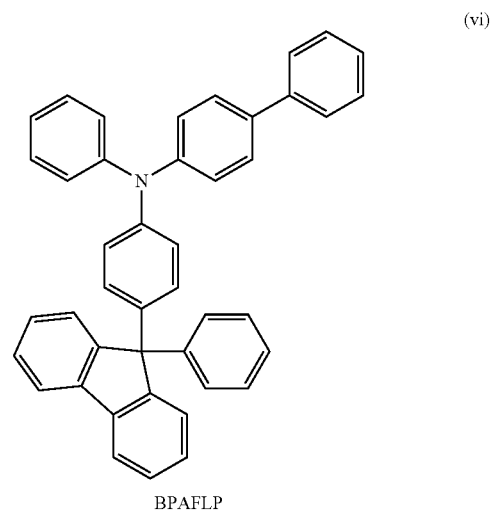

BPAFLP

-continued

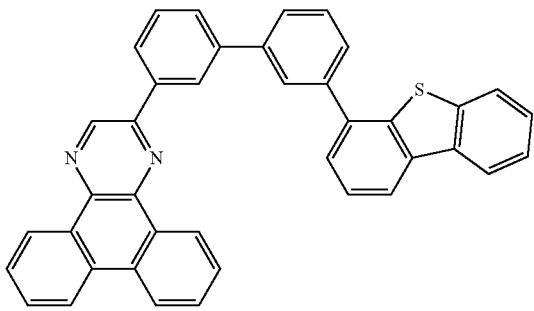

2mDBTBPDBq-II

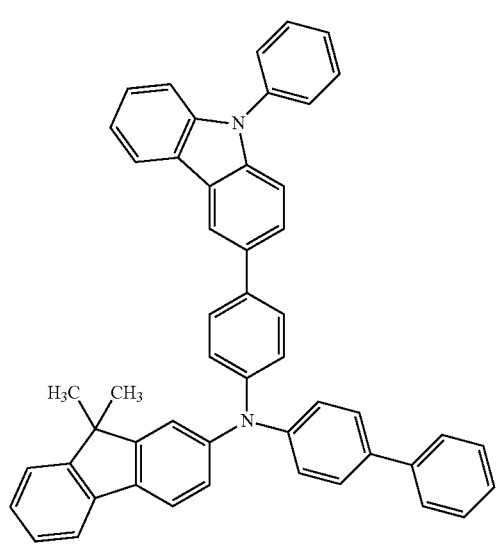

PCBBiF

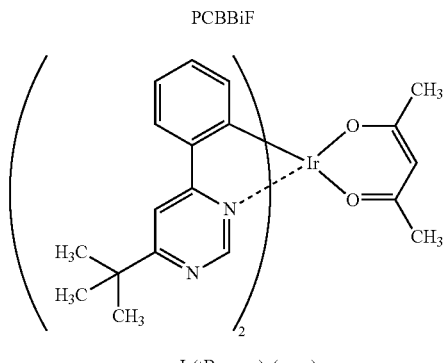

Ir(tBuppm)₂(acac)

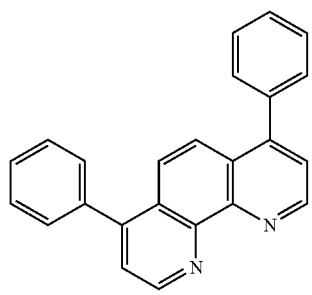

BPhen (Method for Fabricating Light-Emitting Element 2 and Comparative Light-Emitting Element 2)

First, a film of indium tin oxide containing silicon oxide (ITSO) was formed over a glass substrate by a sputtering method to form the first electrode 101. The thickness was 110 nm and the electrode area was 2 mm×2 mm. Here, the first electrode 101 functions as an anode of the light-emitting element.

Next, in pretreatment for forming the light-emitting element over the substrate, a surface of the substrate was washed with water and baked at 200° C. for 1 hour, and then UV ozone treatment was performed for 370 seconds.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for approximately 30 minutes.

Then, the substrate provided with the first electrode 101 was fixed to a substrate holder provided in the vacuum evaporation apparatus so that the surface on which the first electrode 101 was formed faced downward. The pressure in the vacuum evaporation apparatus was reduced to approximately $10^{-4}$ Pa. After that, on the first electrode 101, 4,4',4''-(benzene-1,3,5-triyl)tri(dibenzothiophene) (abbreviation: DBT3P-II) represented by Structural Formula (v) and molybdenum(VI) oxide were co-deposited by evaporation by an evaporation method using resistance heating; whereby the hole-injection layer 111 was formed. The thickness of the hole-injection layer 111 was set to 20 nm. The mass ratio of DBT3P-II to molybdenum oxide was set to 1:0.5 (=DBT3P-II: molybdenum oxide).

Next, a film of 4-phenyl-4'-(9-phenylfluoren-9-yl)triphenylamine (abbreviation: BPAFLP) represented by Structural Formula (vi) was formed to a thickness of 10 nm over the hole-injection layer 111, whereby the hole-transport layer 112 was formed.

Further, the light-emitting layer 113 was formed over the hole-transport layer 112 in the following manner: 2-[3'-(dibenzothiophen-4-yl)biphenyl-3-yl]dibenzo[f,h]quinoxaline (abbreviation: 2mDBTBPDBq-II) represented by Structural Formula (vii), N-(1,1'-biphenyl-4-yl)-9,9-dimethyl-N-[4-(9-phenyl-9H-carbazol-3-yl)phenyl]-9H-fluoren-2-amine (abbreviation: PCBBiF) represented by Structural Formula (viii), and bis[2-(6-tert-butyl-4-pyrimidinyl-κN3)phenyl-κC](2,4-pentanedionato-κ²O,O') iridium(III) (abbreviation: [Ir(tBuppm)₂(acac)]) represented by Structural Formula (ix) were deposited by co-evaporation to a thickness of 20 nm such that the weight ratio of 2mDBTBPDBq-II to PCBBiF and [Ir(tBuppm)₂(acac)] was 0.7:0.3:0.05; then, 2mDBTB-PDBq-II, PCBBiF, and [Ir(tBuppm)₂(acac)] were deposited by co-evaporation to a thickness of 20 nm such that the weight ratio of 2mDBTBPDBq-II to PCBBiF and [Ir(tBuppm)₂(acac)] was 0.8:0.2:0.05.

To form the electron-transport layer of the light-emitting element 2, the sample 3 of 2mDBTBPDBq-II whose chlorine content was determined to be less than or equal to 2 ppm by combustion ion chromatography was formed to a thickness of 20 nm over the light-emitting layer 113. To form the electron-transport layer of the comparative light-emitting element 2, the sample 3 of 2mDBTBPDBq-II whose chlorine content was determined to be less than or equal to 2 ppm by combustion ion chromatography was formed to a thickness of 10 nm over the light-emitting layer 113, and then, the sample 4 of 2mDBTBPDBq-II whose chlorine content was determined to be 240 ppm by combustion ion chromatography was formed to a thickness of 10 nm.

Furthermore, to form the electron-injection layer 115, bathophenanthroline (abbreviation: BPhen) was formed to a thickness of 10 nm over the electron-transport layer 114, and lithium fluoride (LiF) was formed to a thickness of 1 nm. Finally, aluminum was formed to a thickness of 200 nm by evaporation. Thus, the light-emitting element 2 and the comparative light-emitting element 2 were completed.

The element structures of the light-emitting element 2 and the comparative light-emitting element 2 are listed in Table 4.

TABLE 4

| Hole-injection layer | Hole-transport layer | Light-emitting layer | | Electron-transport layer | Electron-injection layer | |
|---|---|---|---|---|---|---|
| DBT3P-II: MoOx (1:0.5) | BPAFLP | 2mDBTBPDBq-II: PCBBiF: Ir(tBuppm)$_2$(acac) (0.7:0.3:0.05) | 2mDBTBPDBq-II: PCBBiF: Ir(tBuppm)$_2$(acac) (0.8:0.2:0.05) | *2, *3 | BPhen | LiF |
| 20 nm | 20 nm | 20 nm | 20 nm | | 10 nm | 1 nm |

*2 Light-emitting element 2 2mDBTBPDBq-II(sample 3) 20 nm
*3 Comparative light-emitting element 2 2mDBTBPDBq-II(sample 3) 10 nm + 2mDBTBPDBq-II(sample 4) 10 nm The light-emitting element 2 and the comparative light-emitting element 2 were each sealed using a glass substrate in a glove box containing a nitrogen atmosphere so as not to be exposed to the air (specifically, a sealing material was applied to surround the element, and at the time of sealing, first, UV treatment was performed and then heat treatment was performed at 80° C. for 1 hour). Then, initial characteristics of these light-emitting elements were measured. It is to be noted that the measurements were performed at room temperature (in an atmosphere kept at 25° C.

Figure 26:
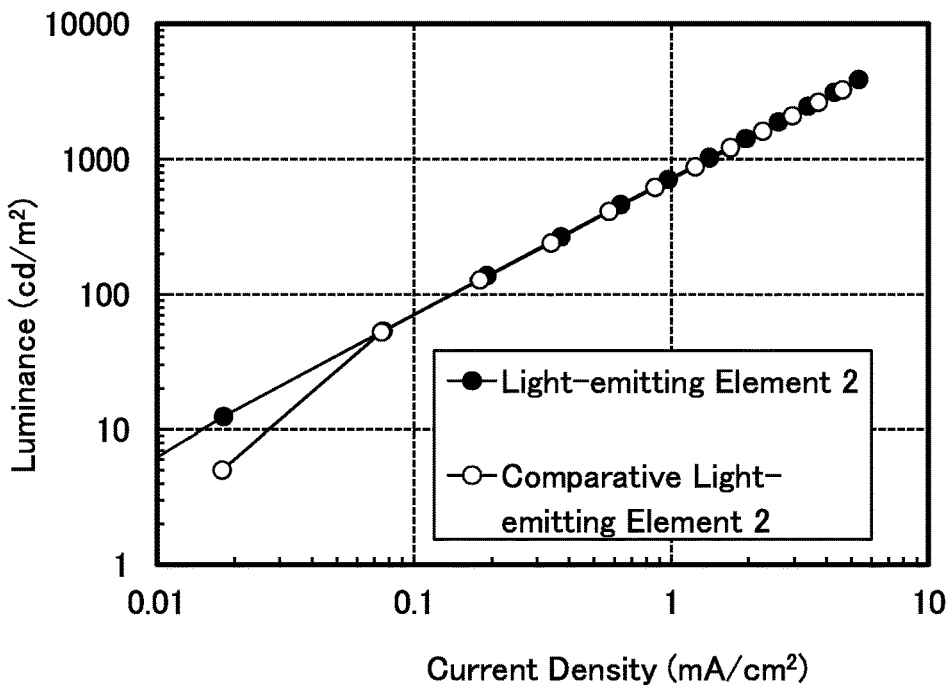
FIG. 26 shows luminance-current density characteristics of a light-emitting element 2 and a comparative light-emitting element 2.
Figure 27:
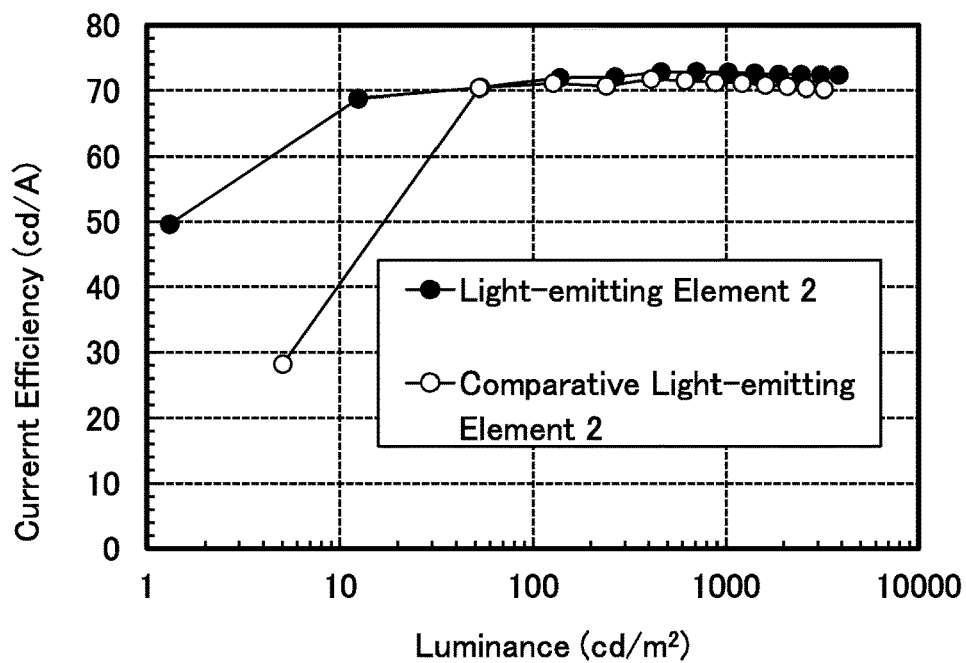
FIG. 27 shows current efficiency-luminance characteristics of the light-emitting element 2 and the comparative light-emitting element 2.
Figure 28:
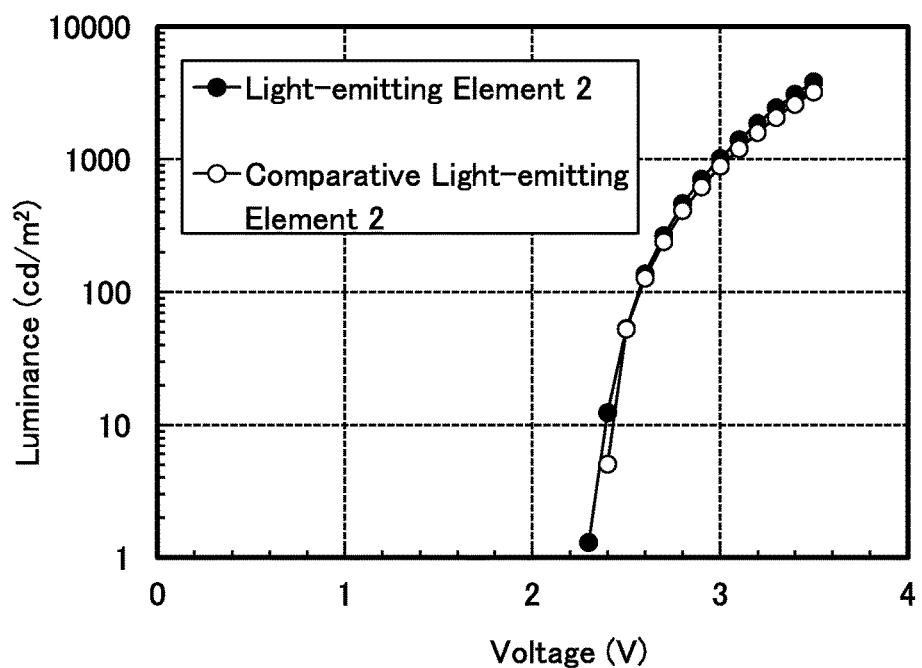
FIG. 28 shows luminance-voltage characteristics of the light-emitting element 2 and the comparative light-emitting element 2.
Figure 29:
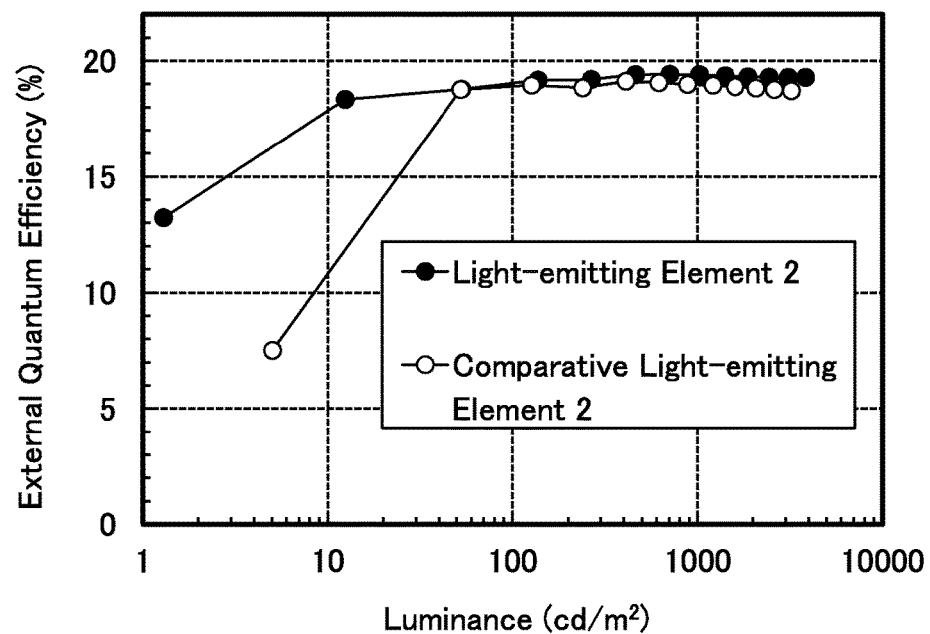
FIG. 29 shows external quantum efficiency-luminance characteristics of the light-emitting element 2 and the comparative light-emitting element 2.
Figure 30:
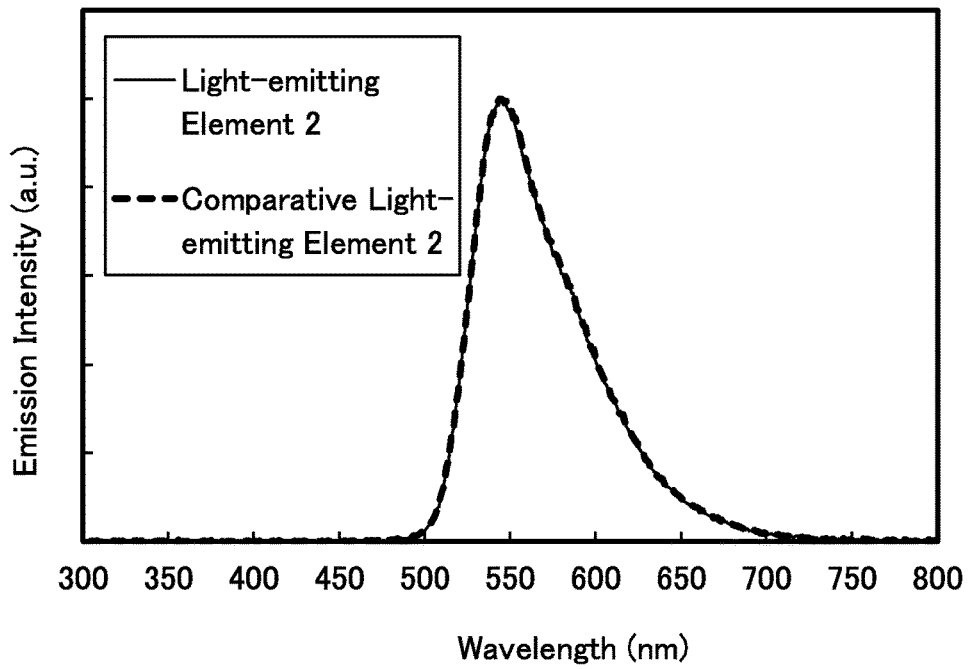
FIG. 30 shows emission spectra of the light-emitting element 2 and the comparative light-emitting element 2.

FIG. 26 shows luminance vs. current density characteristics of the light-emitting element 2 and the comparative light-emitting element 2. FIG. 27 shows current efficiency vs. luminance characteristics thereof. FIG. 28 shows luminance vs. voltage characteristics thereof. FIG. 29 shows external quantum efficiency vs. luminance characteristics thereof. FIG. 30 shows emission spectra thereof.

These results reveal that both the light-emitting element 2 and the comparative light-emitting element 2 have favorable initial characteristics, which means that concentration of chlorine contained in the electron-transport layer which is not in contact with the light-emitting layer hardly affects the initial characteristics.

Figure 31:
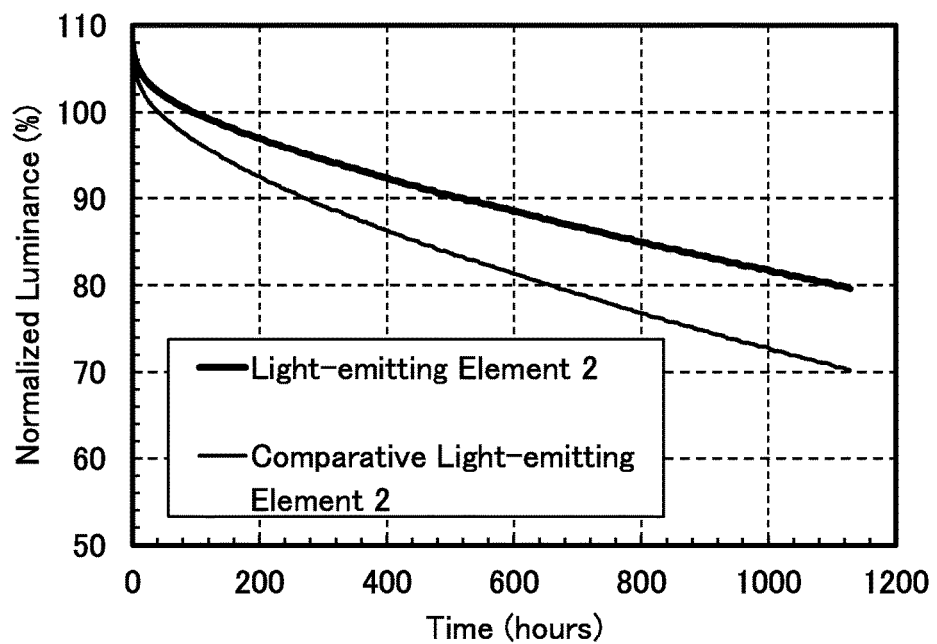
FIG. 31 shows temporal change in normalized luminance of the light-emitting element 2 and the comparative light-emitting element 2.

FIG. 31 shows temporal change in normalized luminance of each of the light-emitting element 2 and the comparative light-emitting element 2 which were driven under the conditions where the initial luminance was set to 5000 cd/m$^2$ and the current density was constant. FIG. 31 indicates that the light-emitting element 2 maintains approximately 80% of the initial luminance after approximately 1100 hours; in contrast, the comparative light-emitting element 2 has only approximately 70% of the initial luminance after 1100 hours.

These results show that the difference in the concentration of chlorine-substituted products in a material forming the electron-transport layer largely affects the reliability of the light-emitting elements even when halogen-substituted products are contained in light-emitting layers of the elements at the same concentration.

In the case where a halogen-substituted product contained in the electron-transport layer is brought into a radical anion state by electron injection and easily releases a halogen, the released halogen reaches the light-emitting layer by an electric field and adversely affects the luminance. Thus, a light-emitting element containing, as a material forming an electron-transport layer, an organic compound which releases a halogen by injection of an electron to a halogen-substituted product of the organic compound can achieve long lifetime with suppressed luminance decay in the case where the amount of halogen-substituted products of a material forming a light-emitting layer is not increased by driving.

A light-emitting element containing, as a material forming an electron-transport layer, an organic compound which releases a halogen by injection of an electron to a halogen-substituted product of the organic compound can achieve long lifetime in the case where the amount of halogens contained in the material forming the electron-transport layer is less than or equal to 30 ppm.

In particular, in the light-emitting element containing the halogen-substituted product of the organic compound forming the electron-transport layer which releases the halogen in a radical anion state with energy less than or equal to 1.00 eV, particularly less than or equal to 0.84 eV, a halogen is easily released by driving the light-emitting element. Therefore, by setting the amount of halogens in the material forming the electron-transport layer to be less than or equal to 30 ppm, the adverse effect of the halogens on luminance can be effectively reduced. Similarly, in the light-emitting element containing the halogen-substituted product of the organic compound forming the electron-transport layer which releases the halogen in a radical anion state with energy less than or equal to 1.00 eV, particularly less than or equal to 0.84 eV, long lifetime can be achieved and the luminance is not adversely affected in the case where the amount of halogen-substituted products of the material forming the light-emitting layer is not increased by the increase in driving time. Note that the increase and decrease in a halogen-substituted product can be determined when normalized luminance reaches approximately 80% of the initial luminance.

This application is based on Japanese Patent Application serial no. 2014-219648 filed with Japan Patent Office on Oct. 28, 2014, the entire contents of which are hereby incorporated by reference.

What is claimed is:

1. A light-emitting element comprising:
   an anode;
   a cathode; and
   an EL layer between the anode and the cathode,
   wherein the EL layer includes a light-emitting layer and an electron injection transport layer between the light-emitting layer and the cathode,
   wherein the electron injection transport layer contains a first organic compound,
   wherein a halogen-substituted product of the first organic compound releases a halogen by receiving an electron, and wherein the amount of halogens detected from the first organic compound is less than or equal to 30 ppm.

2. The light-emitting element according to claim 1, wherein the amount of the halogens detected from the first organic compound is less than or equal to 10 ppm.

3. The light-emitting element according to claim 1, wherein the halogen is chlorine.

4. The light-emitting element according to claim 1, wherein the light-emitting layer has a hole-transport property higher than an electron-transport property.

5. A light-emitting device comprising:
the light-emitting element according to claim 1; and
a transistor or a substrate.

6. An electronic device comprising:
the light-emitting element according to claim 1; and
at least one of a sensor, an operation button, a speaker, and a microphone.

7. A lighting device comprising:
the light-emitting element according to claim 1; and
a housing.

8. The light-emitting element according to claim 1, wherein the first organic compound is a heteroaromatic compound.

9. The light-emitting element according to claim 8, wherein the heteroaromatic compound includes a quinoxaline skeleton.

10. The light-emitting element according to claim 8, wherein the heteroaromatic compound includes a phenanthroline skeleton.

11. The light-emitting element according to claim 1, wherein energy for releasing a halogen from the halogen-substituted product of the first organic compound in a radical anion state is less than or equal to 1.00 eV.

12. The light-emitting element according to claim 11, wherein the first organic compound is a heteroaromatic compound.

13. The light-emitting element according to claim 12, wherein the heteroaromatic compound includes a quinoxaline skeleton.

14. The light-emitting element according to claim 12, wherein the heteroaromatic compound includes a phenanthroline skeleton.

15. A light-emitting element comprising:
an anode;
a cathode; and
an EL layer between the anode and the cathode,
wherein the EL layer includes a light-emitting layer and an electron injection transport layer between the light-emitting layer and the cathode,
wherein the electron injection transport layer contains a first organic compound,
wherein the light-emitting layer contains a second organic compound,
wherein a halogen-substituted product of the first organic compound releases a halogen by receiving an electron, and
wherein a halogen-substituted product of the second organic compound is not increased when total driving time of the light-emitting element is increased.

16. The light-emitting element according to claim 15, wherein the halogen-substituted product of the second organic compound is not increased at a time when luminance of the light-emitting element is decreased to 80% or less of initial luminance as compared to luminance in an initial stage of driving.

17. The light-emitting element according to claim 15, wherein the halogen is chlorine.

18. The light-emitting element according to claim 15, wherein the first organic compound is a heteroaromatic compound.

19. The light-emitting element according to claim 18, wherein the heteroaromatic compound includes a quinoxaline skeleton.

20. The light-emitting element according to claim 18, wherein the heteroaromatic compound includes a phenanthroline skeleton.

21. The light-emitting element according to claim 15, wherein the light-emitting layer has a hole-transport property higher than an electron-transport property.

22. A light-emitting device comprising:
the light-emitting element according to claim 15; and
a transistor or a substrate.

23. An electronic device comprising:
the light-emitting element according to claim 15; and
at least one of a sensor, an operation button, a speaker, and a microphone.

24. A lighting device comprising:
the light-emitting element according to claim 15; and
a housing.

25. A light-emitting element comprising:
an anode;
a cathode; and
an EL layer between the anode and the cathode,
wherein the EL layer includes a light-emitting layer and an electron injection transport layer between the light-emitting layer and the cathode,
wherein the electron injection transport layer contains a first organic compound,
wherein the light-emitting layer contains a second organic compound,
wherein energy for releasing a halogen from a halogen-substituted product of the first organic compound in a radical anion state is less than or equal to 1.00 eV, and
wherein a halogen-substituted product of the second organic compound is not increased when total driving time of the light-emitting element is increased.

26. The light-emitting element according to claim 25, wherein the halogen-substituted product of the second organic compound is not increased at a time when luminance of the light-emitting element is decreased to 80% or less of initial luminance as compared to luminance in an initial stage of driving.

27. The light-emitting element according to claim 25, wherein the halogen is chlorine.

28. The light-emitting element according to claim 25, wherein the first organic compound is a heteroaromatic compound.

29. The light-emitting element according to claim 28, wherein the heteroaromatic compound includes a quinoxaline skeleton.

30. The light-emitting element according to claim 28, wherein the heteroaromatic compound includes a phenanthroline skeleton.

31. The light-emitting element according to claim 25, wherein the light-emitting layer has a hole-transport property higher than an electron-transport property.

32. A light-emitting device comprising:
the light-emitting element according to claim 25; and
a transistor or a substrate.

33. An electronic device comprising:
the light-emitting element according to claim 25; and
at least one of a sensor, an operation button, a speaker, and a microphone.

34. A lighting device comprising:
the light-emitting element according to claim 25; and
a housing.

* * * * *